(12) United States Patent
You et al.

(10) Patent No.: US 12,107,006 B2
(45) Date of Patent: Oct. 1, 2024

(54) METHOD FOR MANUFACTURING SEMICONDUCTOR STRUCTURE WITH DIELECTRIC FEATURE

(71) Applicant: Taiwan Semiconductor Manufacturing Company, Ltd., Hsinchu (TW)

(72) Inventors: Jia-Chuan You, Dayuan Township, Taoyuan County (TW); Chia-Hao Chang, Hsinchu (TW); Kuan-Ting Pan, Taipei (TW); Shi-Ning Ju, Hsinchu (TW); Kuo-Cheng Chiang, Zhubei (TW); Chih-Hao Wang, Baoshan Township, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 349 days.

(21) Appl. No.: 17/395,678

(22) Filed: Aug. 6, 2021

(65) Prior Publication Data

US 2022/0399231 A1 Dec. 15, 2022

Related U.S. Application Data

(60) Provisional application No. 63/210,606, filed on Jun. 15, 2021.

(51) Int. Cl.
*H01L 21/768* (2006.01)
*H01L 23/522* (2006.01)
*H01L 29/06* (2006.01)
*H01L 29/423* (2006.01)
(Continued)

(52) U.S. Cl.
CPC .... *H01L 21/76885* (2013.01); *H01L 23/5226* (2013.01); *H01L 29/66742* (2013.01);
(Continued)

(58) Field of Classification Search
CPC ............ H01L 27/105; H01L 27/11807; H01L 2027/11929; H01L 2027/30;
(Continued)

(56) References Cited

U.S. PATENT DOCUMENTS 9,209,247 B2 12/2015 Colinge et al.
9,236,267 B2 1/2016 De et al.
(Continued)

FOREIGN PATENT DOCUMENTS

KR 10-2005-0111951 A 11/2005
KR 10-2019-0015270 A 2/2019
(Continued)

OTHER PUBLICATIONS

Korean Notice of Allowance mailed on Aug. 5, 2024 in corresponding application No. 10-2022-0038938.

*Primary Examiner* — Yara B Green
*Assistant Examiner* — Fakeha Sehar
(74) *Attorney, Agent, or Firm* — Birch, Stewart, Kolasch & Birch, LLP

(57) ABSTRACT

Semiconductor structures and methods for manufacturing the same are provided. The semiconductor structure includes a substrate and nanostructures formed over the substrate. The semiconductor structure also includes a gate structure wrapping around the nanostructures and a first dielectric feature separating the gate structure into a first portion and a second portion. The semiconductor structure also includes a metal layer formed over the gate structure. In addition, top surfaces of the first portion and the second portion of the gate structure and a top surface of the first dielectric feature are covered by the metal layer.

20 Claims, 46 Drawing Sheets

(51) Int. Cl.
*H01L 29/66* (2006.01)
*H01L 29/786* (2006.01)

(52) U.S. Cl.
CPC .... *H01L 29/78696* (2013.01); *H01L 29/0665* (2013.01); *H01L 29/42392* (2013.01)

(58) Field of Classification Search
CPC ............. H01L 2027/31; H01L 2027/32; H01L 2027/33; H01L 27/092; H01L 29/42392; H01L 29/78696; H01L 21/76885; H01L 23/5226; H01L 29/66742; H01L 29/0665
See application file for complete search history.

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2019/0305111 A1* | 10/2019 | Subramanian .... H01L 21/76895 |
| 2019/0393352 A1 | 12/2019 | Guha et al. |
| 2020/0098878 A1* | 3/2020 | Guler .............. H01L 21/823418 |

FOREIGN PATENT DOCUMENTS

| | | |
|---|---|---|
| KR | 10-2019-0024580 A | 3/2019 |
| KR | 10-2020-0125896 A | 11/2020 |
| KR | 10-2021-0024405 A | 3/2021 |
| KR | 10-2021-0038810 A | 4/2021 |

* cited by examiner

METHOD FOR MANUFACTURING SEMICONDUCTOR STRUCTURE WITH DIELECTRIC FEATURE

PRIORITY CLAIM AND CROSS-REFERENCE

This application claims the benefit of U.S. Provisional Application No. 63/210,606, filed on Jun. 15, 2021, the entirety of which is incorporated by reference herein.

BACKGROUND

The electronics industry is experiencing ever-increasing demand for smaller and faster electronic devices that are able to perform a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). However, integration of fabrication of the multi-gate devices can be challenging.

BRIEF DESCRIPTION OF THE DRAWINGS

Aspects of the present disclosure are best understood from the following detailed description when read with the accompanying Figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
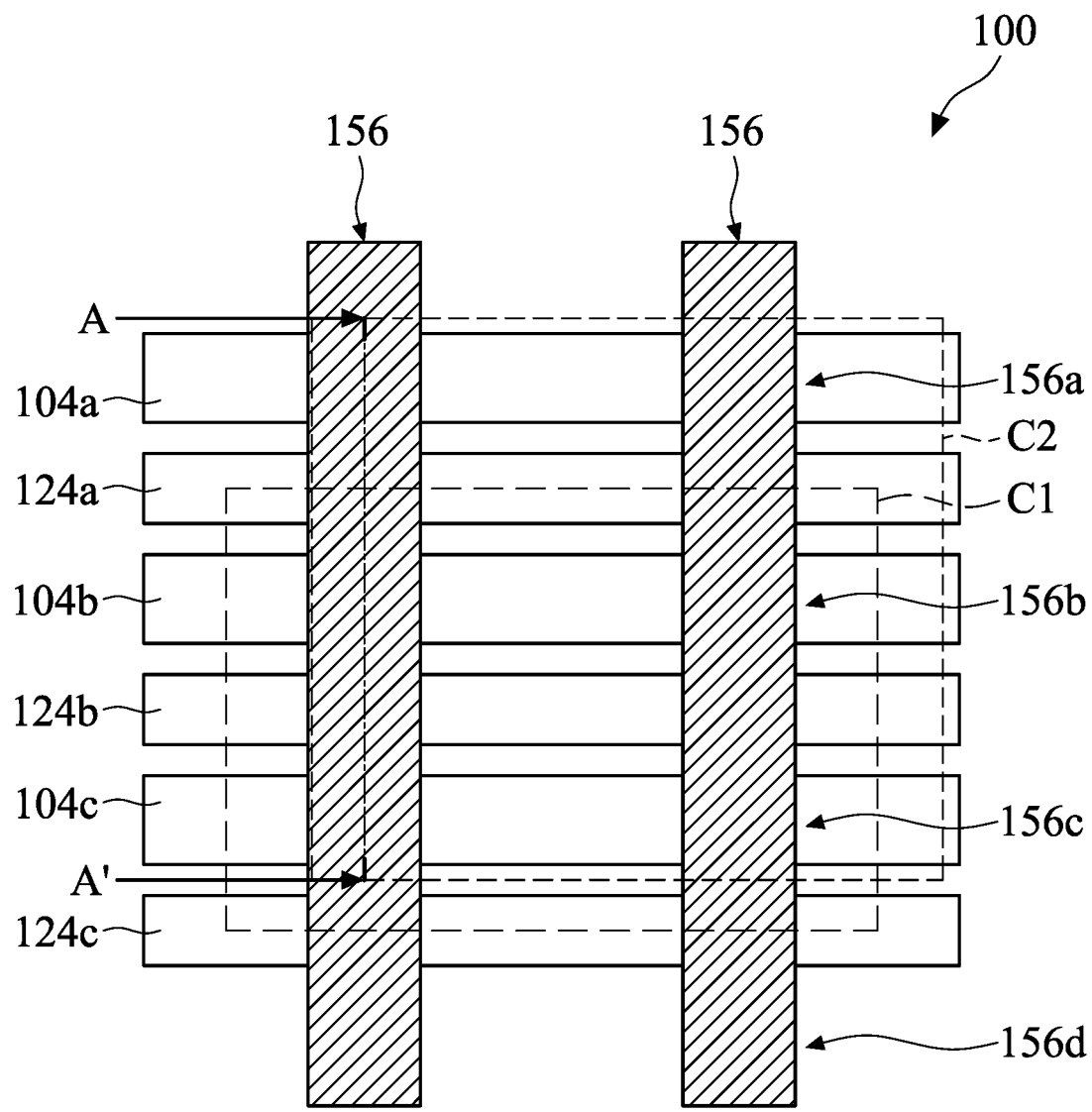
FIG. 1 illustrates a diagrammatic top view of a semiconductor structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of semiconductor structures and methods for forming the same are provided. The semiconductor structures may include nanostructures formed over a substrate and a gate structure wraps around the nanostructures. Dielectric features may be formed to separate the gate structure into different portions, and a metal layer may be formed over the gate structure to connect some portions of the gate structure while some other portions of the gate structure are not connected by the metal layer. The formation of the dielectric features and metal layer does not need addition space to prevent misalignments and therefore the device size may be reduced.

FIG. 1 illustrates a diagrammatic top view of a semiconductor structure 100 in accordance with some embodiments. FIG. 1 has been simplified for the sake of clarity to better understand the inventive concepts of the present disclosure. Additional features may be added in the semiconductor structure 100, and some of the features described below may be replaced, modified, or eliminated.

The semiconductor structure 100 may include multi-gate devices and may be included in a microprocessor, a memory, or other IC devices. For example, the semiconductor structure 100 may be a portion of an IC chip that include various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other applicable components, or combinations thereof.

In some embodiments, the semiconductor structure 100 includes fin structures 104a, 104b, and 104c (which may include nanostructures) and dielectric features 124a, 124b, and 124c formed between the adjacent fin structures 104a, 104b, and 104c. In addition, the fin structures 104a, 104b, and 104c and the dielectric features 124a, 124b, and 124c both extend alone a first direction in accordance with some embodiments. Furthermore, gate structures 156 are formed over the fin structures 104a, 104b, and 104c and the dielectric features 124a, 124b, and 124c and extend alone a second direction that is substantially vertical to the first direction in accordance with some embodiments. The details of these elements are explained in more details in the following description.

Figure 2A:
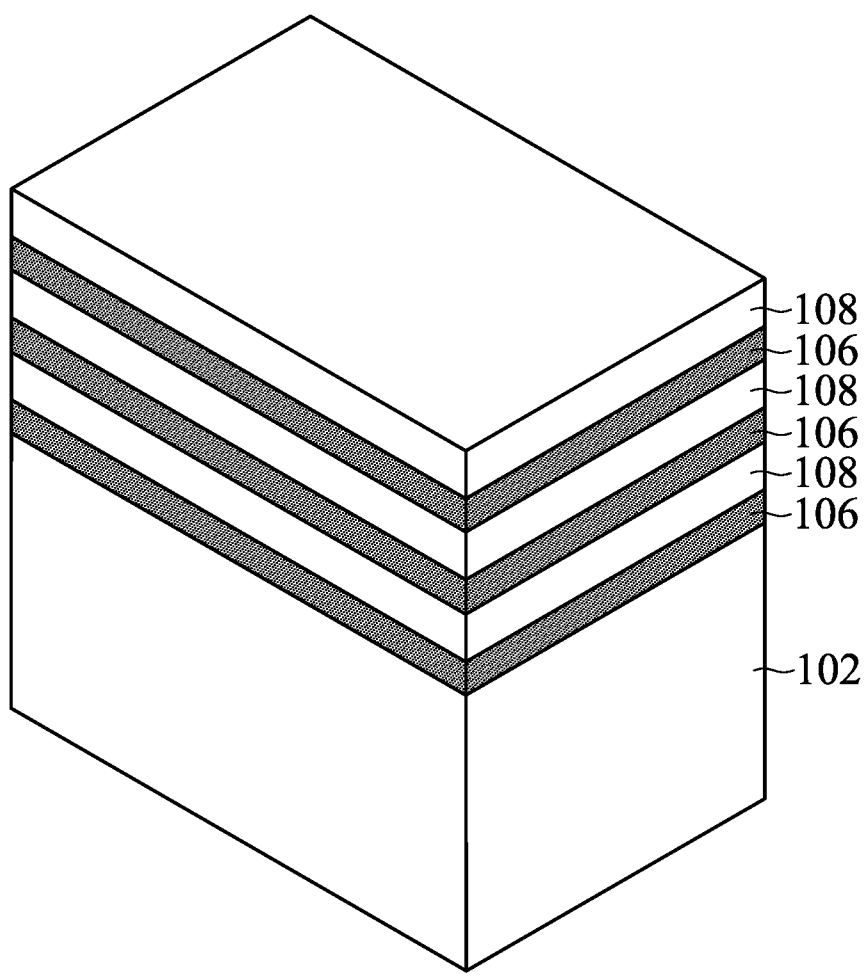
FIGS. 2A to 2W illustrate diagrammatic perspective views of intermediate stages of manufacturing the semiconductor structure in accordance with some embodiments.
Figure 2B:
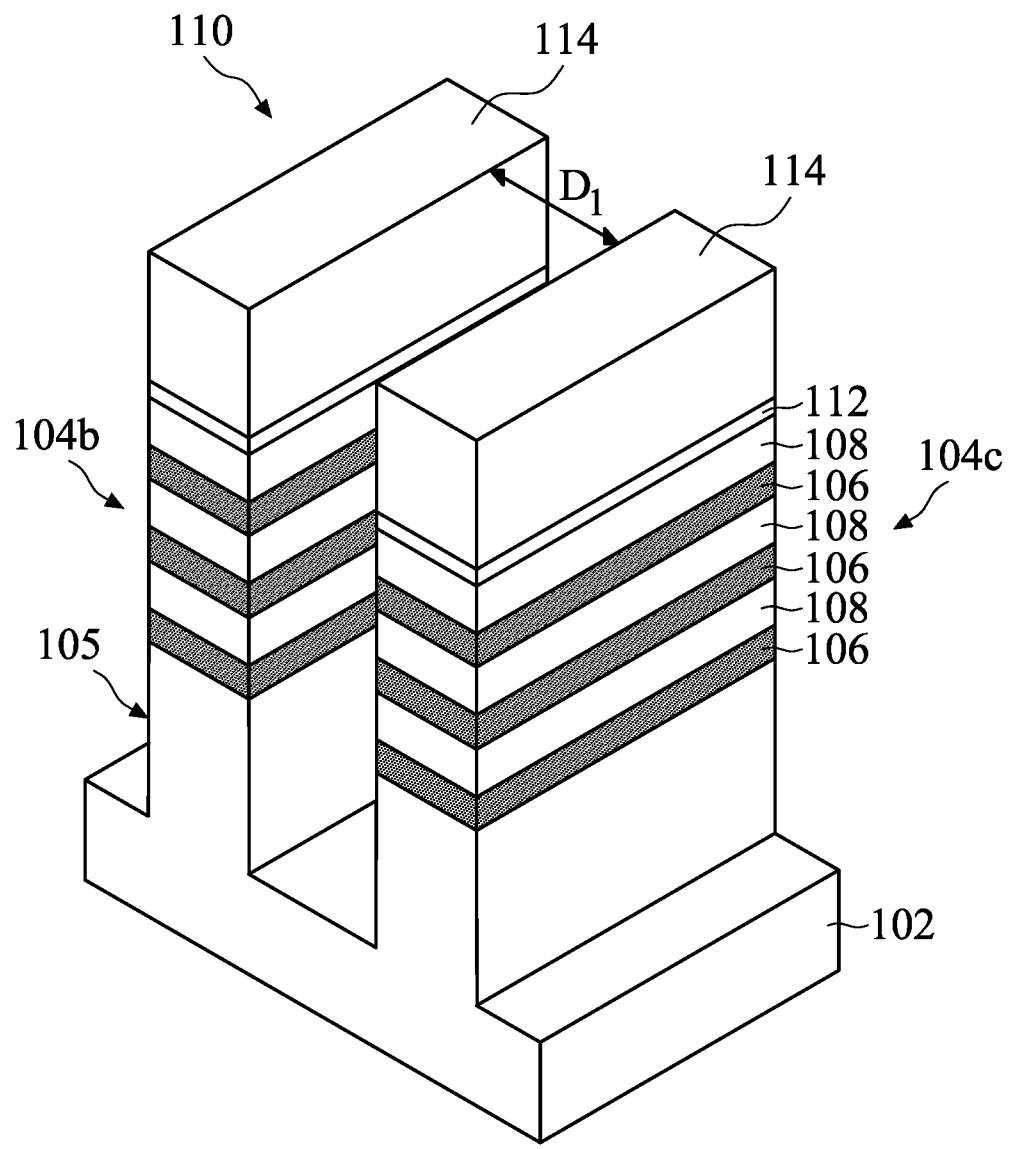
Figure 2C:
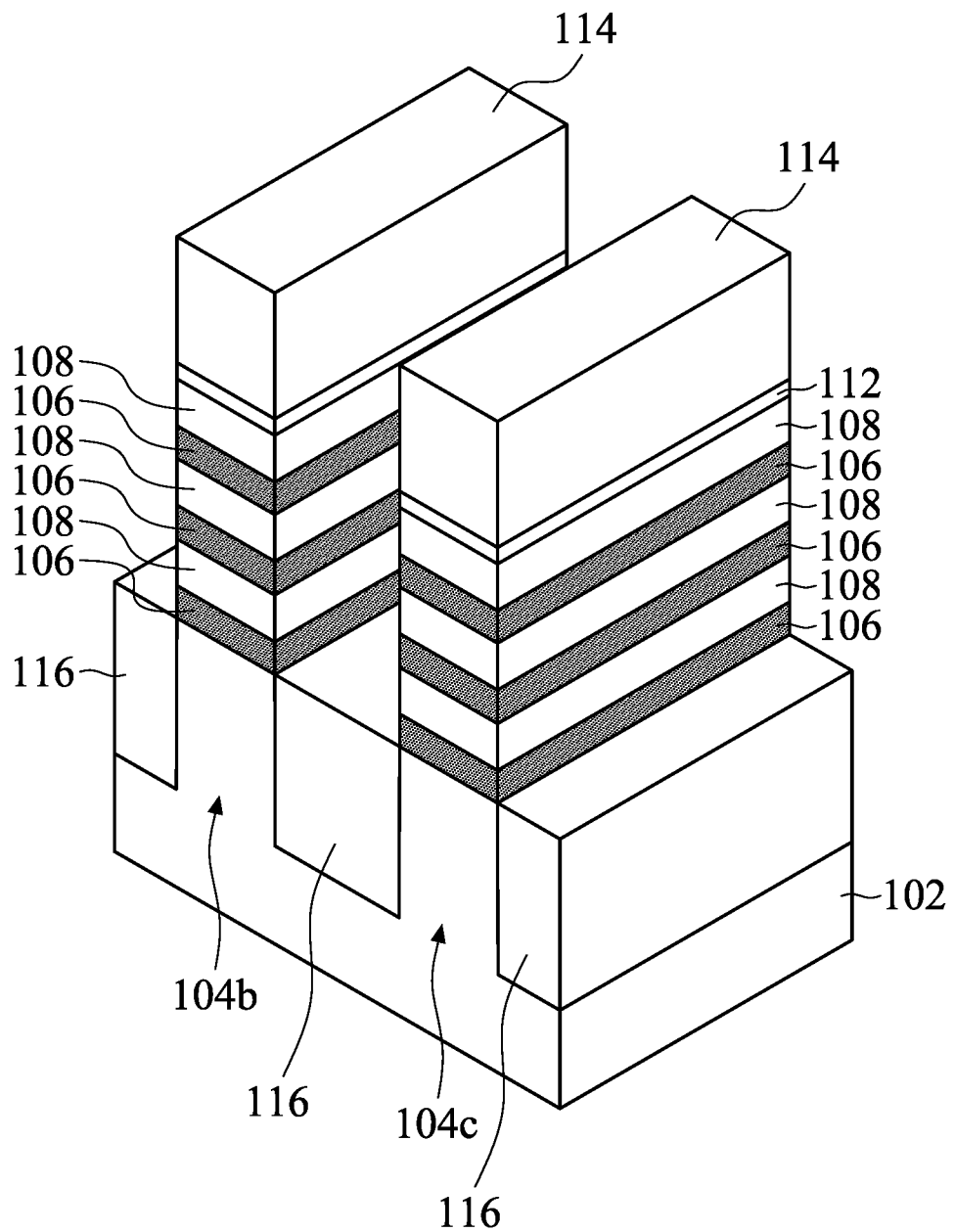
Figure 2D:
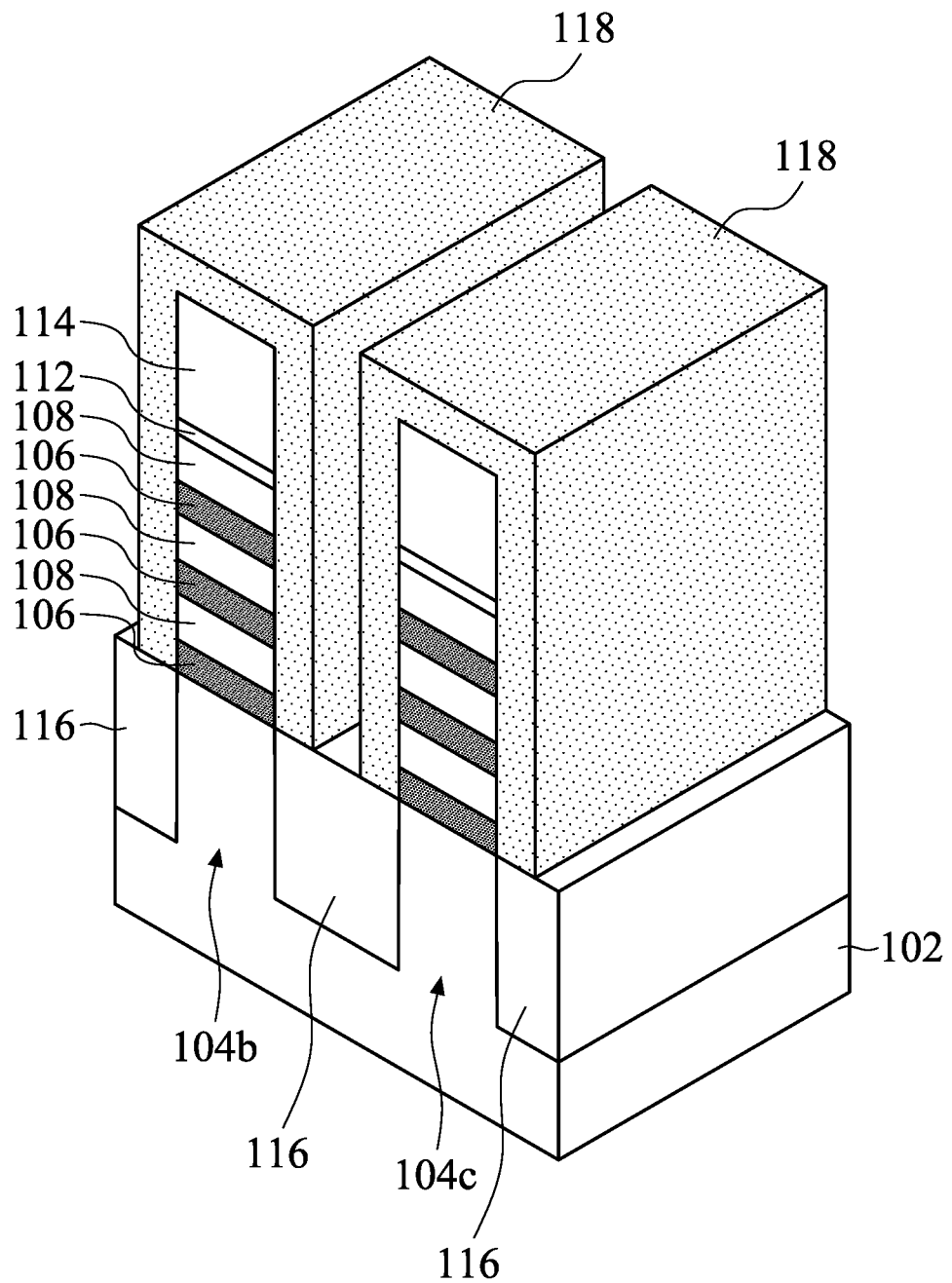
Figure 2E:
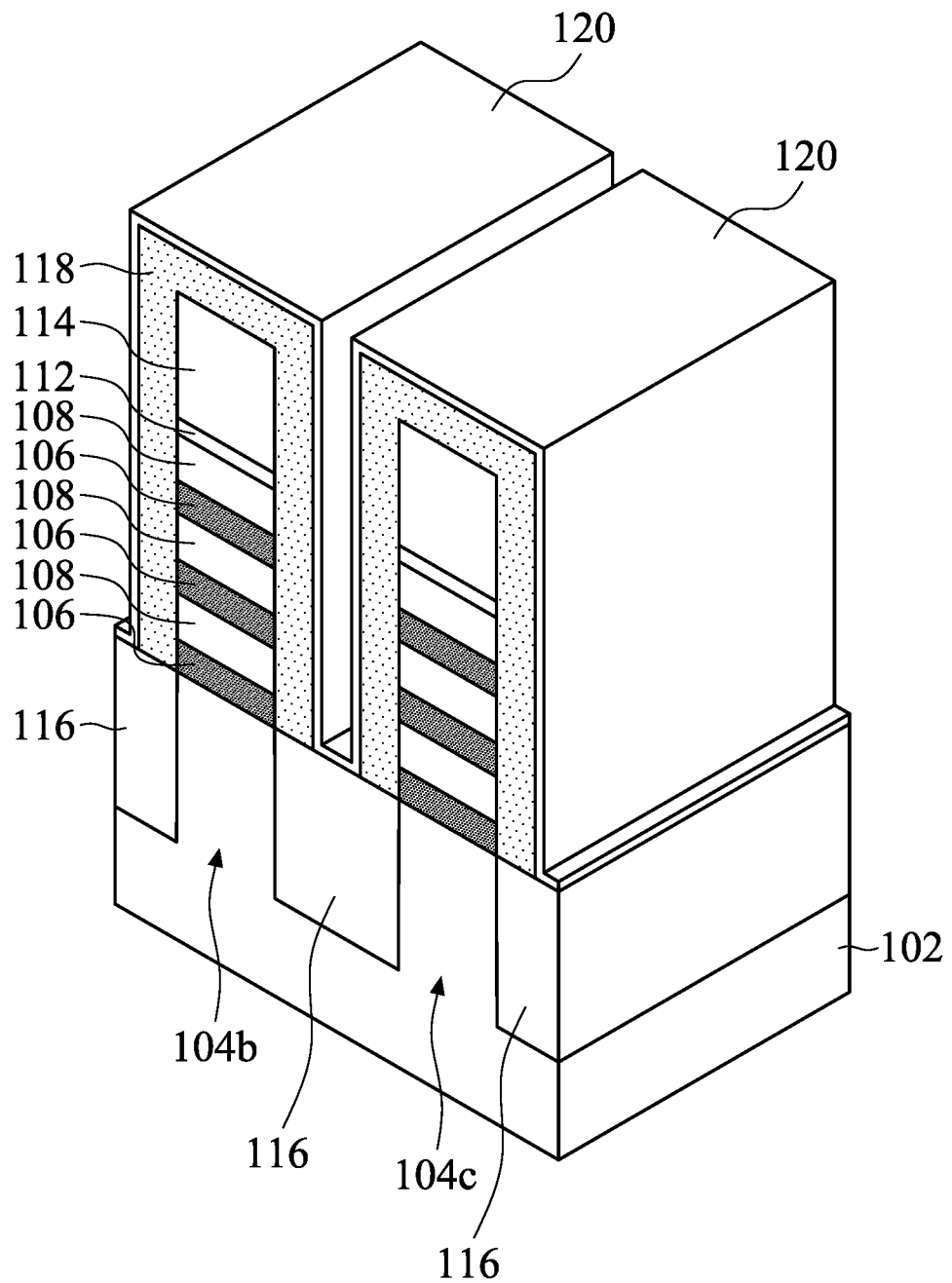
Figure 2F:
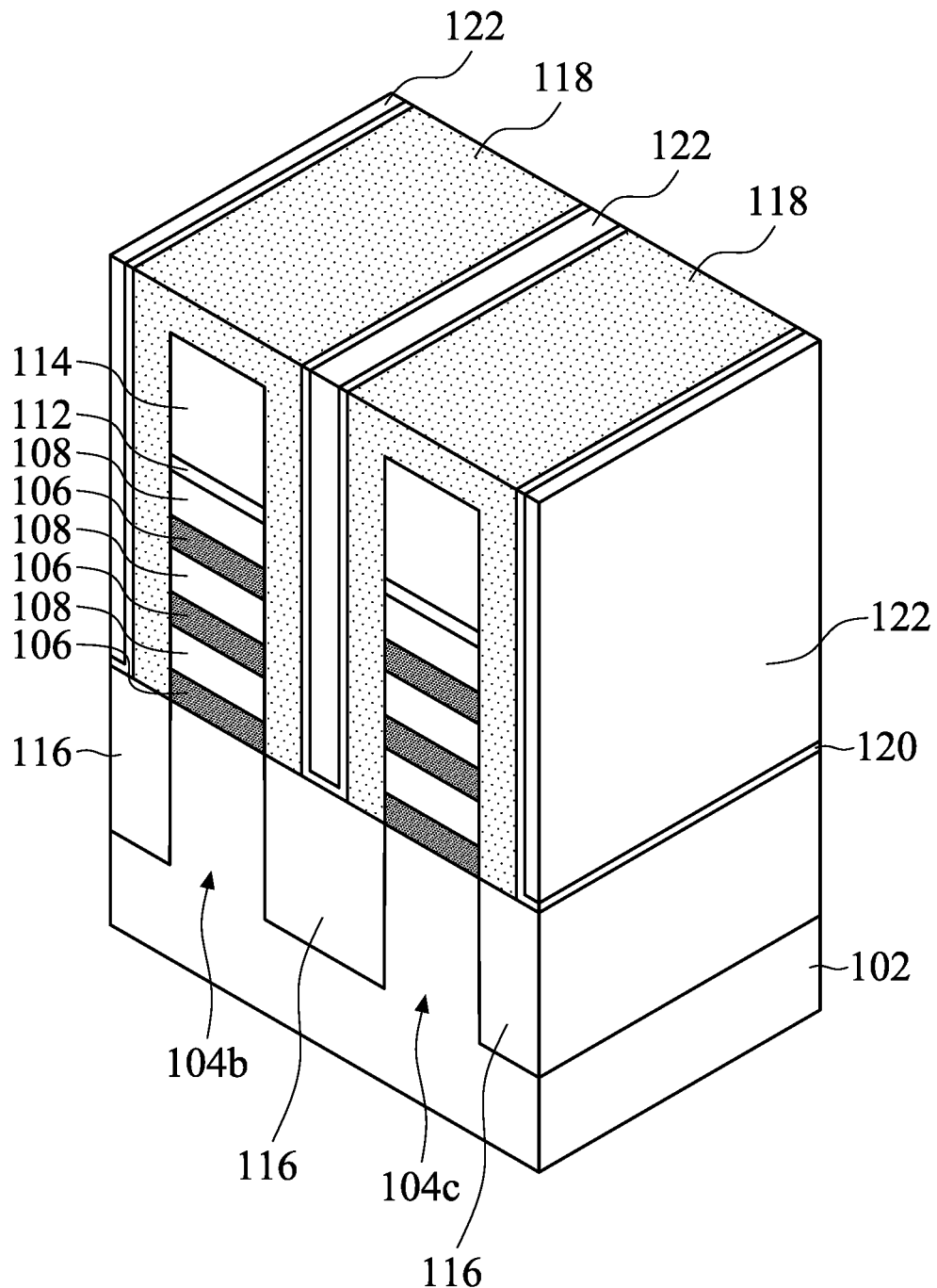
Figure 2G:
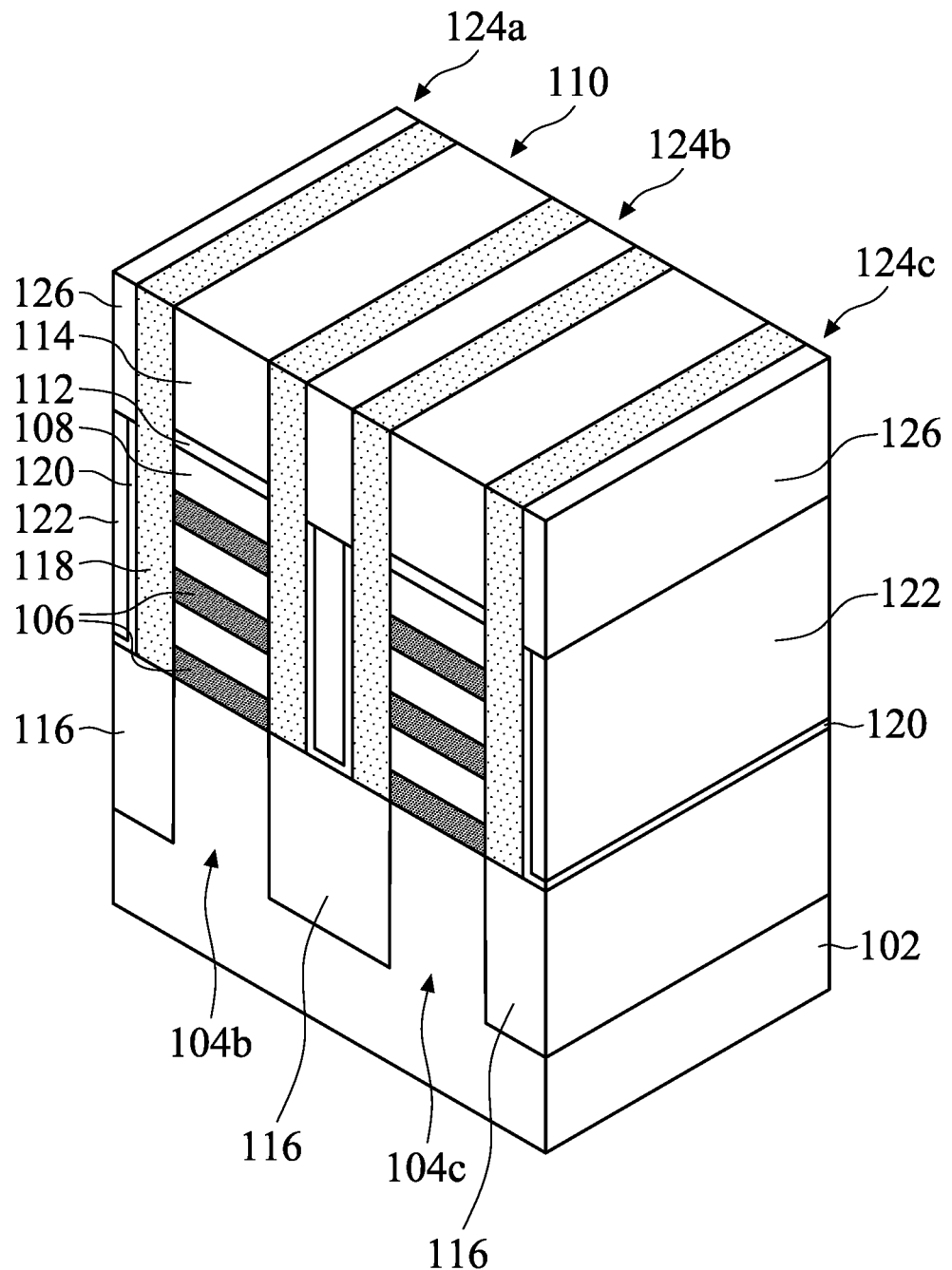
Figure 2H:
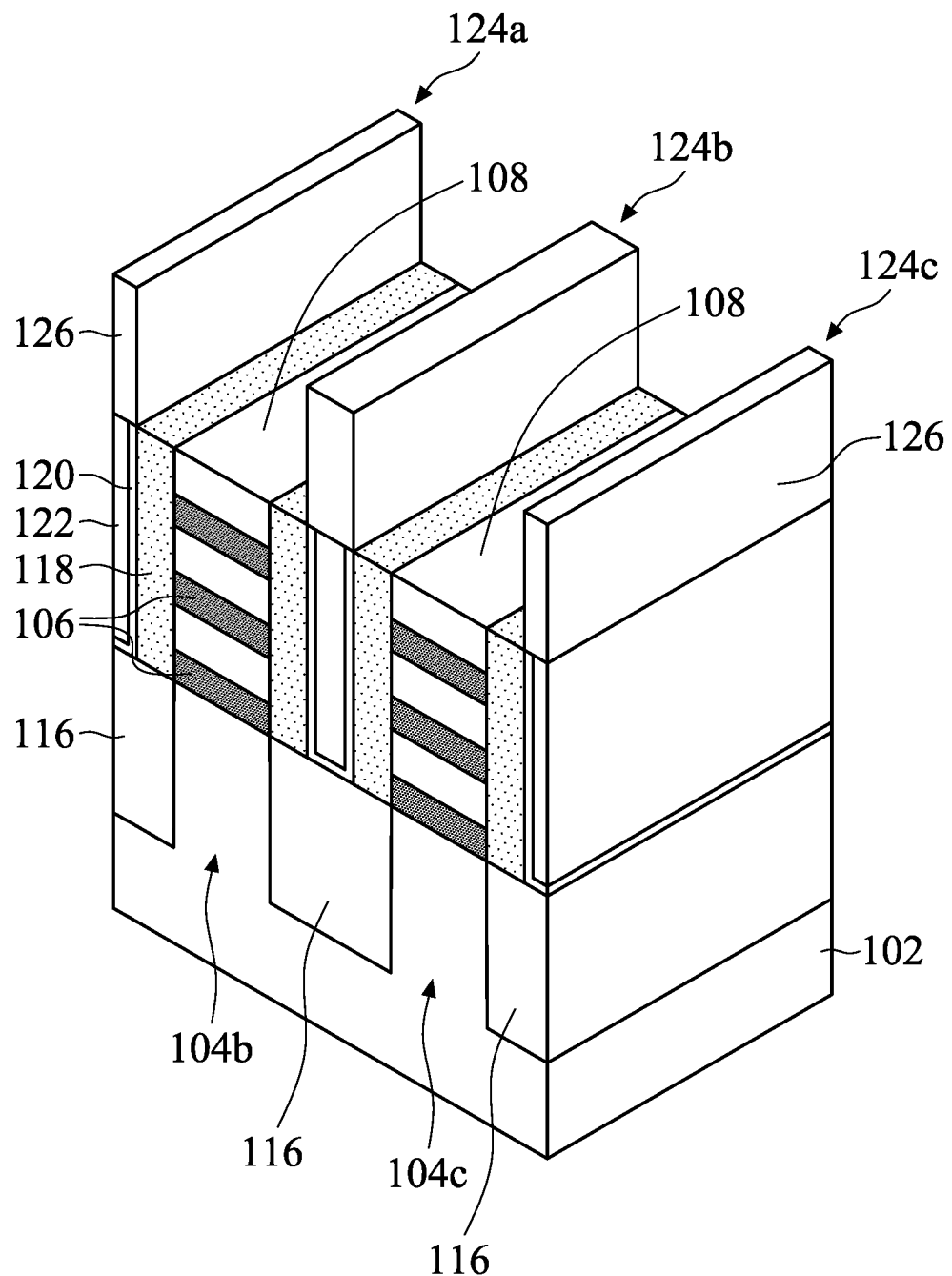
Figure 2I:
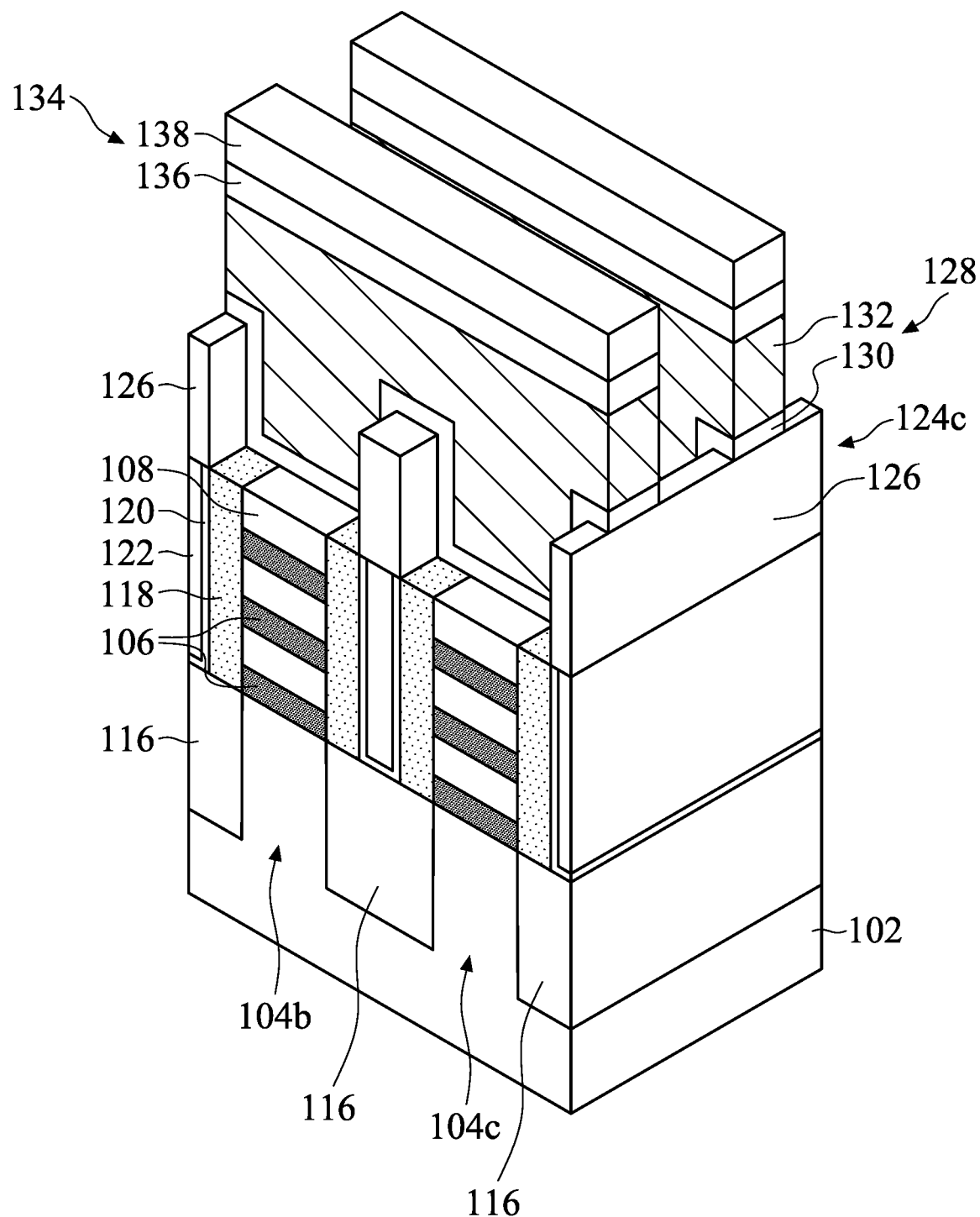
Figure 2J:
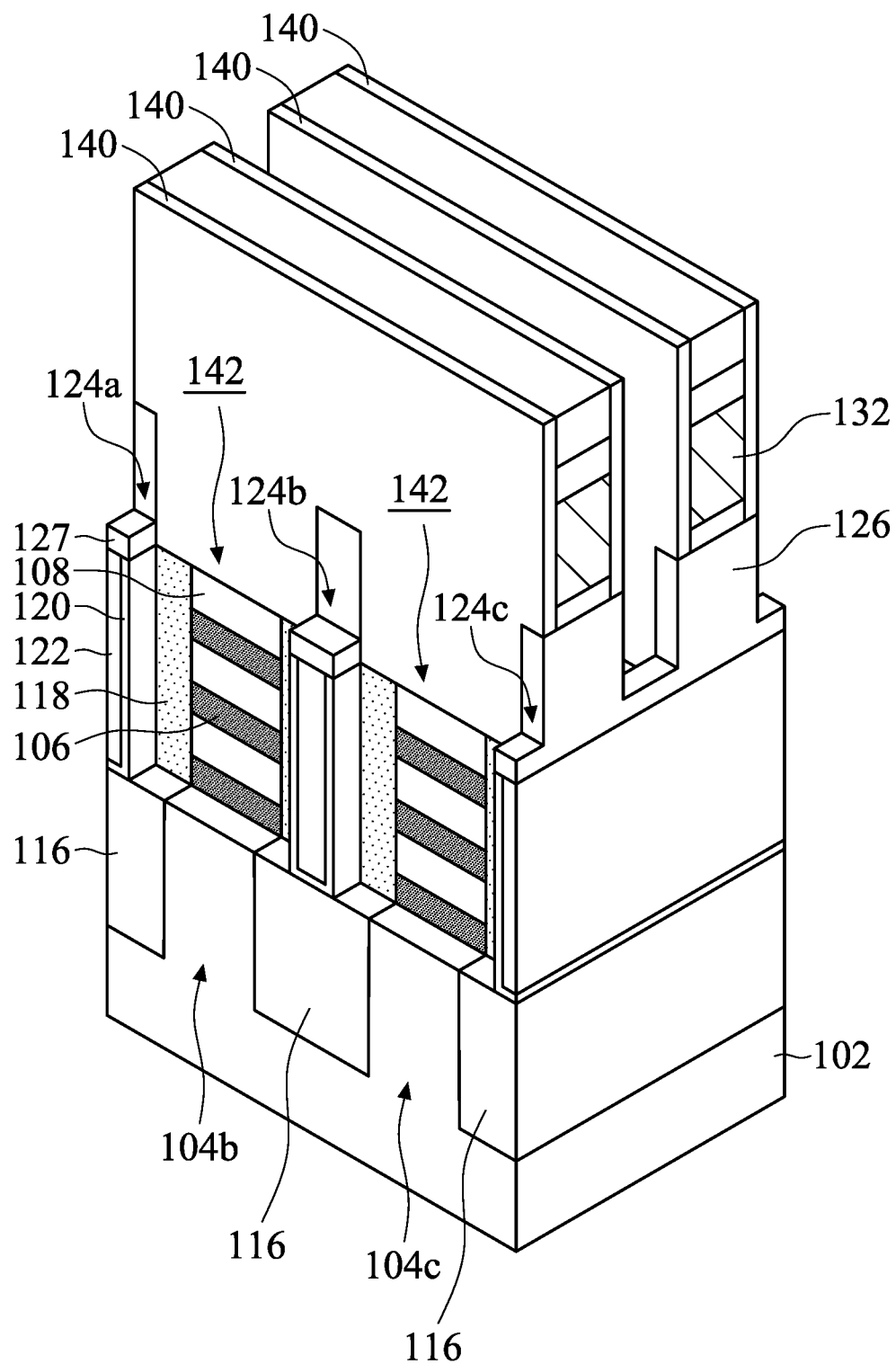
Figure 2K:
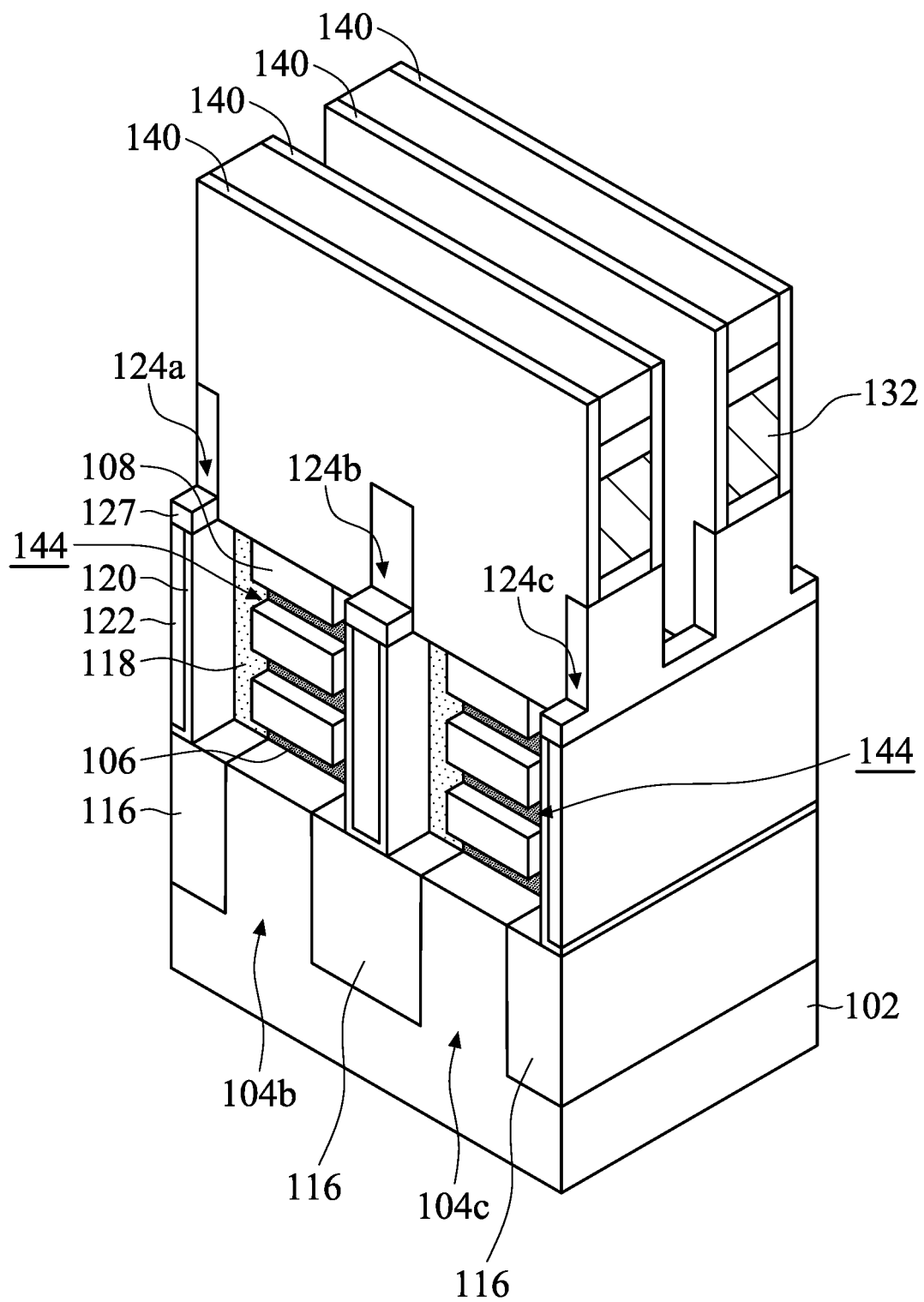
Figure 2L:
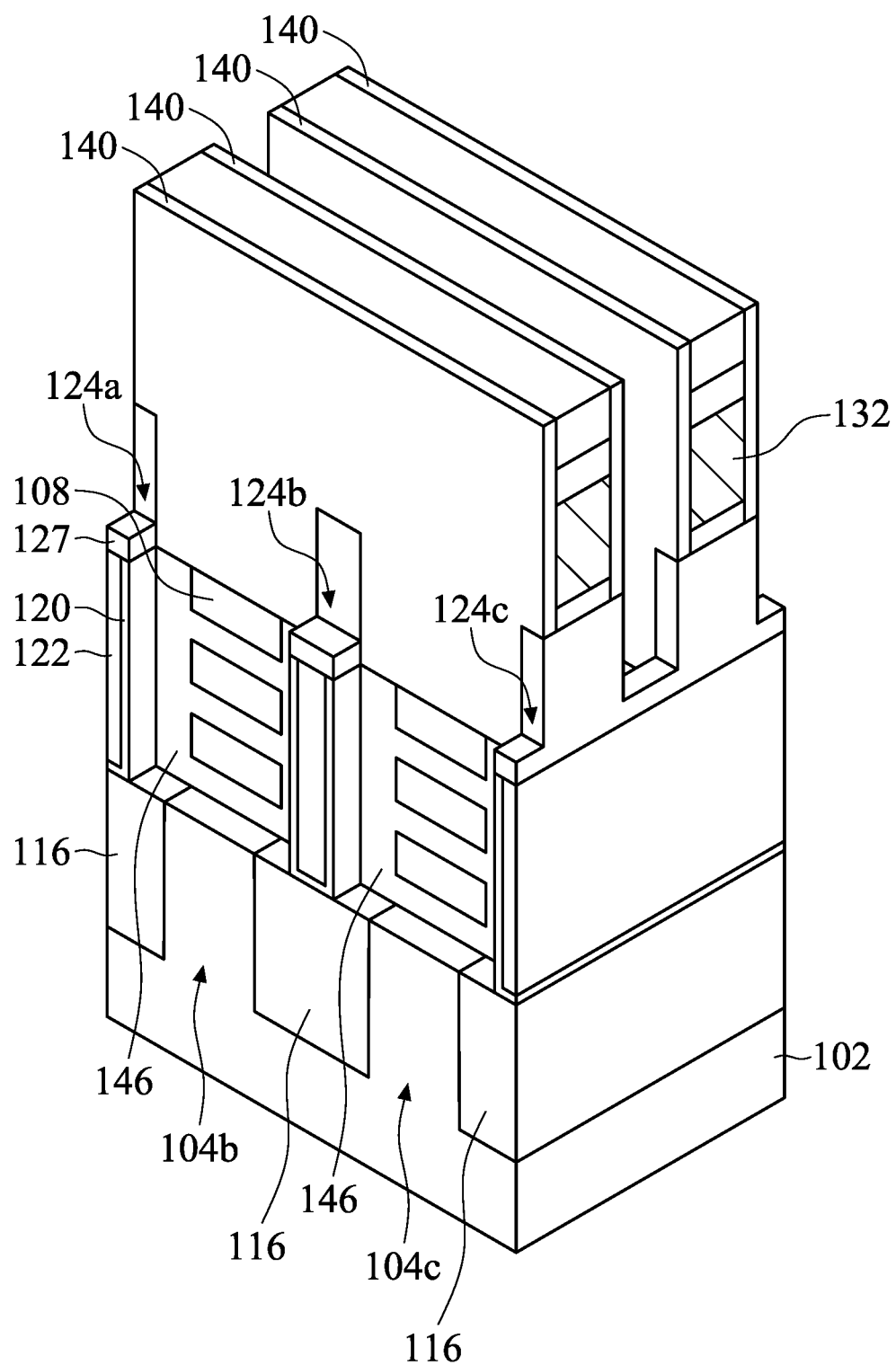
Figure 2M:
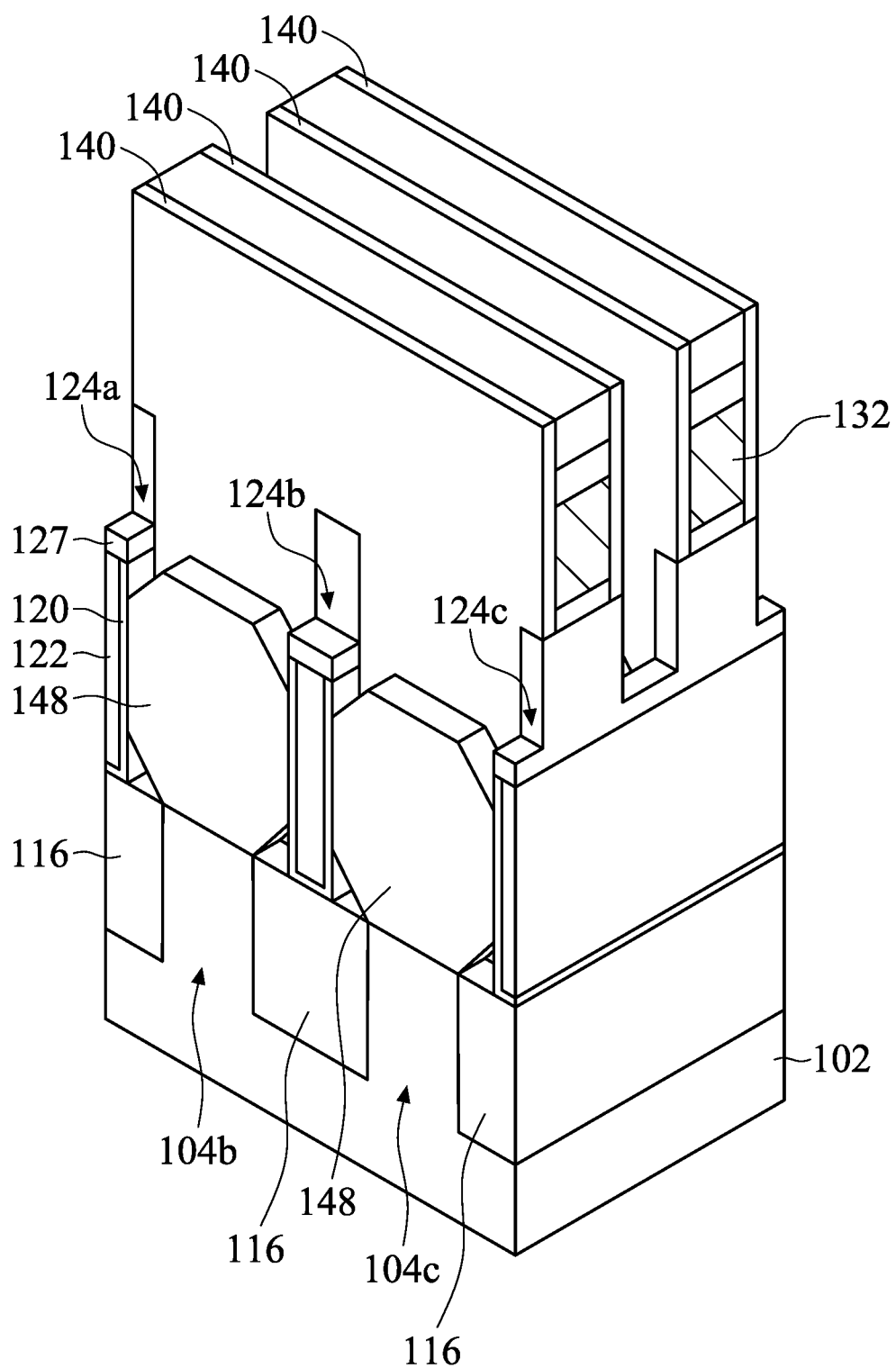
Figure 2N:
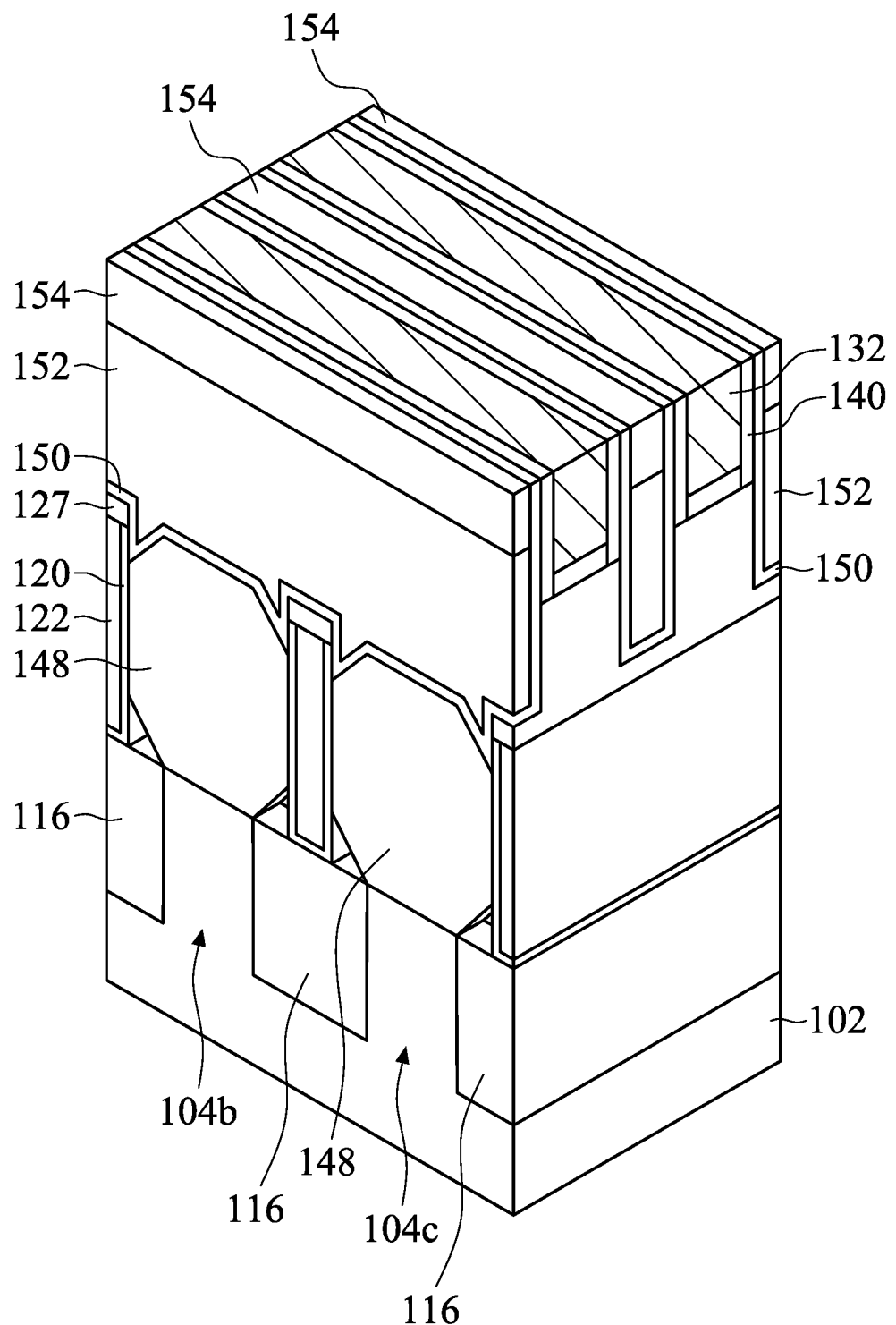
Figure 2O:
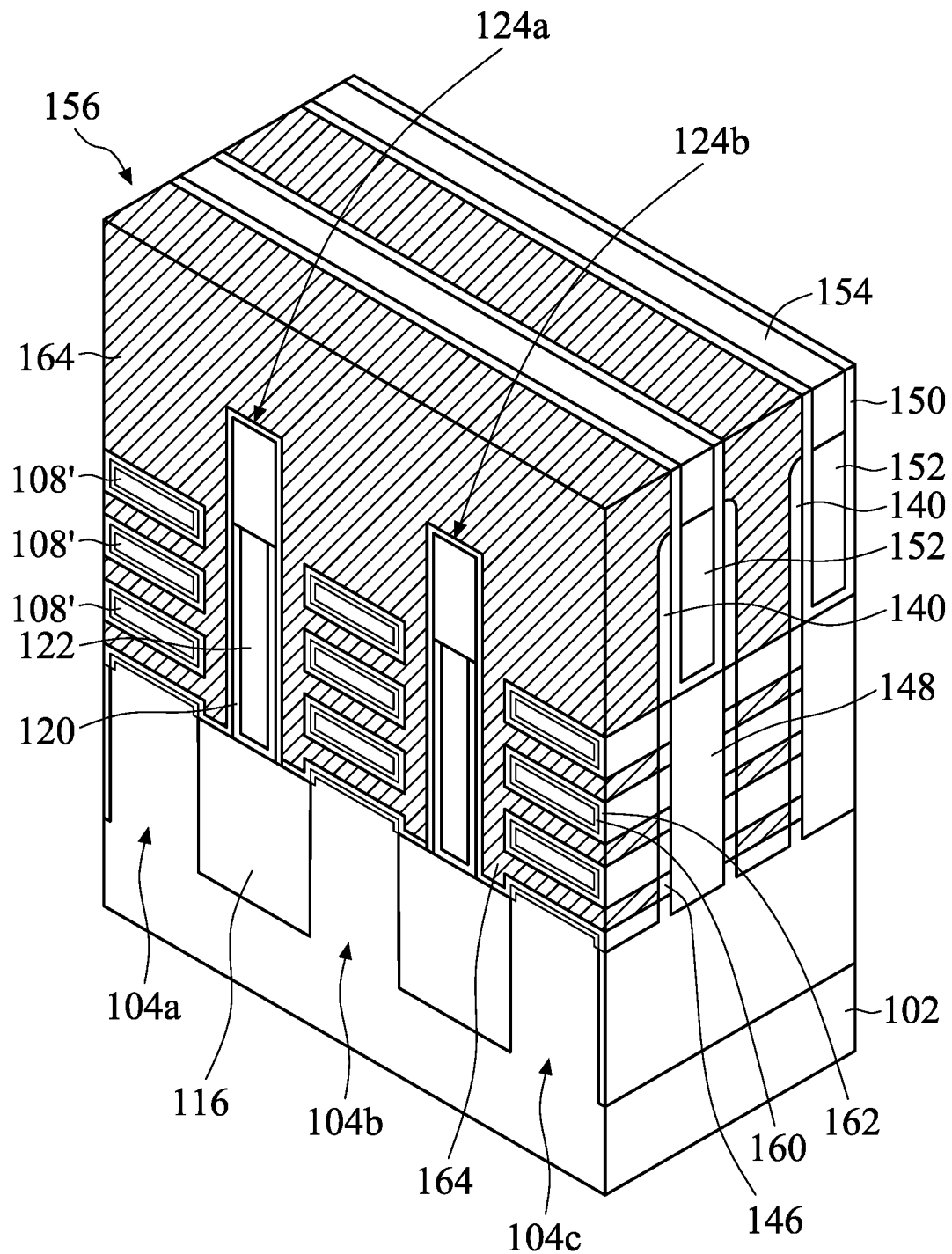
Figure 2P:
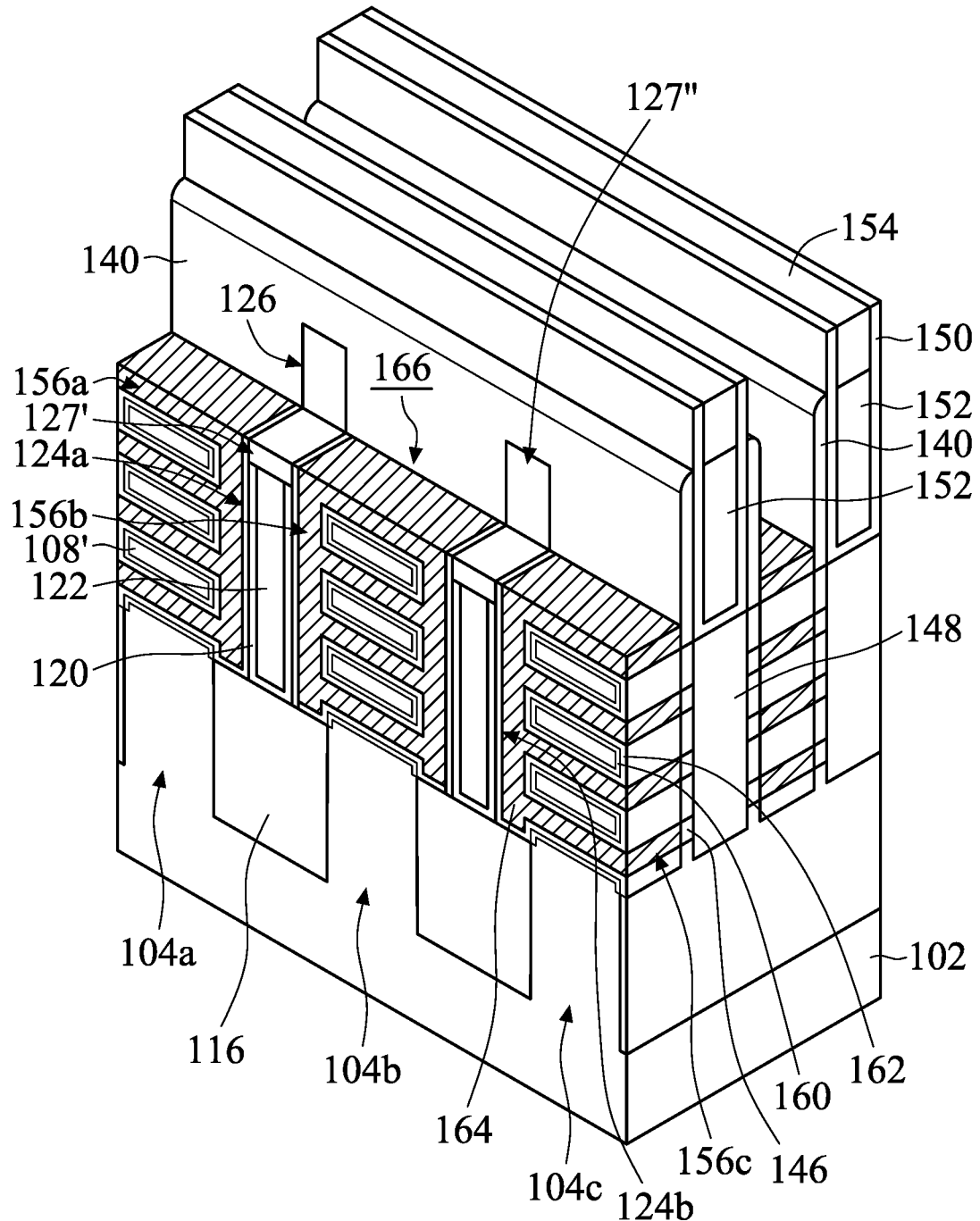
Figure 2Q:
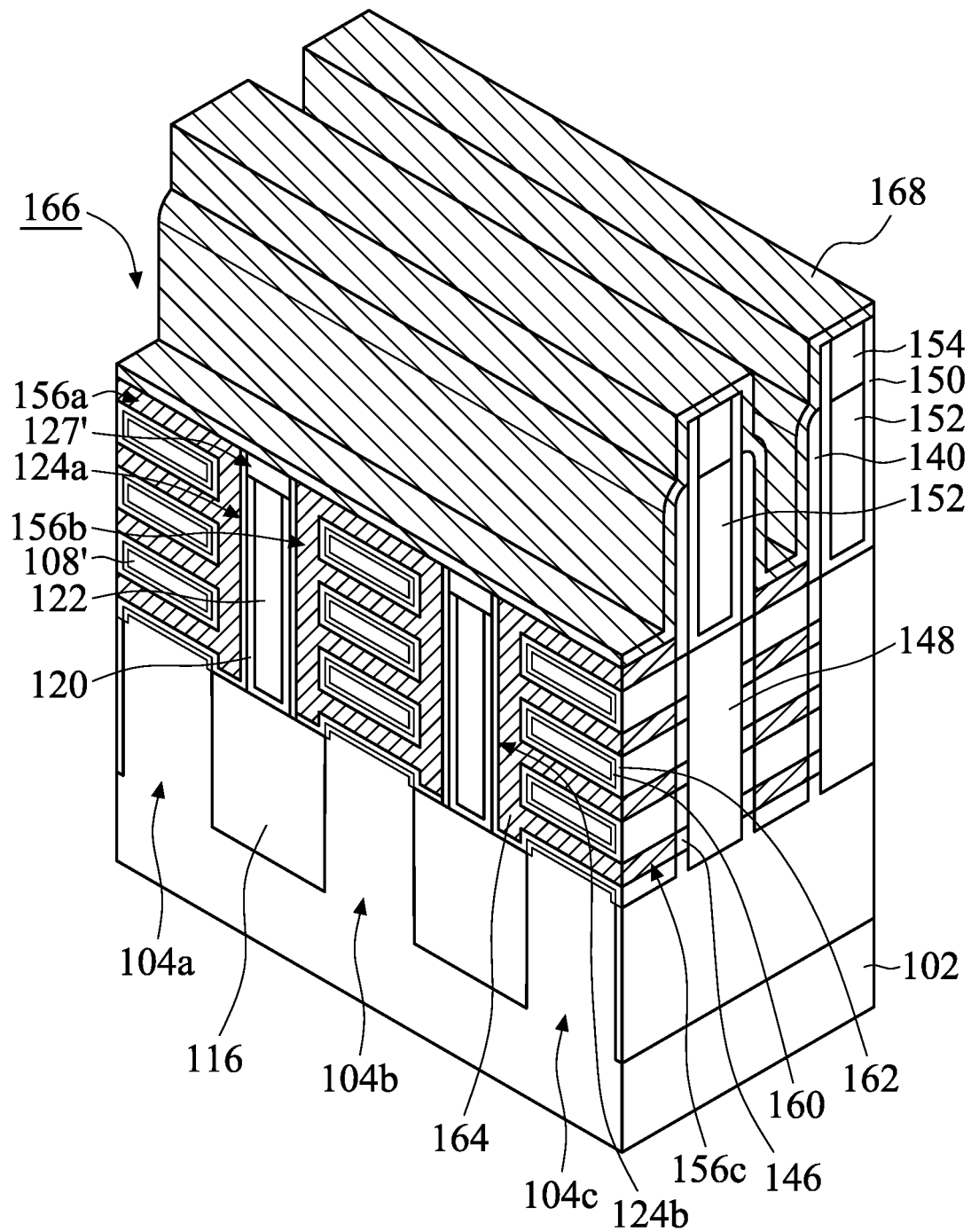
Figure 2R:
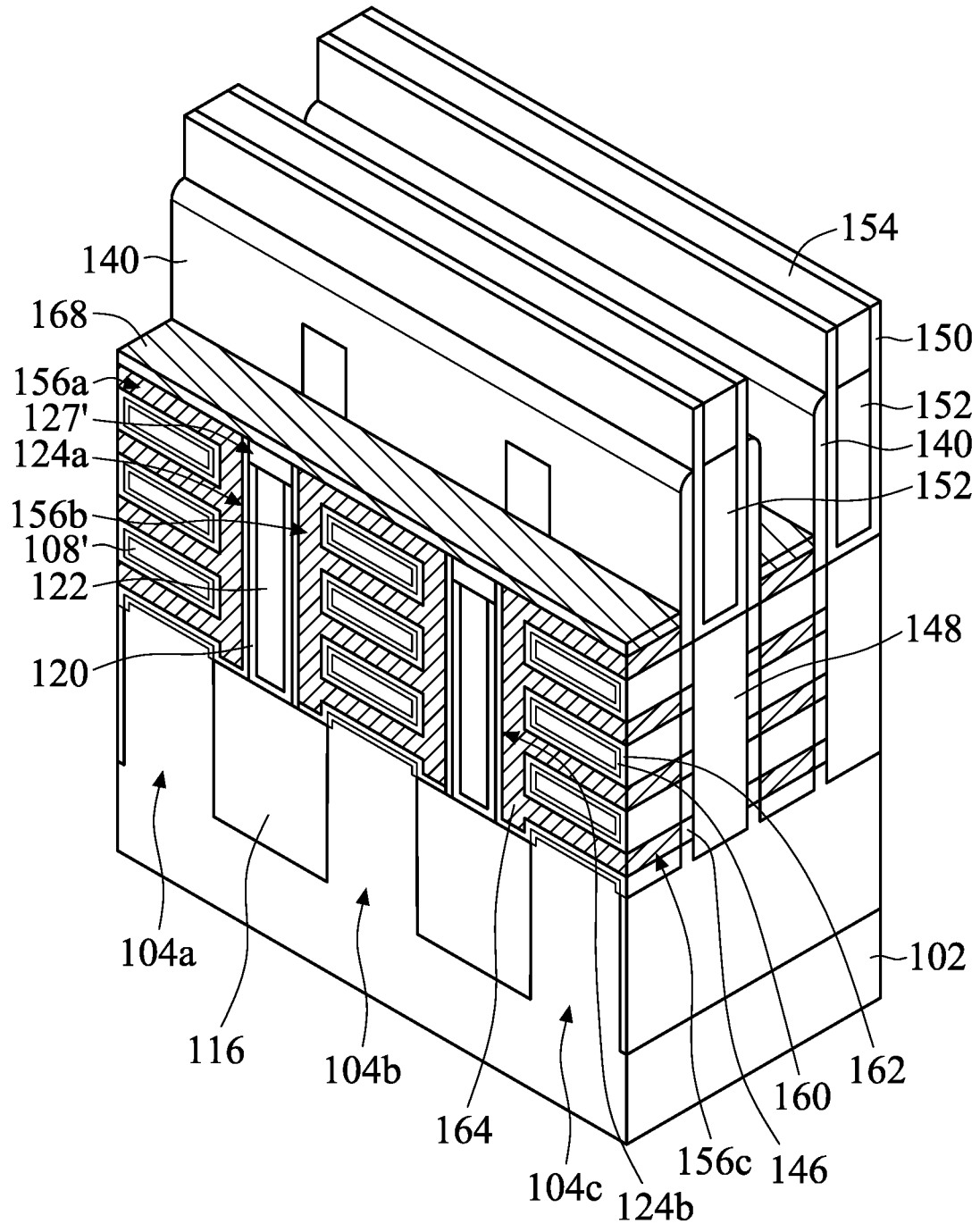
Figure 2S:
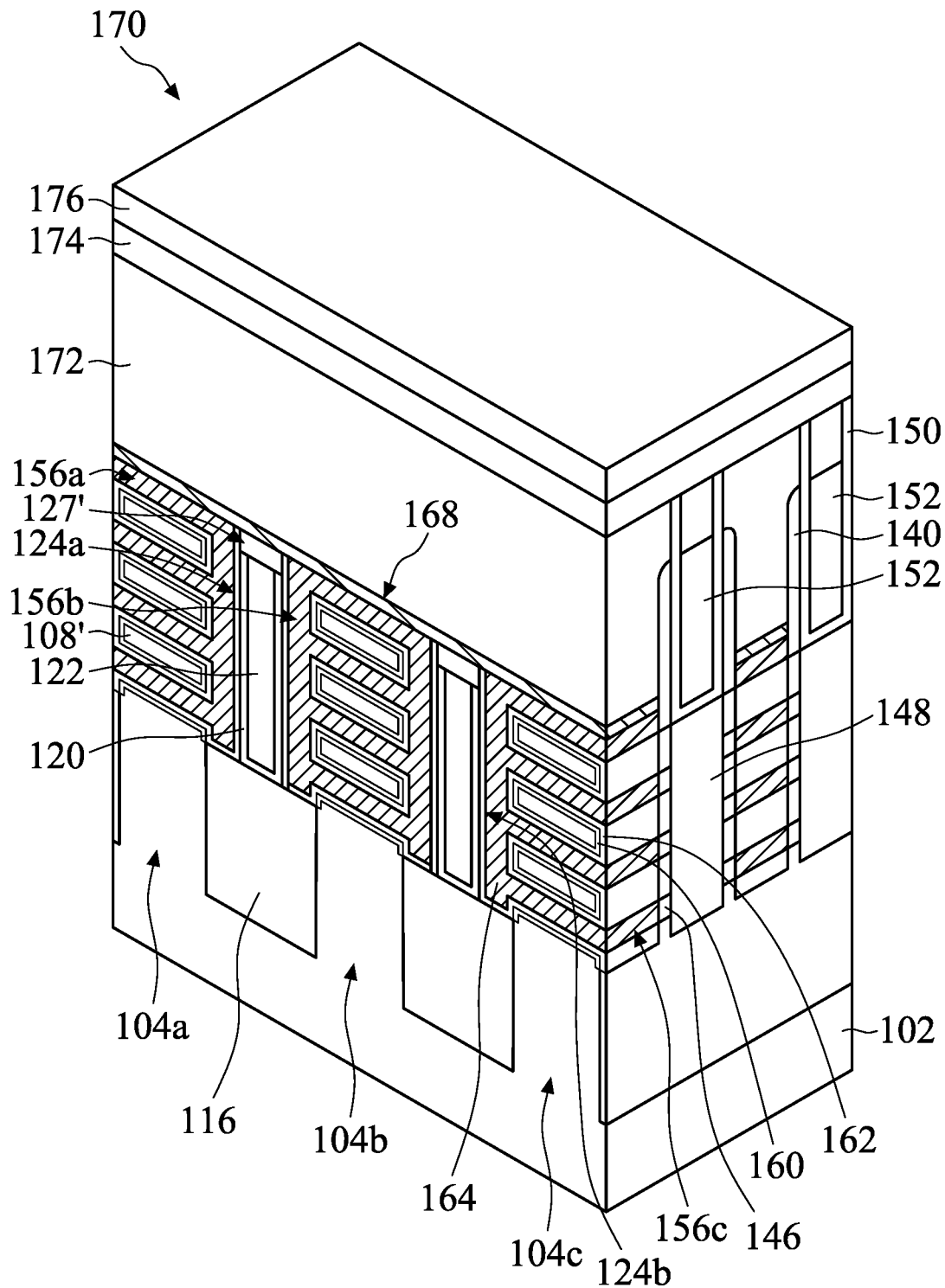
Figure 2T:
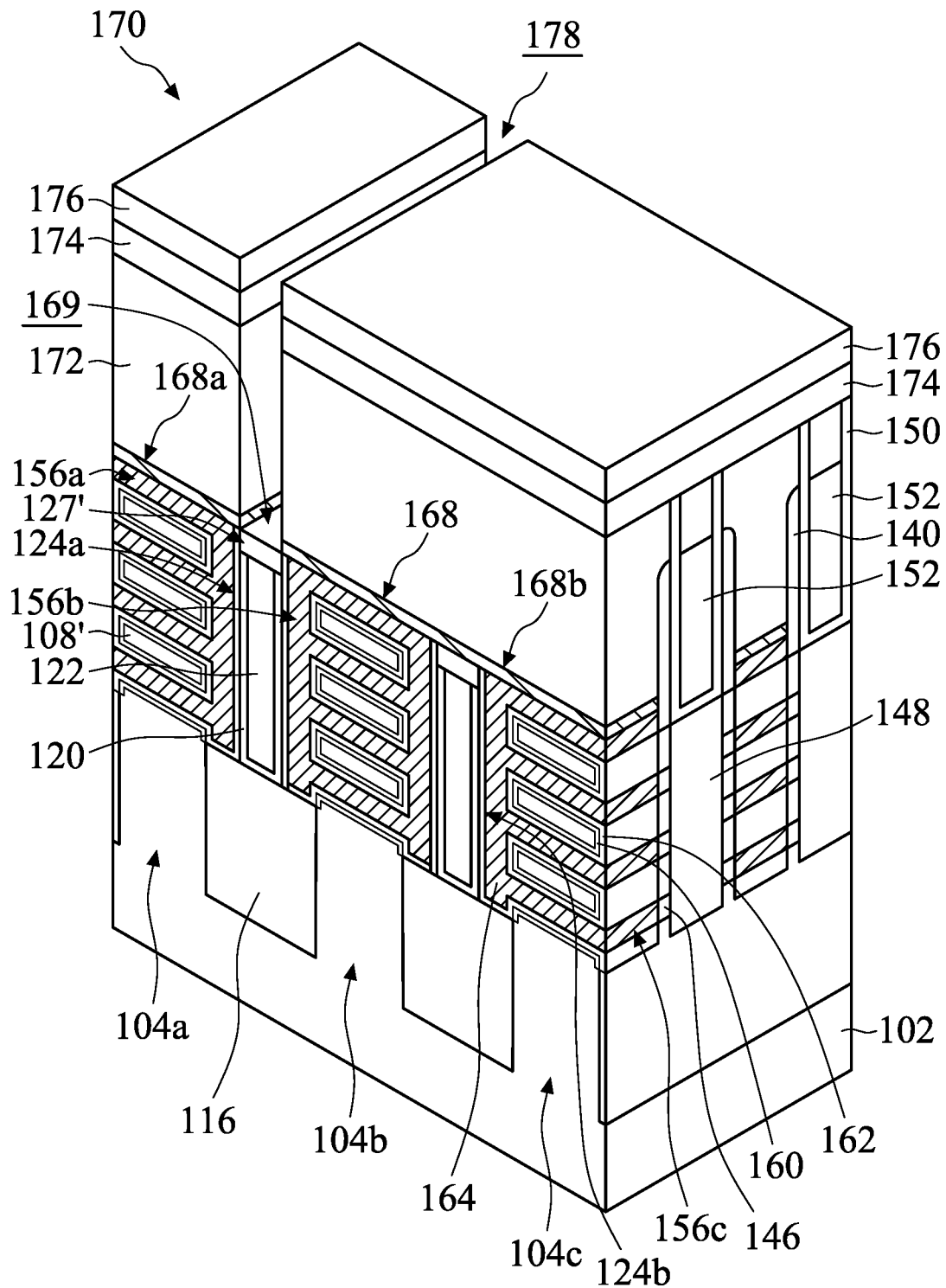
Figure 2U:
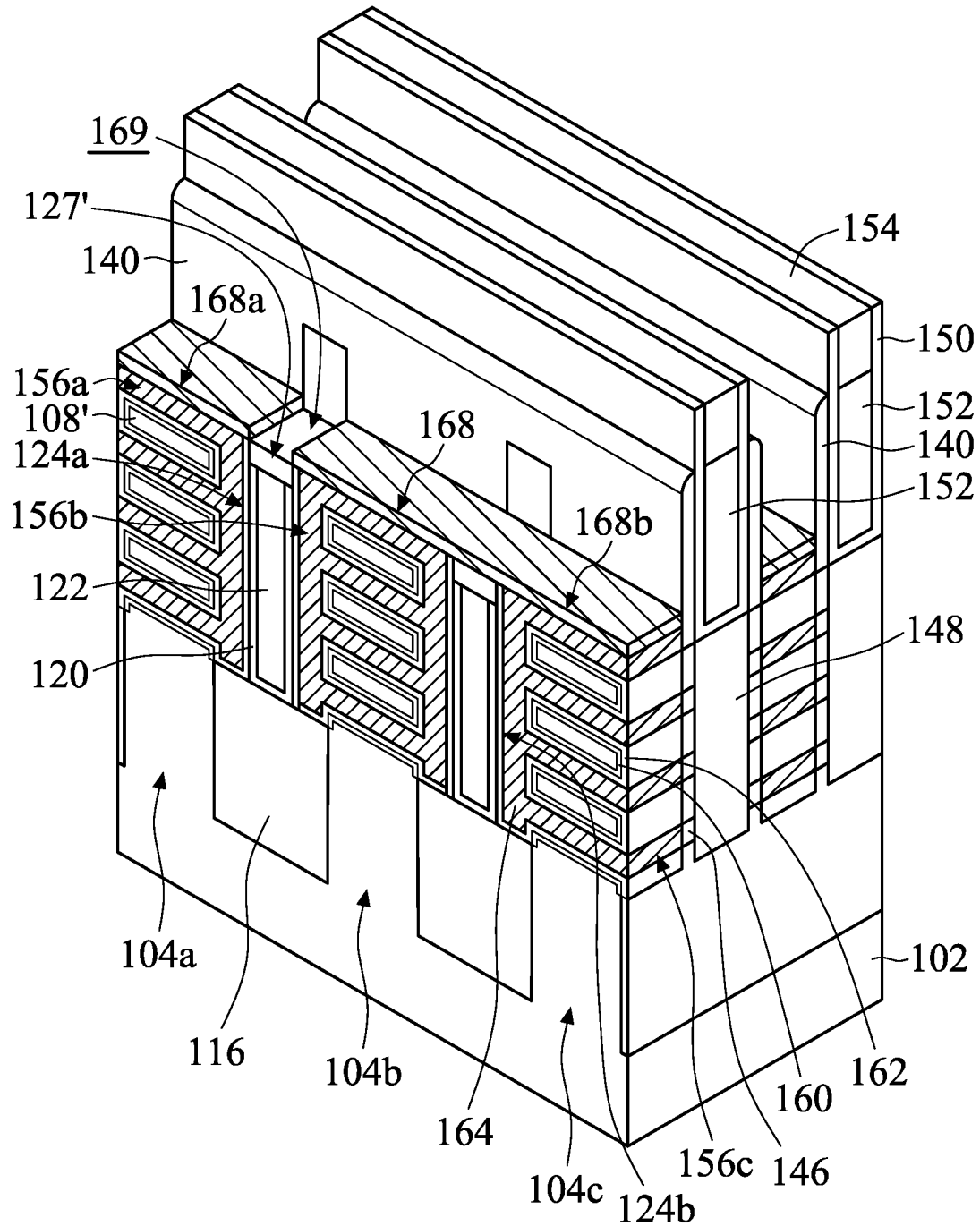
Figure 2V:
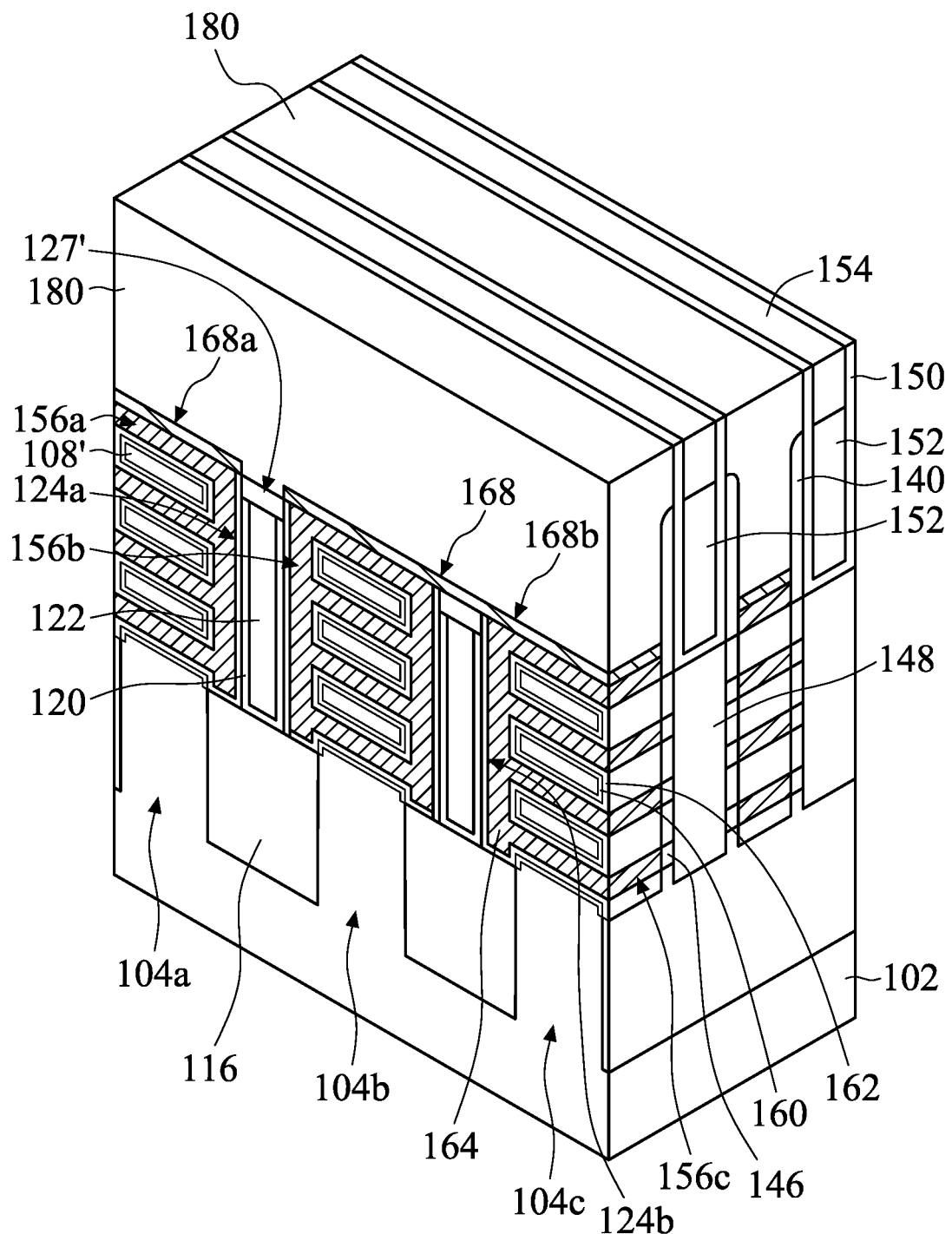
Figure 2W:
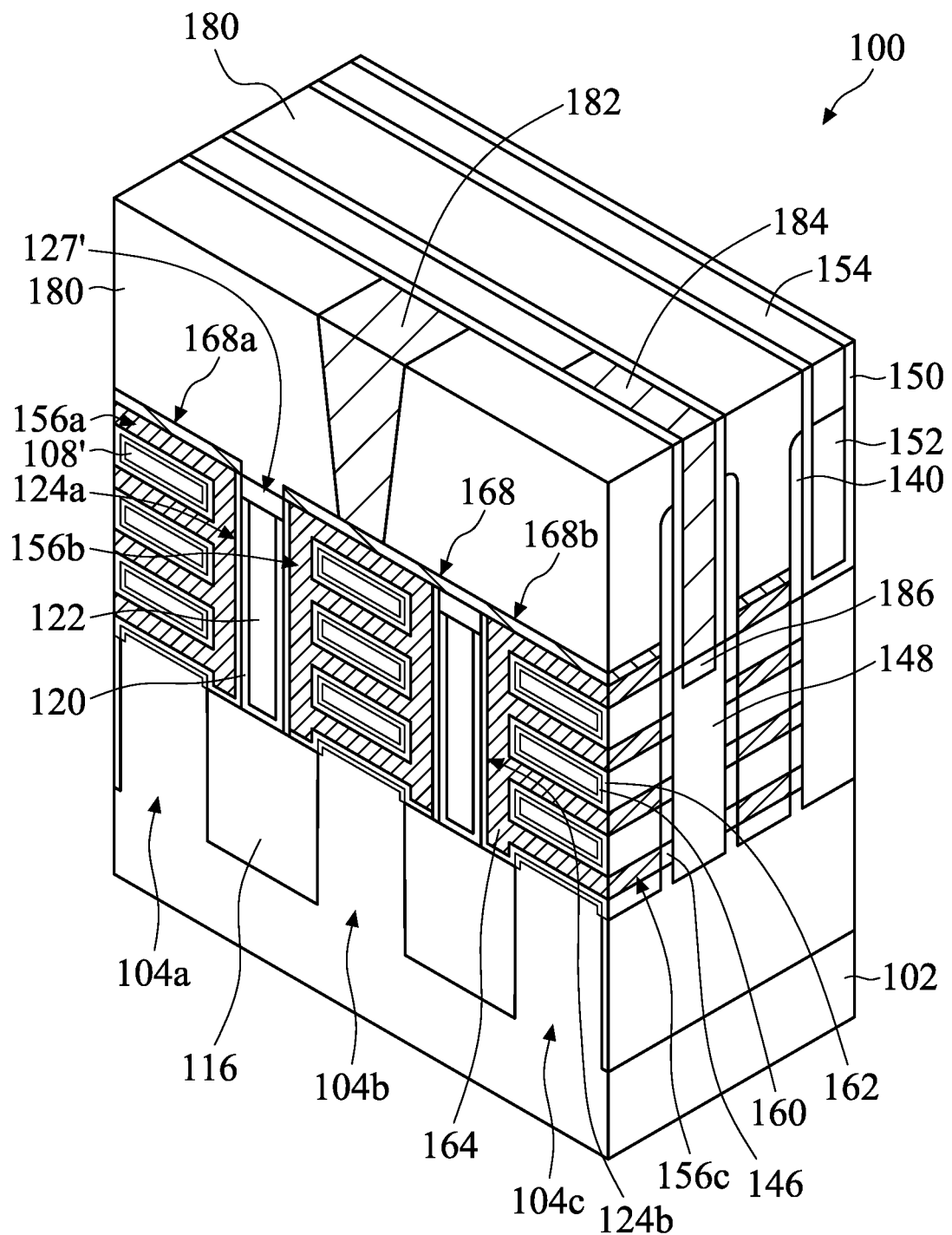

FIGS. 2A to 2W illustrate diagrammatic perspective views of intermediate stages of manufacturing the semiconductor structure 100 in accordance with some embodiments. More specifically, FIGS. 2A to 2N illustrate diagrammatic perspective views of intermediate stages of manufacturing the semiconductor structure 100 shown in the dotted line block $C_1$ of FIG. 1 in accordance with some embodiments. Similar elements shown in FIG. 1 may have similar features as those shown in FIGS. 2A to 2N, although they are not shown in FIGS. 2A to 2N. For example, the processes and materials for forming the fin structure 104a may be the same as those for forming the fin structures 104b and 104c shown in FIGS. 2A to 2N and described below.

First, a semiconductor stack including first semiconductor material layers 106 and second semiconductor material layers 108 are formed over a substrate 102, as shown in FIG. 2A in accordance with some embodiments.

The substrate 102 may be a semiconductor wafer such as a silicon wafer. Alternatively or additionally, the substrate 102 may include elementary semiconductor materials, compound semiconductor materials, and/or alloy semiconductor materials. Elementary semiconductor materials may include, but are not limited to, crystal silicon, polycrystalline silicon, amorphous silicon, germanium, and/or diamond. Compound semiconductor materials may include, but are not limited to, silicon carbide, gallium arsenic, gallium phosphide, indium phosphide, indium arsenide, and/or indium antimonide. Alloy semiconductor materials may include, but are not limited to, SiGe, GaAsP, AlInAs, AlGaAs, GaInAs, GaInP, and/or GaInAsP.

In some embodiments, the first semiconductor material layers 106 and the second semiconductor material layers 108 are alternately stacked over the substrate 102 to form the semiconductor stack. In some embodiment, the first semiconductor material layers 106 and the second semiconductor material layers 108 are made of different semiconductor materials. In some embodiments, the first semiconductor material layers 106 are made of SiGe, and the second semiconductor material layers 108 are made of silicon. It should be noted that although three first semiconductor material layers 106 and three second semiconductor material layers 108 are formed, the semiconductor structure may include more or fewer first semiconductor material layers 106 and second semiconductor material layers 108. For example, the semiconductor structure may include two to five of the first semiconductor material layers 106 and two to five of the second semiconductor material layers 108.

The first semiconductor material layers 106 and the second semiconductor material layers 108 may be formed by using low-pressure chemical vapor deposition (LPCVD), epitaxial growth process, another suitable method, or a combination thereof. In some embodiments, the epitaxial growth process includes molecular beam epitaxy (MBE), metal organic chemical vapor deposition (MOCVD), or vapor phase epitaxy (VPE).

After the first semiconductor material layers 106 and the second semiconductor material layers 108 are formed as the semiconductor material stack over the substrate 102, the semiconductor material stack is patterned to form fin structures 104a (not shown in FIG. 2B), 104b, and 104c, as shown in FIG. 2B in accordance with some embodiments. In some embodiments, the fin structures 104a, 104b, and 104c include base fin structures 105 and the semiconductor material stacks including the first semiconductor material layers 106 and the second semiconductor material layers 108 formed over the base fin structure 105. In some embodiments, the widths of the fin structures 104a, 104b, and 104c are substantially the same. In some embodiments, the distance DI between adjacent first structures (e.g. the fin structures 104b and 104c) is in a range from about 20 nm to about 1000 nm.

In some embodiments, the patterning process includes forming mask structures 110 over the semiconductor material stack, and etching the semiconductor material stack and the underlying substrate 102 through the mask structure 110. In some embodiments, the mask structures 110 are a multilayer structure including a pad oxide layer 112 and a nitride layer 114 formed over the pad oxide layer 112. The pad oxide layer 112 may be made of silicon oxide, which may be formed by thermal oxidation or CVD, and the nitride layer 114 may be made of silicon nitride, which may be formed by CVD, such as LPCVD or plasma-enhanced CVD (PECVD).

After the fin structures 104a, 104b, and 104c are formed, an isolation structure 116 is formed around the fin structures 104a, 104b, and 104c, and the mask structures 110 are removed, as shown in FIG. 2C in accordance with some embodiments. The isolation structure 116 is configured to electrically isolate active regions (e.g. the fin structures 104a, 104b, and 104c) of the semiconductor structure 100 and is also referred to as shallow trench isolation (STI) feature in accordance with some embodiments.

The isolation structure 116 may be formed by depositing an insulating layer over the substrate 102 and recessing the insulating layer so that the fin structures 104a, 104b, and 104c are protruded from the isolation structure 116. In some embodiments, the isolation structure 116 is made of silicon oxide, silicon nitride, silicon oxynitride (SiON), another suitable insulating material, or a combination thereof. In some embodiments, a dielectric liner (not shown) is formed before the isolation structure 116 is formed, and the dielectric liner is made of silicon nitride and the isolation structure formed over the dielectric liner is made of silicon oxide.

After the isolation structure 116 is formed, cladding layers 118 are formed over the top surfaces and the sidewalls of the fin structures 104a, 104b, and 104c over the isolation structure 116, as shown in FIG. 2D in accordance with some embodiments.

In some embodiments, the cladding layers 118 are made of semiconductor materials. In some embodiments, the cladding layers 118 are made of silicon germanium (SiGe). The cladding layer 118 may be formed by performing an epitaxy process, such as VPE and/or UHV CVD, molecular beam epitaxy, other applicable epitaxial growth processes, or combinations thereof. After the cladding layers 118 are deposited, an etching process may be performed to remove the portion of the cladding layer 118 not on the sidewalls of the fin structures 104a, 104b, and 104c, for example, using a plasma dry etching process. In some embodiments, the portions of the cladding layers 118 formed on the top surface of the fin structures 104a, 104b, and 104c are partially or completely removed by the etching process, such that the thickness of the cladding layer 118 over the top surface of the fin structures 104a, 104b, and 104c is thinner than the thickness of the cladding layer 118 on the sidewalls of the fin structures 104a, 104b, and 104c.

Before the cladding layers 118 are formed, a semiconductor liner (not shown) may be formed over the fin structures 104a, 104b, and 104c. The semiconductor liner may be a Si layer and may be incorporated into the cladding layers 118 during the epitaxial growth process for forming the cladding layers 118.

Next, a dielectric liner 120 is formed over the cladding layers 118 and the isolation structure 116, as shown in FIG. 2E in accordance with some embodiments. In some embodiments, the dielectric liner 120 is made of SiN, SiCN, SiOCN, SiON, or the like. In some embodiments, the dielectric liner 120 is made of a dielectric material, such as $HfO_2$, $HfSiO_x$ (such as $HfSiO_4$), HfSiON, HfLaO, HfTaO, HfTiO, HfZrO, HfAlOx, $ZrO2$, $ZrSiO_2$, AlSiO, $Al_2O_3$, $TiO_2$, LaO, LaSiO, $Ta_2O_3$, $Ta_2O_5$, $Y_2O_3$, $SrTiO_3$, $BaZrO$, $BaTiO_3$ (BTO), $(Ba,Sr)TiO_3$ (BST), $Si_3N_4$, hafnium dioxide-alumina ($HfO_2$—$Al_2O_3$) alloy, other applicable dielectric material, or combinations thereof. The dielectric liner 120 may be deposited using CVD, PVD, ALD, HDPCVD, MOCVD, RPCVD, PECVD, LPCVD, ALCVD, APCVD, other applicable methods, or combinations thereof. In some embodiments, the dielectric liner 120 has a thickness in a range from about 1 nm to about 6 nm.

After the dielectric liners 120 are formed, dielectric fill layers 122 are formed over the dielectric liners 120 to completely fill the spaces between the adjacent fin structures 104a, 104b, and 104c, and a polishing process is performed until the top surfaces of the cladding layers 118 are exposed, as shown in FIG. 2F in accordance with some embodiments.

In some embodiments, the dielectric fill layers 122 and the dielectric liners 120 are made of different dielectric materials. In some embodiments, the dielectric fill layers 122 are made of a low k dielectric material and the dielectric liners 120 are made of a high k dielectric material. In some embodiments, the dielectric fill layers 122 are made of SiN, SiCN, SiOCN, SiON, or the like. The dielectric fill layers 122 may be deposited using a flowable CVD (FCVD) process that includes, for example, depositing a flowable material (such as a liquid compound) and converting the flowable material to a solid material by a suitable technique, such as thermal annealing and/or ultraviolet radiation treating.

Next, recesses are formed between the fin structures 104a, 104b, and 104c and a dielectric material is formed in the recesses to form the dielectric features 124a, 124b, and 124c separating the fin structures 104a, 104b, and 104c, as shown in FIG. 2G in accordance with some embodiments. In some embodiments, the dielectric features 124a, 124b, and 124c include bottom portions, including of the dielectric fill layers 122 and the dielectric liners 120, and upper portions 126 formed over the bottom portions. In some embodiments, the interface between the bottom portion and the upper portion 126 of the dielectric feature is substantially level with the top surface of the topmost second semiconductor layer 108. In some embodiments, the dielectric constant of the upper portion 126 is higher than that of the bottom portion.

In some embodiments, the dielectric fill layers 122 and the dielectric liners 120 are partially removed to form the recesses by performing an etching process. Afterwards, the recesses are filled with a dielectric material to form the upper portions 126. In some embodiments, the dielectric material for forming the upper portions 126 of the dielectric features 124a, 124b, and 124c is SiN, SiCN, SiOCN, SiON, $HfO_2$, $ZrO_2$, $HfAlO_x$, $HfSiO_x$, $Al_2O_3$, or the like. The dielectric material may be formed by performing ALD, CVD, PVD, oxidation-based deposition process, other suitable process, or combinations thereof. After the dielectric material is formed, a CMP process is performed until the mask structures 110 are exposed in accordance with some embodiments.

Since the dielectric features 124a, 124b, and 124c are self-aligned to the spaces between the fin structures 104a, 104b, and 104c, complicated alignment processes are not required when forming the dielectric features. In addition, the width of the dielectric features may be determined by the widths of the spaces between the fin structures 104a, 104b, and 104c and the thicknesses of the cladding layer 118. In some embodiments, the dielectric features 124a, 124b, and 124c have substantially the same width. Meanwhile, in some embodiments, the spaces between the fin structures 104a, 104b, and 104c have different widths, and the dielectric features 124a, 124b, and 124c also have different widths.

As shown in FIG. 1, the dielectric features 124a, 124b, and 124c are formed between the adjacent fin structures 104a, 104b, and 104c and are substantially parallel to the fin structures 104a, 104b, and 104c in accordance with some embodiments.

Next, the mask structures 110 are removed and the cladding layers 118 are partially removed to expose the top surfaces of the topmost second semiconductor material layers 108, as shown in FIG. 2H in accordance with some embodiments. In some embodiments, the top surfaces of the cladding layers 118 are substantially level with the top surfaces of the topmost second semiconductor material layers 108.

The mask structures 110 and the cladding layers 118 may be recessed by performing one or more etching processes that have higher etching rate to the mask structures 110 and the cladding layers 118 than the dielectric features 124a, 124b, and 124c, such that the dielectric features 124a, 124b, and 124c are only slightly etched during the etching processes. The selective etching processes can be dry etching, wet drying, reactive ion etching, or other applicable etching methods.

Afterwards, dummy gate structures 128 are formed across the fin structure 104a, 104b, and 104c and the dielectric features 124a, 124b, and 124c, as shown in FIG. 2I in accordance with some embodiments. The dummy gate structures 128 may be used to define the source/drain regions and the channel regions of the resulting semiconductor structure 100.

In some embodiments, the dummy gate structures 128 include dummy gate dielectric layers 130 and dummy gate electrode layers 132. In some embodiments, the dummy gate dielectric layers 130 are made of one or more dielectric materials, such as silicon oxide, silicon nitride, silicon oxynitride (SiON), $HfO_2$, HfZrO, HfSiO, HfTiO, HfAlO, or a combination thereof. In some embodiments, the dummy gate dielectric layers 130 are formed using thermal oxidation, CVD, ALD, physical vapor deposition (PVD), another suitable method, or a combination thereof.

In some embodiments, the dummy gate electrode layers 132 are made of conductive material includes polycrystalline-silicon (poly-Si), poly-crystalline silicon-germanium (poly-SiGe), metallic nitrides, metallic silicides, metals, or a combination thereof. In some embodiments, the dummy gate electrode layers 132 are formed using CVD, PVD, or a combination thereof.

In some embodiments, hard mask layers 134 are formed over the dummy gate structures 128. In some embodiments, the hard mask layers 134 include multiple layers, such as an oxide layer 136 and a nitride layer 138. In some embodiments, the oxide layer 136 is silicon oxide, and the nitride layer 138 is silicon nitride.

The formation of the dummy gate structures 128 may include conformally forming a dielectric material as the dummy gate dielectric layers 130. Afterwards, a conductive material may be formed over the dielectric material as the dummy gate electrode layers 132, and the hard mask layer 134 may be formed over the conductive material. Next, the dielectric material and the conductive material may be patterned through the hard mask layer 134 to form the dummy gate structures 128.

After the dummy gate structures 128 are formed, gate spacers 140 are formed along and covering opposite sidewalls of the dummy gate structure 128, as shown in FIG. 2J in accordance with some embodiments. In some embodiments, the gate spacers 140 also cover some portions of the top surfaces of the sidewalls of the dielectric features 124a, 124b, and 124c.

The gate spacers 140 may be configured to separate source/drain structures (formed afterwards) from the dummy gate structure 128. In some embodiments, the gate spacers 140 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), and/or a combination thereof.

After the gate spacers 140 are formed, source/drain recesses 142 are formed adjacent to the gate spacers 140, as shown in FIG. 2J in accordance with some embodiments. More specifically, the fin structures 104a, 104b, and 104d and the cladding layers 118 not covered by the dummy gate structures 128 and the gate spacers 140 are recessed in accordance with some embodiments. In addition, the upper portions 126 of the dielectric features 124a, 124b, and 124c are also partially recessed to have a recessed portion 127 at the source/drain regions in accordance with some embodiments.

In some embodiments, the fin structures 104a, 104b, and 104c and the cladding layers 118 are recessed by performing an etching process. The etching process may be an anisotropic etching process, such as dry plasma etching, and the dummy gate structure 128 and the gate spacers 140 are used as etching masks during the etching process.

After the source/drain recesses 142 are formed, the first semiconductor material layers 106 and the cladding layers 118 exposed by the source/drain recesses 142 are laterally recessed to form notches 144, as shown in FIG. 2K in accordance with some embodiments.

In some embodiments, an etching process is performed to laterally recess the first semiconductor material layers 106 of the fin structure 104a, 104b, and 104c and the cladding layers 118 from the source/drain recesses 142. In some embodiments, during the etching process, the first semiconductor material layers 106 and the cladding layers 118 have a greater etching rate (or etching amount) than the second semiconductor material layers 108, thereby forming notches 144 between the adjacent second semiconductor material layers 108 and around the second semiconductor material layers 108. In some embodiments, the etching process is an isotropic etching such as dry chemical etching, remote plasma etching, wet chemical etching, another suitable technique, and/or a combination thereof.

Next, inner spacers 146 are formed in the notches 144 between and around the second semiconductor material layers 108, as shown in FIG. 2L in accordance with some embodiments. The inner spacers 146 may be configured to separate the source/drain structures and the gate structures formed in subsequent manufacturing processes. In some embodiments, the inner spacers 146 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), or a combination thereof.

After the inner spacers 146 are formed, source/drain structures 148 are formed in the source/drain recesses 142, as shown in FIG. 2M in accordance with some embodiments. In some embodiments, the source/drain structures 148 are separated by the dielectric features 124a, 124b, and 124c. More specifically, the source/drain structures 148 are formed in the spaces the dielectric features 124a, 124b, and 124c at the source/drain region. In addition, the source/drain structures 148 are in direct contact with the dielectric liner 120 at the bottom portion of the dielectric features 124a, 124b, and 124c in accordance with some embodiments. In some embodiments, air gaps are formed under the source/drain structures 148. In some embodiments, the air gaps are encircled by the source/drain structures 148, the dielectric features 124a, 124b, and 124c, and the isolation structure 116. In some embodiments, the top surfaces of the recessed portions 127 of the upper portions 126 of the dielectric features 124a, 124b, and 124c are higher than the top surfaces of the source/drain structures 148.

In some embodiments, the source/drain structures 148 are formed using an epitaxial growth process, such as MBE, MOCVD, VPE, other applicable epitaxial growth process, or a combination thereof. In some embodiments, the source/drain structures 148 are made of any applicable material, such as Ge, Si, GaAs, AlGaAs, SiGe, GaAsP, SiP, SiC, SiCP, or a combination thereof.

In some embodiments, the source/drain structures 148 are in-situ doped during the epitaxial growth process. For example, the source/drain structures 148 may be the epitaxially grown SiGe doped with boron (B). For example, the source/drain structures 148 may be the epitaxially grown Si doped with carbon to form silicon:carbon (Si:C) source/drain features, phosphorous to form silicon:phosphor (Si:P) source/drain features, or both carbon and phosphorous to form silicon carbon phosphor (SiCP) source/drain features. In some embodiments, the source/drain structures 148 are doped in one or more implantation processes after the epitaxial growth process.

After the source/drain structures 148 are formed, a contact etch stop layer (CESL) 150 is conformally formed to cover the source/drain structures 148 and an interlayer dielectric (ILD) layer 152 is formed over the contact etch stop layers 150, as shown in FIG. 2N in accordance with some embodiments.

In some embodiments, the contact etch stop layer 150 is made of a dielectric materials, such as silicon nitride, silicon oxide, silicon oxynitride, another suitable dielectric material, or a combination thereof. The dielectric material for the contact etch stop layers 150 may be conformally deposited over the semiconductor structure by performing CVD, ALD, other application methods, or a combination thereof.

The interlayer dielectric layer 152 may include multilayers made of multiple dielectric materials, such as silicon oxide, silicon nitride, silicon oxynitride, phosphosilicate glass (PSG), borophosphosilicate glass (BPSG), or other applicable low-k dielectric materials. The interlayer dielectric layer 152 may be formed by chemical vapor deposition (CVD), physical vapor deposition, (PVD), atomic layer deposition (ALD), or other applicable processes.

After the contact etch stop layer 150 and the interlayer dielectric layer 152 are deposited, a planarization process such as CMP or an etch-back process is performed until the gate electrode layers 132 of the dummy gate structures 128 are exposed, and protection layers 154 are formed over the interlayer dielectric layer 152, as shown in FIG. 2N in accordance with some embodiments. More specifically, after the planarization process is performed, the interlayer dielectric layer 152 is recessed to a level below the top surface of the dummy gate electrode layer 132 and the protection layers 154 are deposited over the interlayer dielectric layer 152 to protect the interlayer dielectric layer 152 from subsequent etching processes. In some embodiments, the protection layers 154 are made of a material that is the same as or similar to that in the contact etch stop layer 150. In some embodiments, the protection layers 154 are made of $Si_3N_4$, SiCN, SiOCN, SiOC, a metal oxide such as $HrO_2$, $ZrO_2$, hafnium aluminum oxide, and hafnium silicate, or other applicable material. The protection layers 154 may be formed by CVD, PVD, ALD, or other applicable methods.

FIGS. 2O to 2W illustrate diagrammatic perspective views of intermediate stages of manufacturing the semiconductor structure 100 shown in the dotted line block $C_2$ of FIG. 1 in accordance with some embodiments. Although some elements shown in FIG. 1 are not shown in FIGS. 2O to 2W, they may have similar features as the elements shown in FIGS. 2O to 2W. For example, the dielectric feature 124c may have the same shapes as the dielectric feature 124b shown in FIGS. 2O to 2W.

After the interlayer dielectric layer 152 and the protection layers 154 are formed, the dummy gate structures 128, the cladding layers 118, and the first semiconductor material layers 106 are removed to form gate trenches, and gate structures 156 are formed in the gate trenches, as shown in FIG. 2O in accordance with some embodiments. More specifically, the dummy gate structures 128, the cladding layers 118, and the first semiconductor material layers 106 are removed are removed to form nanostructures 108' with the second semiconductor material layers 108 in accordance with some embodiments. The removal process may include one or more etching processes. For example, when the dummy gate electrode layers 132 are polysilicon, a wet etchant such as a tetramethylammonium hydroxide (TMAH) solution may be used to selectively remove the dummy gate electrode layers 132. Afterwards, the dummy gate dielectric layers 130 may be removed using a plasma dry etching, a dry chemical etching, and/or a wet etching. The first semiconductor material layers 106 and the cladding layers 118 may be removed by performing a selective wet etching process, such as APM (e.g., ammonia hydroxide-hydrogen peroxide-water mixture) etching process. For example, the wet etching process uses etchants such as ammonium hydroxide ($NH_4OH$), TMAH, ethylenediamine pyrocatechol (EDP), and/or potassium hydroxide (KOH) solutions.

In some embodiments, the upper portions of the gate spacers 140 are also removed, so that the upper portions of the gate trenches may be enlarged and the gate structure 156 can be formed in the gate trenches more easily. In some embodiments, the height of the gate spacers is in a range from about 5 nm to about 50 nm.

After the nanostructures 108' are formed, the gate structures 156 are formed wrapping around the nanostructures 108', as shown in FIG. 2O in accordance with some embodiments. The gate structures 156 wrap around the nanostructures 108' to form gate-all-around transistor structures in accordance with some embodiments. In some embodiments, the gate structures 158 include an interfacial layer 160, a gate dielectric layer 162, and a gate electrode layer 164.

In some embodiments, the interfacial layers 160 are oxide layers formed around the nanostructures 108' and on the exposed portions of the base fin structures 105. In some embodiments, the interfacial layers 160 are formed by performing a thermal process.

In some embodiments, the gate dielectric layers 162 are formed over the interfacial layers 160, so that the nanostructures 108' are surrounded (e.g. wrapped) by the gate dielectric layers 162. In addition, the gate dielectric layers 162 also cover the sidewalls of the gate spacers 140, the inner spacers 146, and the dielectric features 124a, 124b, and 124c in accordance with some embodiments. In some embodiments, the gate dielectric layers 162 are made of one or more layers of dielectric materials, such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other applicable high-k dielectric materials, or a combination thereof. In some embodiments, the gate dielectric layers 162 are formed using CVD, ALD, other applicable methods, or a combination thereof.

In some embodiments, the gate electrode layers 164 are formed on the gate dielectric layers 162. In some embodiments, the gate electrode layers 164 are made of one or more layers of conductive material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another suitable material, or a combination thereof. In some embodiments, the gate electrode layers 164 are formed using CVD, ALD, electroplating, another applicable method, or a combination thereof. Other conductive layers, such as work function metal layers, may also be formed in the gate structures 156, although they are not shown in the figures. After the interfacial layers 160, the gate dielectric layers 162, and the gate electrode layers 164 are formed, a planarization process such as CMP or an etch-back process may be performed until the protection layers 154 are exposed.

After the gate structures 156 are formed, an etch back process is performed to remove the upper portions of the gate structures 156 and the upper portions of the dielectric features 124a, 124b, and 124c (not shown) at the channel region, as shown in FIG. 2P in accordance with some embodiments. More specifically, the upper portions of the gate structures 156 and the upper portions of the dielectric features 124a, 124b, and 124c are removed to form recesses 166 between the gate spacers 140 in accordance with some embodiments.

In some embodiments, the top surfaces of the gate structures 156 are substantially level with the top surfaces of the dielectric features 124a, 124b, and 124c at the channel regions. After the etching back process is performed, the gate structure 156 is divided into portions 156a, 156b, 156c, and 156d by the dielectric features 124a, 124b, and 124c, as shown in FIGS. 1 and 2P in accordance with some embodiments.

As shown in FIG. 2P, the upper portions 126 of the dielectric features 124a, 124b, and 124c have recessed portions 127' at the channel region, recessed portions 127 at the source/drain region (not shown in FIG. 2P, see FIG. 2J), and an original portion 127" between the recessed portions 127 and the recessed portions 127' in accordance with some embodiments. In some embodiments, the original portions 127" are embedded in the gate spacers 140, and the top surfaces of the original portions 127" of the upper portions 126 of the dielectric features 124a, 124b, and 124c are lower than the top surface of the gate spacers 140. In some embodiments, the top surfaces of the original portions 127" are higher than both the recesses portion 127' at the channel region and the recessed portion 127 at the source/drain region.

In some embodiments, the interface between the recessed portion 127' and the bottom portion of the dielectric feature 124a is substantially level with the topmost surface of the nanostructures 108'. In some embodiments, the thickness of the recessed portion 127' at the channel region is in a range from about 5 nm to about 30 nm. In some embodiments, the thickness of the recessed portion 127' is controlled so the k-value will not be too high and the electrical performance of the resulting device will not be undermined.

Afterwards, a metal layer 168 is conformally formed over the bottom surfaces and the sidewalls of the recesses 166, as shown in FIG. 2Q in accordance with some embodiments. More specifically, the metal layer 168 covers the top surface of the gate structures 156, the top surface of the recessed portion 127' and the sidewall of the original portion 127" of the dielectric features 124a, 124b, and 124c, the top surfaces of the protection layers 154, and the sidewalls of the CESL 150 in accordance with some embodiments. In some embodiments, the metal layer 168 is made of Ru, W, TiN, TaN, Co, Ti, TiAl, or the like.

Next, the metal layer 168 formed on the sidewalls of the gate spacers 140, the sidewalls of the CESL 150, and the top surfaces of the protection layers 154 are removed, as shown in FIG. 2R in accordance with some embodiments. In some embodiments, a wet etching process is performed to partially remove the metal layer 168.

The metal layers 168 may be configured to electrically connect various portions of the gate structures 156 divided by the dielectric features 124. In some embodiments, the metal layer 168 has a thickness in a range from about 2 nm to about 10 nm. The metal layers 168 should be thick enough or they may be broken in subsequent manufacturing processes and the connection between different portions of the gate structures 156 may be affected. On the other hand, the metal layers 168 should not be too thick or the capacitance of the resulting device may be increased and the speed of the device may be reduced.

After the metal layers 168 are formed, a photoresist structure 170 is formed to patterned the metal layers 168, as shown in FIG. 2S in accordance with some embodiments. In some embodiments, the photoresist structure 170 includes a bottom layer 172, a middle layer 174, and a top photoresist layer 176. As the limits of photolithography processes may be reached by advanced semiconductor manufacturing processes, the need for thinner top photoresist layers has arisen to achieve smaller process windows. However, thin top photoresist layers may tend to be removed during the etching process. Therefore, the middle layer 174 and the bottom layer 172 are formed below the top photoresist layer 176 for more robust etching support, so that the patterning of the metal layer 168 may be performed while still providing a relatively thin top photoresist layer 176.

In some embodiments, the middle layer 174 includes anti-reflective materials (e.g., a backside anti-reflective coating (BARC) layer) to aid in exposure and focus during the processing of the top photoresist layer 176. In some embodiments, the bottom layer 172 includes a hard mask material such as a nitride (e.g., silicon nitride, silicon oxynitride, or the like), a polymer, an amorphous material film (e.g., amorphous carbon film or amorphous silicon film), polysilicon, or any other material that may be patterned and selectively removed.

Afterwards, an opening 178 is formed in the photoresist structure 170, and the metal layer 168 is patterned through the opening 178, as shown in FIG. 2T in accordance with some embodiments. More specifically, an opening 169 is formed in the metal layer 168, and the top surface of the recessed portion 127 of the upper portion 126 of the dielectric feature 124a is exposed by the opening 169 in accordance with some embodiments.

After the metal layer 168 is patterned to form the opening 169, the photoresist structure 170 is removed, as shown in FIG. 2U in accordance with some embodiments. More specifically, the metal layer 168 now includes portions 168a and 168b separated from each other in accordance with some embodiments. In some embodiments, the portion 168a covers the portion 156a of the gate structure 156 and the portion 168b covers the portions 156b and 156c of the gate structure 156 and the dielectric feature 124b.

Next, a dielectric layer 180 is formed over the metal layer 168 and extends into the opening 169, as shown in FIG. 2V in accordance with some embodiments. Since the opening 169 is filled with the dielectric layer 180, the portion 168a of the metal layer 168 and the portion 168b of the metal layer 168 are separated by the dielectric layer 180 in accordance with some embodiments.

The dielectric layer 180 may include multilayers made of multiple dielectric materials, such as $Al_2O_3$, $ZrO_2$, silicon oxide, silicon nitride, silicon oxynitride, phosphosilicate glass (PSG), borophosphosilicate glass (BPSG), or other applicable dielectric materials. The dielectric layer 180 may be formed by chemical vapor deposition (CVD), physical vapor deposition, (PVD), atomic layer deposition (ALD), or other applicable processes.

After the dielectric layer 180 is formed, a conductive structure 182 is formed through the dielectric layer 180 and lands on the portion 168b of the metal layer 168, and a source/drain contact 184 is formed through the interlayer dielectric layer 152 and the protection layer 154 and lands on the source/drain structure 148, as shown in FIG. 2W in accordance with some embodiments. In some embodiments, a silicide layer 186 is formed over the source/drain structure 148 before the source/drain contact 184 is formed.

In some embodiments, the conductive structure 182 and the source/drain contact 184 are made of the same conductive material. The conductive material may include aluminum (Al), copper (Cu), tungsten (W), titanium (Ti), tantalum (Ta), titanium nitride (TiN), cobalt, tantalum nitride (TaN), nickel silicide (NiS), cobalt silicide (CoSi), copper silicide, tantalum carbide (TaC), tantalum silicide nitride (TaSiN), tantalum carbide nitride (TaCN), titanium aluminide (TiAl), titanium aluminum nitride (TiAlN), other applicable conductive materials, or a combination thereof.

Liners and/or barrier layers (not shown) may be formed before forming the conductive materials. The liners may be made of silicon nitride, although any other applicable dielectric may be used as an alternative. The barrier layer may be made of tantalum nitride, although other materials, such as tantalum, titanium, titanium nitride, or the like, may also be used.

The formation of the conductive structure 182 and the source/drain contact 184 may be formed in separated processed. A trench may be formed through the interlayer dielectric layer 152 and the protection layer 154 to expose the source/drain structure 148, and the silicide layer 186 may be formed by forming a metal layer over the top surface of the source/drain structure 148 and annealing the metal layer so the metal layer reacts with the source/drain structure 148 to form the silicide layer 186. The unreacted metal layer may be removed after the silicide layers 186 are formed. Afterwards, a conductive material may be formed in the trench to form the source/drain contact 184 using a process such as chemical vapor deposition (CVD), physical vapor deposition (PVD), plasma enhanced CVD (PECVD), plasma enhanced physical vapor deposition (PEPVD), atomic layer deposition (ALD), or any other applicable deposition processes.

Similarly, the conductive structure 182 may be formed by forming a trench exposing the metal layer 168 and forming a conductive material in the trench using a process such as chemical vapor deposition (CVD), physical vapor deposition (PVD), plasma enhanced CVD (PECVD), plasma enhanced physical vapor deposition (PEPVD), atomic layer deposition (ALD), or any other applicable deposition processes.

Figure 3:
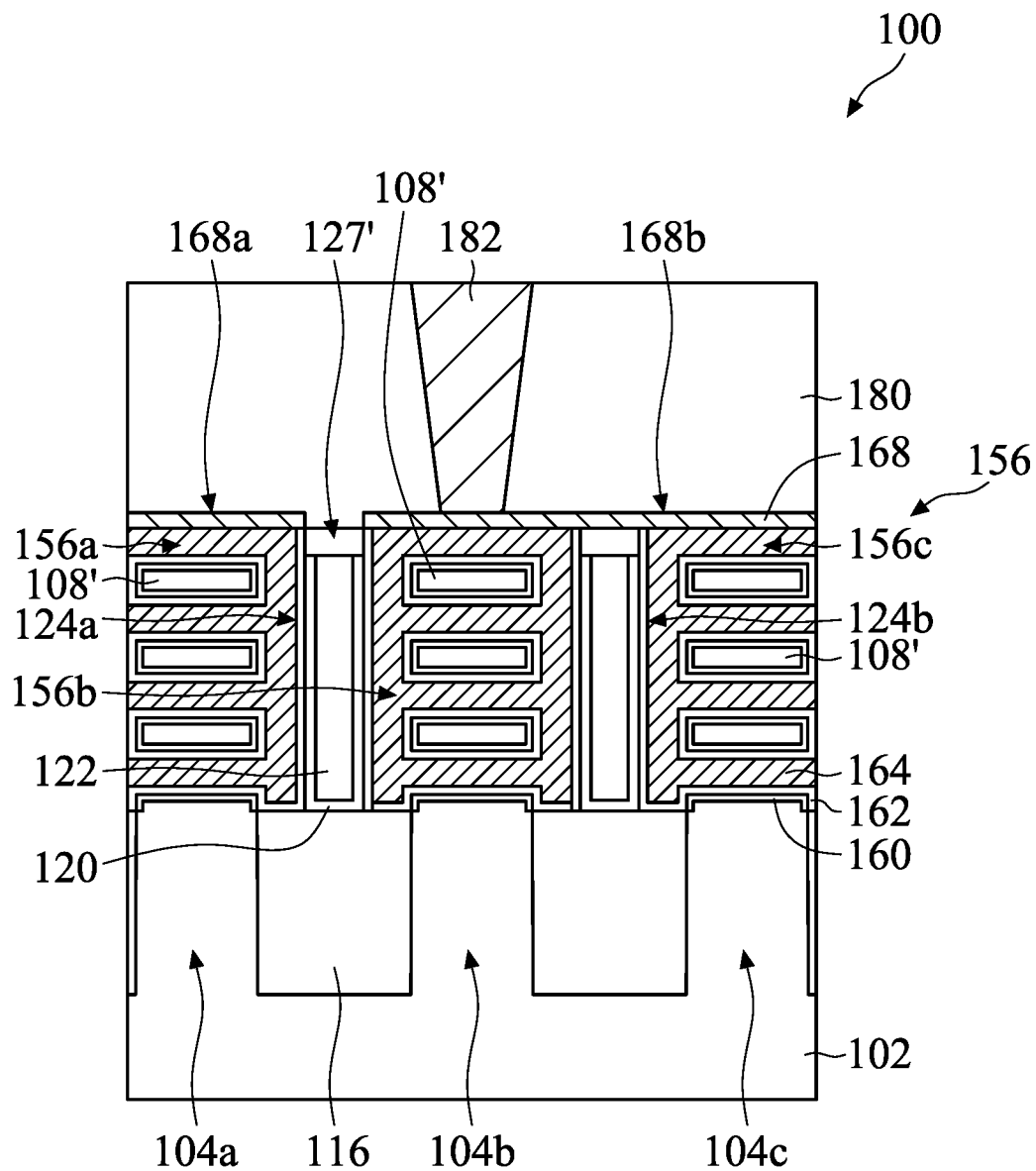
FIG. 3 illustrates a cross-sectional view of the semiconductor structure shown in FIG. 2W and along line A-A' in FIG. 1 in accordance with some embodiments.

FIG. 3 illustrates a cross-sectional view of the semiconductor structure 100 shown in FIG. 2W and along line A-A' in FIG. 1 in accordance with some embodiments. As shown in FIG. 3, the gate structure 156 includes the portion 156a wrapped around the nanostructures 108' of the fin structure 104a, the portion 156b wrapped around the nanostructures 108' of the fin structure 104b, and the portion 156c wrapped around the nanostructures 108' of the fin structure 104c in accordance with some embodiments. The portions 156a, 156b, and 156c of the gate structure 156 are separated by the dielectric features 124a and 124b in accordance with some embodiments. In addition, the portion 168b of the metal layer 168 continuously covers the portions 156b and 156c of the gate structure 156 and the dielectric feature 124b, so that the portions 156b and 156c are electrically connected by the metal layer 168 in accordance with some embodiments.

In some embodiments, the top surface of first dielectric feature 124a at the channel region is substantially level with the top surface of the gate structure 156. In some embodiments, the dielectric features 124a, 124b, and 124c at the channel region are substantial level with each other. In some embodiments, the isolation structure 116 is formed around the base fin structures 105 under the dielectric features 124a, 124b, and 124c. In some embodiments, the portion 156b of the gate structure 156 is in direct contact with the sidewalls of the dielectric features 124a and 124b and the top surface of the isolation structure 116.

Meanwhile, the portion 168a of the metal layer 168 covers the portion 156a of the gate structure 156 but is separated from the portion 168b of the metal layer by the dielectric layer 180, so that the portion 156a of the gate structure 156 is electrically isolated from the portions 156b and 156c of the gate structure 156 in accordance with some embodiments. In some embodiments, the dielectric layer 180 is in direct contact with the metal layer 168 and the top surface of the dielectric feature 124a. In some embodiments, the dielectric features 124a, 124b, and 124c all pass through the gate structure 156, and the dielectric feature 124a is in direct contact with the dielectric layer 180 while the dielectric features 124b and 124c are separated from the dielectric layer 180 by the metal layer 168.

Furthermore, the conductive structure 182 is formed over the portion 156b of the gate structure 156 and is electrically connected with the portion 156b of the gate structure 156 by the portion 168b of the metal layer 168 in accordance with some embodiments. In some embodiments, the interfaces between the upper portions 126 (e.g., recessed portion 127') and the bottom portion of the dielectric features 124a, 124b, and 124c at the channel region are substantially level with the topmost nanostructures 108'.

Since the gate structure 156 is separated into different portions by the dielectric features, and the portions of the gate structure are connected by the metal layer 168 formed afterwards, the spaces between the nanostructures 108' and the dielectric features can be relatively small. In some embodiments, the distance between the nanostructures 108' and the dielectric feature 124a is in a range from about 5 nm to about 20 nm.

Figure 4A:
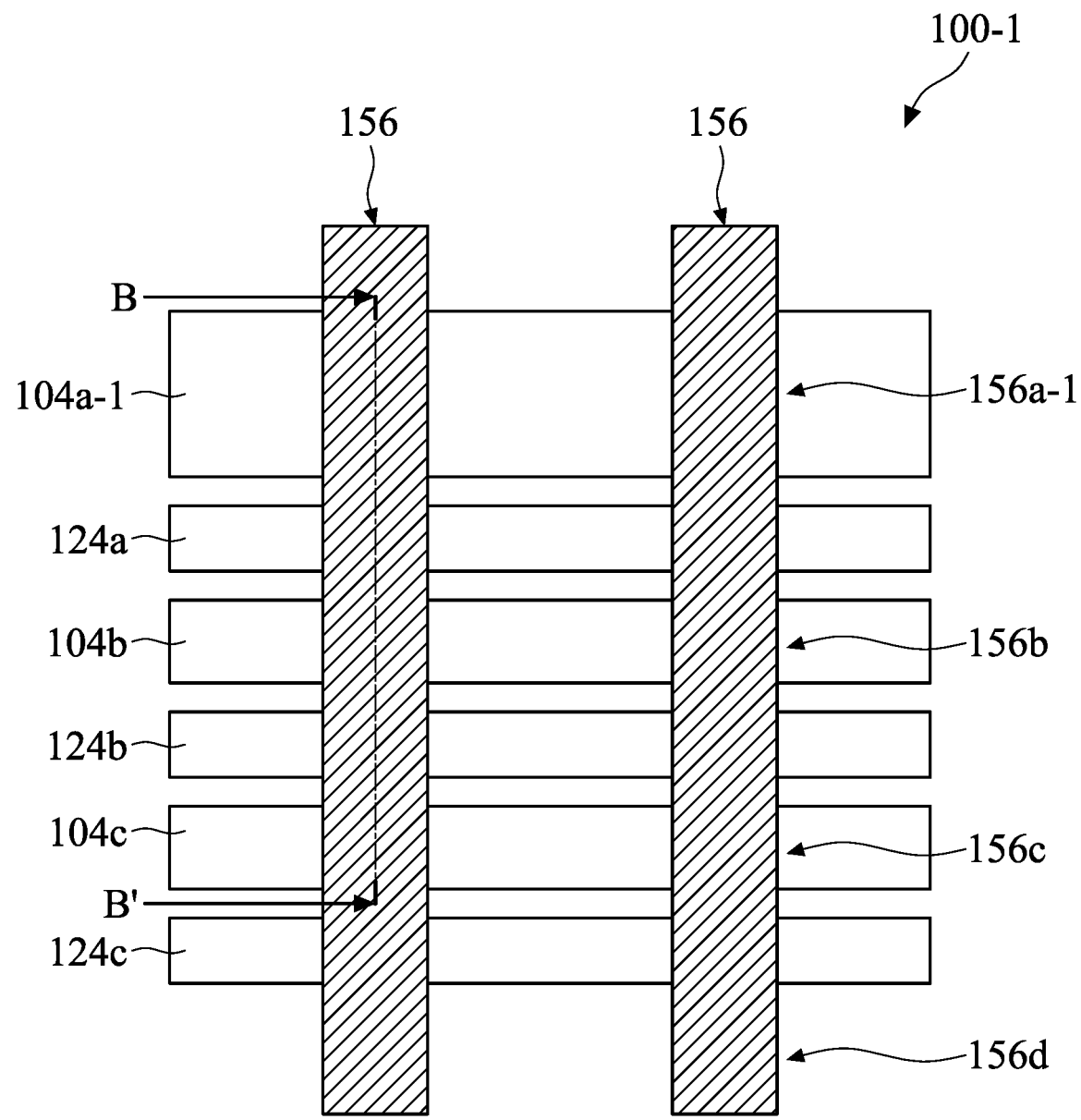
FIG. 4A illustrates a diagrammatic top view of a semiconductor structure in accordance with some embodiments.
Figure 4B:
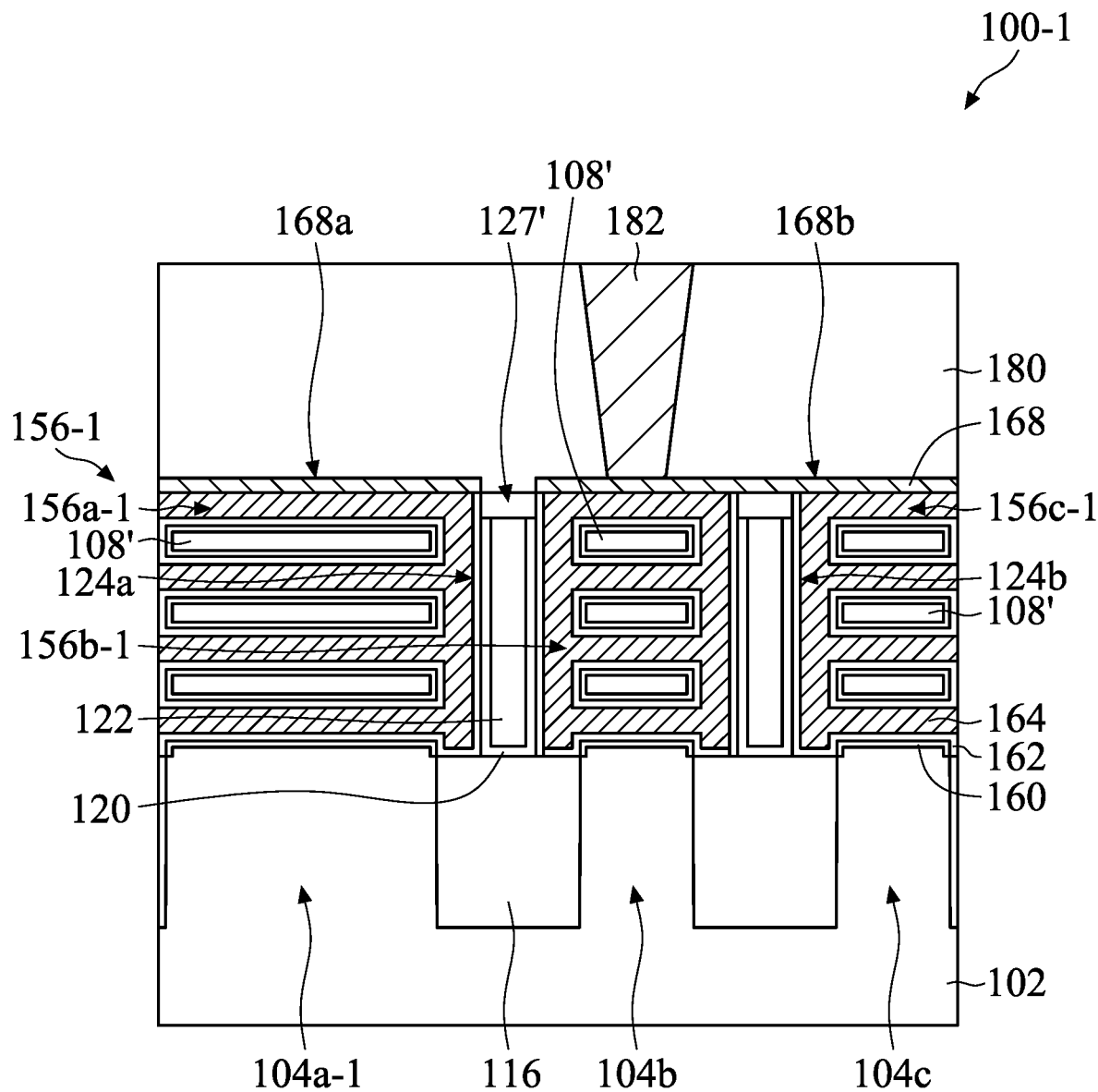
FIG. 4B illustrates a cross-sectional view of the semiconductor structure shown along line B-B' in FIG. 4A in accordance with some embodiments.

FIG. 4A illustrates a diagrammatic top view of a semiconductor structure 100-1 in accordance with some embodiments. FIG. 4B illustrates a cross-sectional view of the semiconductor structure 100-1 shown along line B-B' in FIG. 4A in accordance with some embodiments. The semiconductor structure 100-1 may be similar to the semiconductor structure 100 shown in FIGS. 1 and 3, except fin structures in the semiconductor structure 100-1 have different widths in accordance with some embodiments. Materials and processes for manufacturing the semiconductor structure 100-1 may be similar to, or the same as, those for manufacturing the semiconductor structure 100 described above and are not repeated herein.

More specifically, the semiconductor stack is patterned to form fin structures 104a-1, 104b, and 104c in accordance with some embodiments. In some embodiments, a fin structure 104a-1 is wider than the fin structures 104b and 104c, and the width of the fin structure 104b is substantially the same with the width of the fin structure 104c. The processes and materials for forming the fin structure 104a-1 are the same as those for forming the fin structure 104a and are not repeated herein.

After the fin structure 104a-1 is formed, processes shown in FIGS. 2C to 2W and described previously may be performed to form the semiconductor structure 100-1. In some embodiments, a portion 156a-1 of a gate structure 156-1 is wider than portions 156b-1 and 156c-1 of the gate structure 156-1. The processes and materials for forming the gate structure 156-1 are the same as those for forming the gate structure 156 and are not repeated herein.

Figure 5:
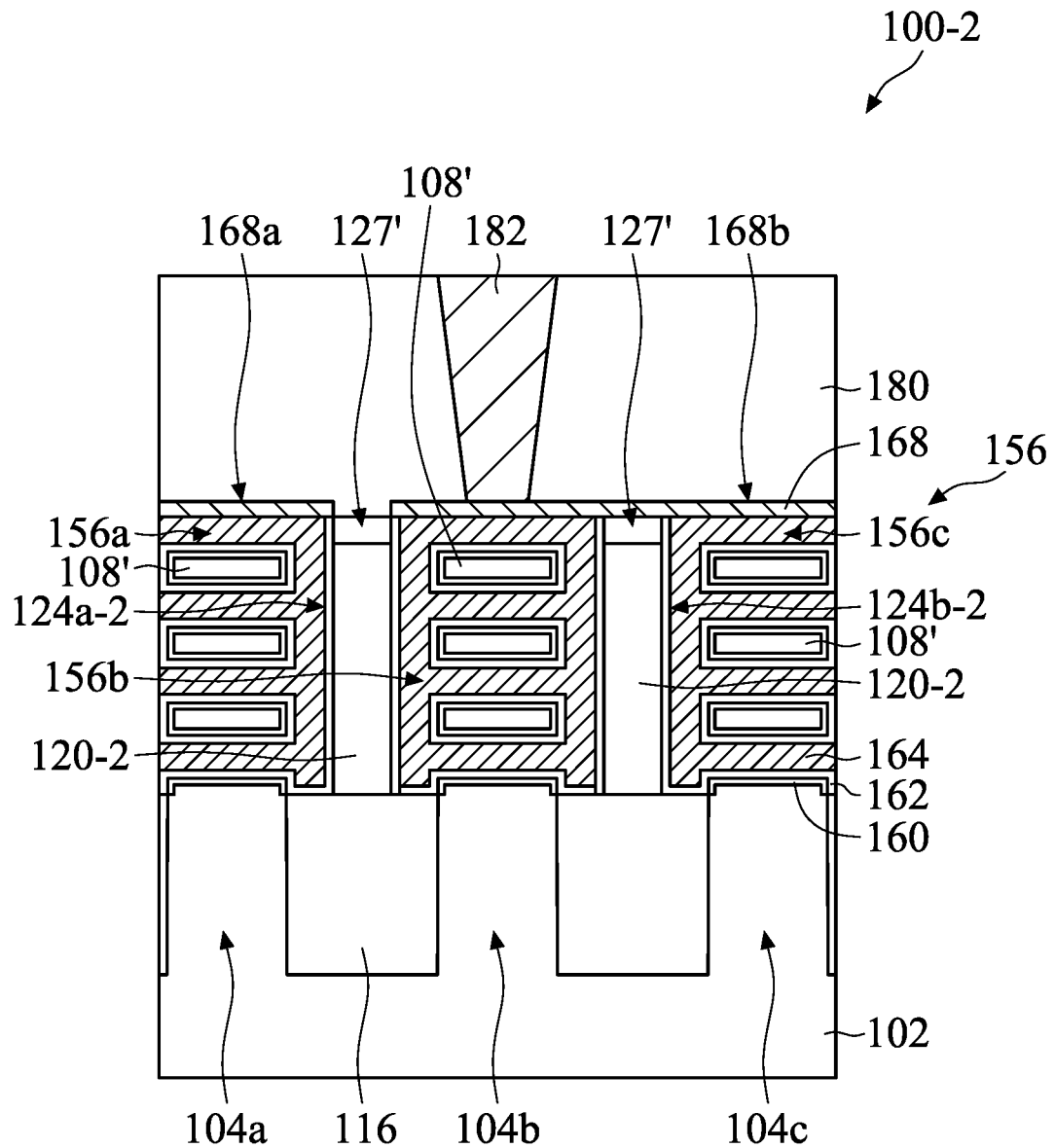
FIG. 5 illustrates a cross-sectional view of a semiconductor structure in accordance with some embodiments.

FIG. 5 illustrates a cross-sectional view of a semiconductor structure 100-2 in accordance with some embodiments. The semiconductor structure 100-2 may be similar to the semiconductor structures 100 and 100-1 shown in FIGS. 3 and 4B, except the bottom portions of the dielectric features in the semiconductor structure 100-2 are made of a single material in accordance with some embodiments. Materials and processes for manufacturing the semiconductor structure 100-2 may be similar to, or the same as, those for manufacturing the semiconductor structures 100 and 100-1 described above and are not repeated herein.

More specifically, the processes shown in FIGS. 2A to 2D are performed, and the spaces between the fin structures 104a, 104b, and 104c are completely filled with a dielectric layer 120-2 in accordance with some embodiments.

In some embodiments, the dielectric layer 120-2 is made of SiN, SiCN, SiOCN, SiON, or the like. In some embodiments, the dielectric liner 120-2 is made of a high-k dielectric material, such as $HfO_2$, $HfSiO_x$ (such as $HfSiO_4$), HfSiON, HfLaO, HfTaO, HfTiO, HfZrO, HfAlOx, ZrO2, $ZrSiO_2$, AlSiO, $Al_2O_3$, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. The dielectric layer 120-2 may be deposited using CVD, PVD, ALD, HDPCVD, MOCVD, RPCVD, PECVD, LPCVD, ALCVD, APCVD, other applicable methods, or combinations thereof.

After the dielectric layer 120-2 is polished until the top surfaces of the cladding layers (e.g. the cladding layer 118 shown in FIG. 2F) are exposed and processes shown in FIGS. 2G to 2W are performed to form the semiconductor structure 100-2, as shown in FIG. 5 in accordance with some embodiments. As shown in FIG. 5, the dielectric layers 120-2 form the bottom portions of the dielectric features 124a-1 and 124b-1, and the upper portions 126 are formed over the dielectric layers 120-1 in accordance with some embodiments.

Figure 6:
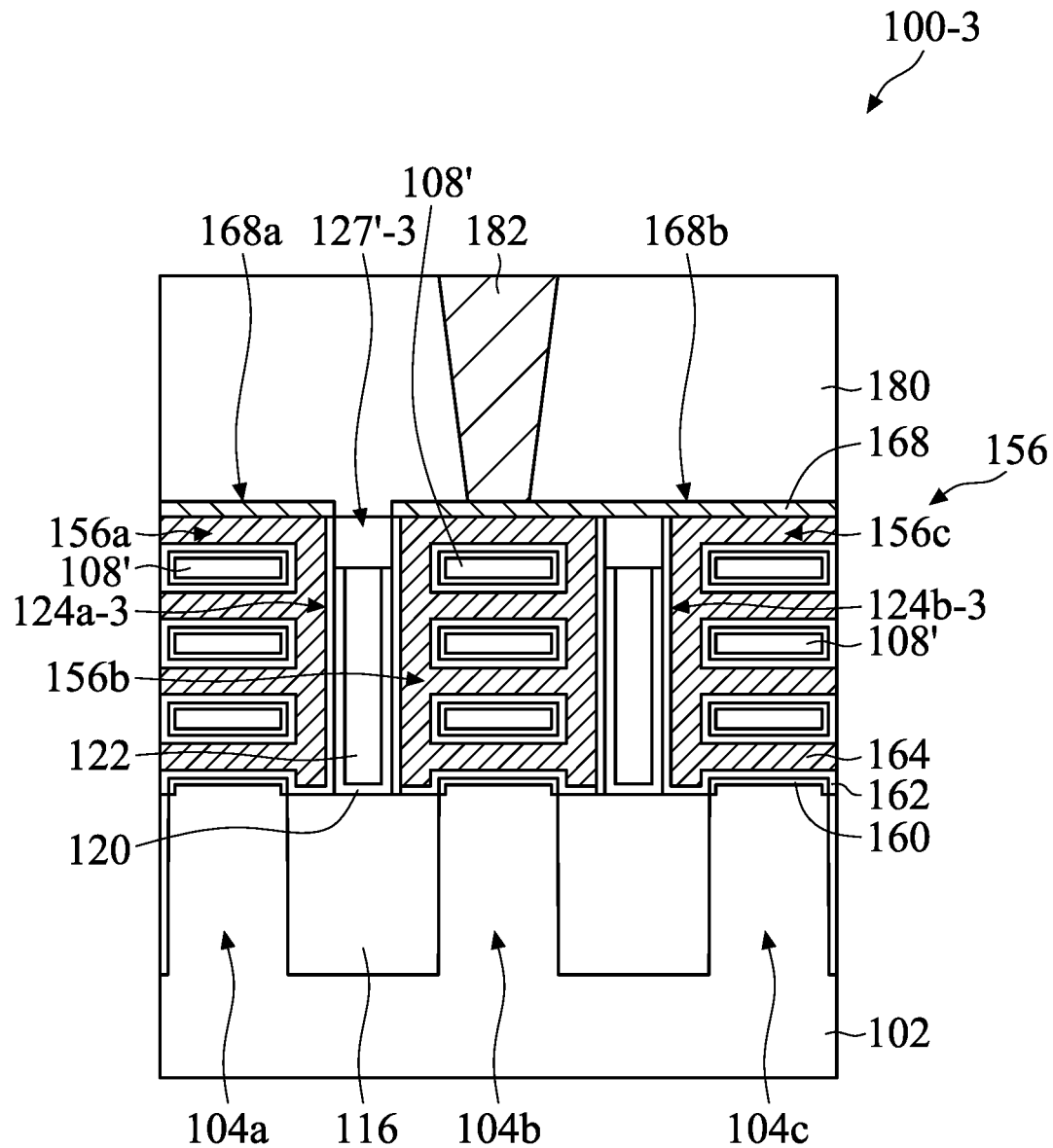
FIG. 6 illustrates a cross-sectional view of a semiconductor structure in accordance with some embodiments.

FIG. 6 illustrates a cross-sectional view of a semiconductor structure 100-3 in accordance with some embodiments. The semiconductor structure 100-3 may be similar to the semiconductor structures 100 and 100-1 shown in FIGS. 3 and 4B, except the interfaces between the upper portion and the bottom portion of the dielectric features are relatively low in accordance with some embodiments. Materials and processes for manufacturing the semiconductor structure 100-3 may be similar to, or the same as, those for manufacturing the semiconductor structures 100 and 100-1 described above and are not repeated herein.

More specifically, the processes shown in FIGS. 2A to 2F are performed, and the dielectric liner 120 and the dielectric fill layers 122 are recessed to form relatively deeper recesses over the bottom portions of dielectric features 124a-3 and 124b-3 in accordance with some embodiments. After the dielectric liner 120 and the dielectric fill layers 122 are recessed, the top surface of the bottom portion of the dielectric features 124a-3 and 124b-3 are slightly lower than the top surfaces of the topmost second semiconductor material layers (e.g. the second semiconductor material layers 108) in accordance with some embodiments. Next, the upper portion 126-3 of the dielectric features 124a-3 and 124b-3 are formed, and processes shown in FIGS. 2H to 2W are performed to form the semiconductor structure 100-3 in accordance with some embodiments.

As shown in FIG. 6, the interfaces between the upper portions 126-3, including the recessed portions 127'-3, and the bottom portions of the dielectric features 124a-3 and 124b-3 are lower than the top surfaces of the topmost nanostructures 108' at the channel region in accordance with some embodiments. In some embodiments, the interfaces between the upper portions 126-3 and the bottom portions of the dielectric features 124a-3 and 124b-3 are higher than the bottom surfaces of the topmost nanostructures 108' at the channel region.

Figure 7:
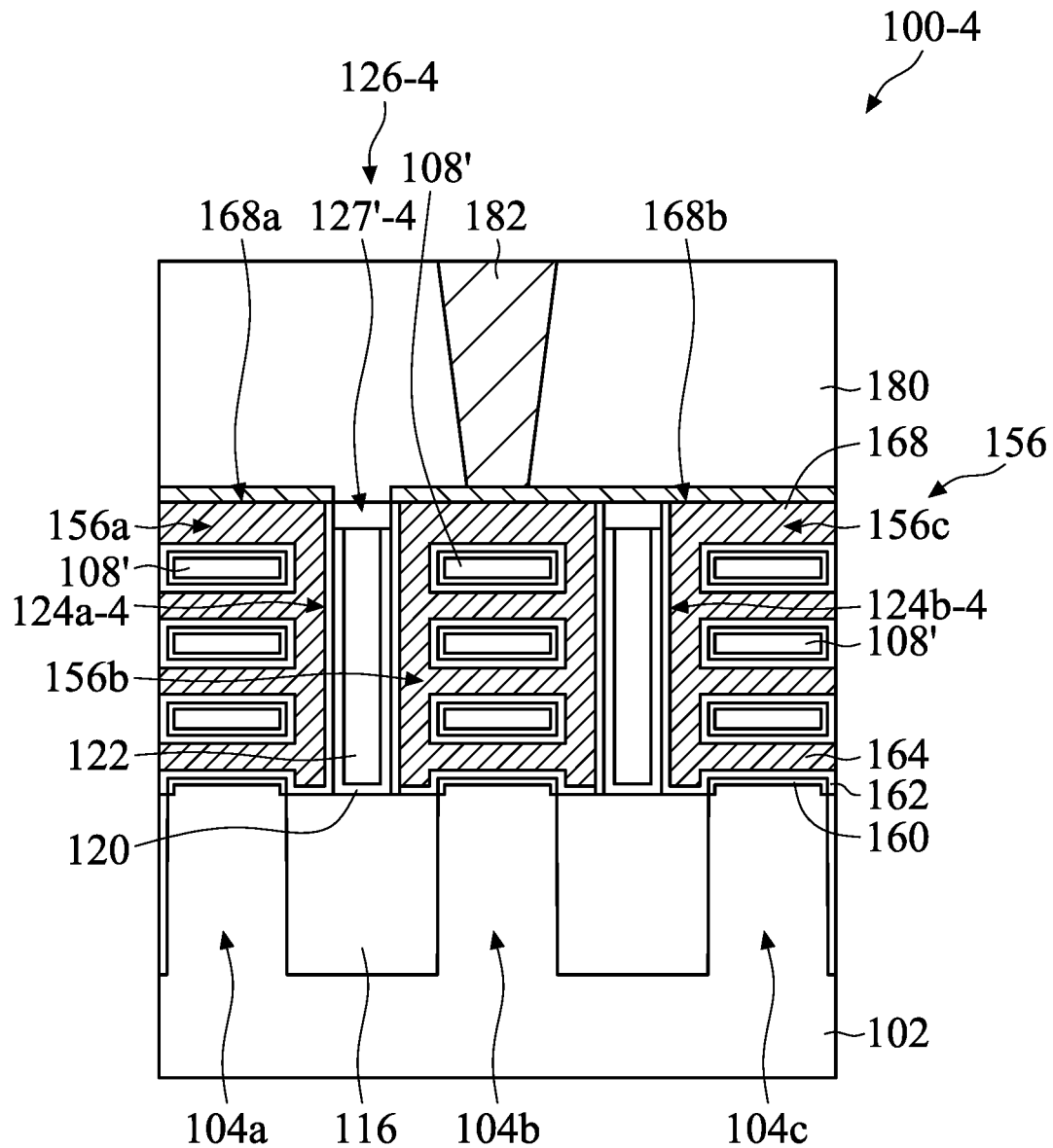
FIG. 7 illustrates a cross-sectional view of a semiconductor structure in accordance with some embodiments.

FIG. 7 illustrates a cross-sectional view of a semiconductor structure 100-4 in accordance with some embodiments. The semiconductor structure 100-4 may be similar to the semiconductor structures 100 and 100-1 shown in FIGS. 3 and 4B, except the interfaces between the upper portion and the bottom portion of the dielectric features are relatively high in accordance with some embodiments. Materials and processes for manufacturing the semiconductor structure 100-4 may be similar to, or the same as, those for manufacturing the semiconductor structures 100 and 100-1 described above and are not repeated herein.

More specifically, the processes shown in FIGS. 2A to 2F are performed, and the dielectric liner 120 and the dielectric fill layers 122 are recessed to form relatively shallower recesses over the bottom portions of dielectric features 124a-4 and 124b-4 in accordance with some embodiments. Afterwards, the upper portion 126-4 of the dielectric features 124a-4 and 124b-4 are formed, and the processes shown in FIGS. 2H to 2W are performed to form the semiconductor structure 100-4, as shown in FIG. 7 in accordance with some embodiments. As shown in FIG. 7, the interfaces between the upper portions 126-4, including the recessed portions 127'-4, and the bottom portions of the dielectric features 124a-4 and 124b-4 are higher than the top surfaces of the topmost nanostructures 108' at the channel region in accordance with some embodiments.

Figure 8A:
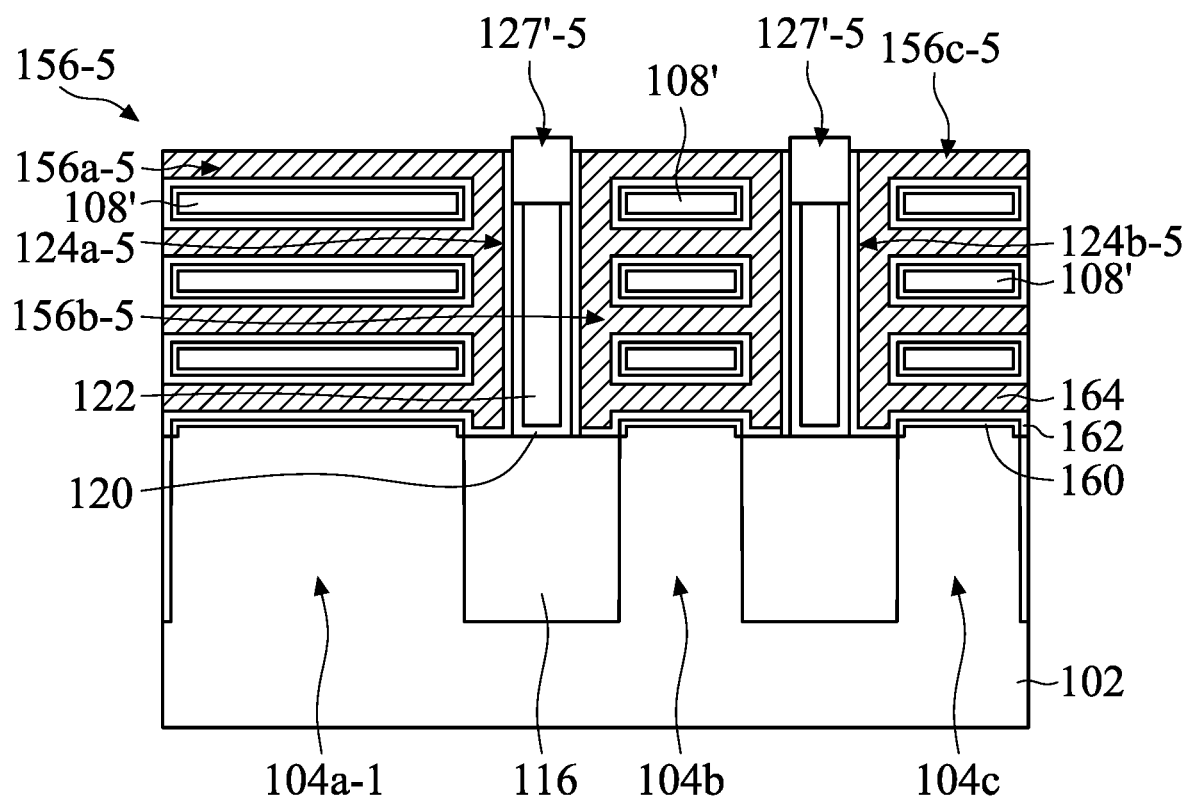
FIGS. 8A and 8B illustrate cross-sectional views of intermediate stages of manufacturing the semiconductor structure in accordance with some embodiments.
Figure 8B:
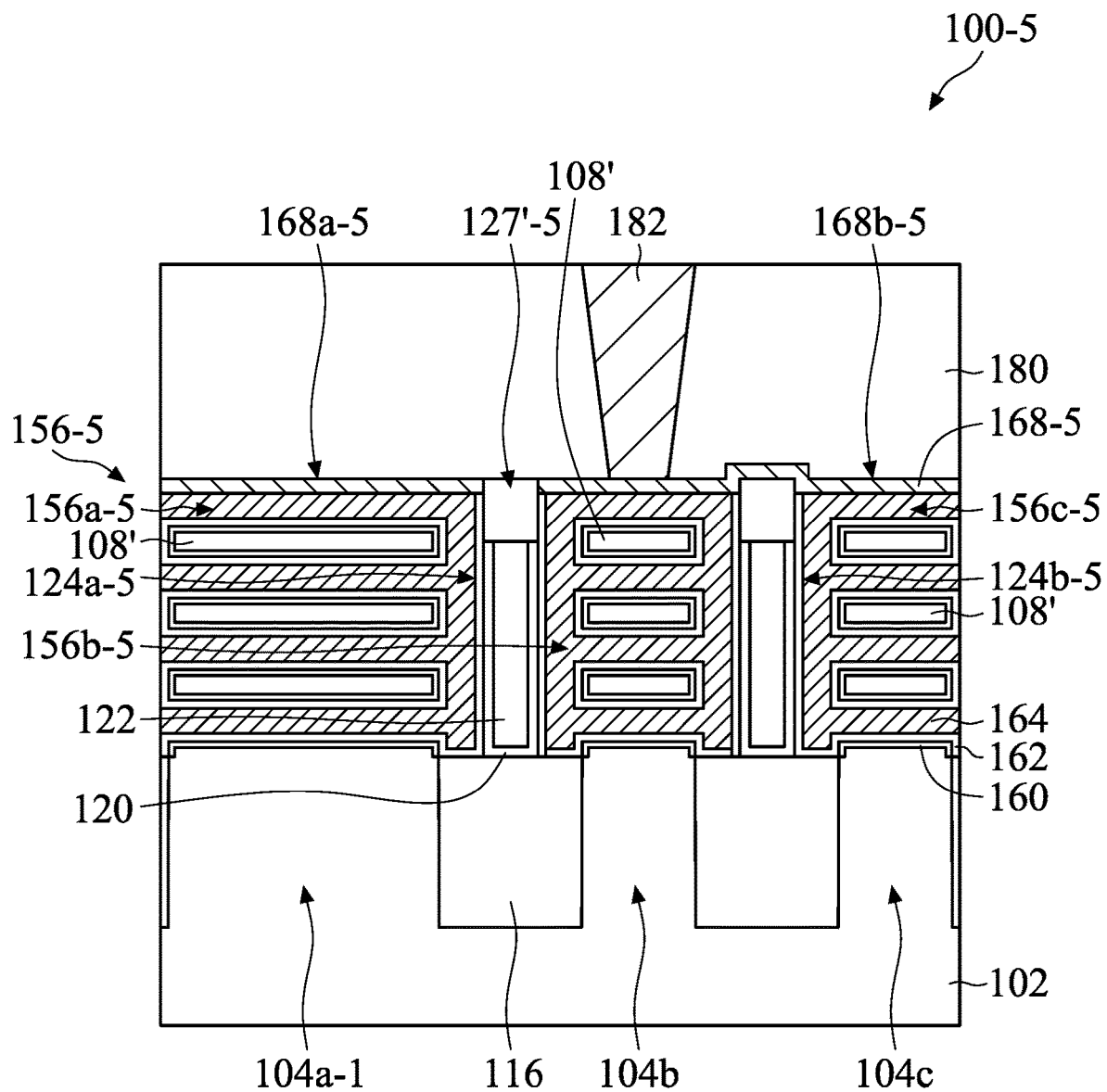

FIGS. 8A and 8B illustrate cross-sectional views of intermediate stages of manufacturing a semiconductor structure 100-5 in accordance with some embodiments. The semiconductor structure 100-5 may be similar to the semiconductor structures 100 and 100-1 shown in FIGS. 3 and 4B, except the dielectric features in the semiconductor structure 100-5 at the channel region are higher than the gate structure in accordance with some embodiments. Materials and processes for manufacturing the semiconductor structure 100-5 may be similar to, or the same as, those for manufacturing the semiconductor structures 100 and 100-1 described above and are not repeated herein.

More specifically, the processes shown in FIGS. 2A to 2O are performed, and an etch back process is performed to remove the upper portions of a gate structure 156-5 and the upper portions of the dielectric features 124a-5 and 124b-5 at the channel region, as shown in FIG. 8A in accordance with some embodiments. In some embodiments, the etching rate of the gate structure 156-5 and the dielectric features 124a-5 and 124b-5 during the etching back process are different, and therefore the top surface of the gate structure 156-5 and the dielectric features 124a-5 and 124b-5 are not level. In some embodiments, the top surface of the gate structure 156-5 is lower than the top surfaces of the recessed portions 127'-5 of the dielectric features 124a-5 and 124b-5. In some embodiments, the height difference between the top surface of the gate structure 156-5 and the top surfaces of the recessed portions 127'-5 of the dielectric features 124a-5 and 124b-5 at the channel region is smaller than 2 nm, so that the metal layer formed afterwards can still connect the portion 156b-5 and 156c-5 of the gate structure 156-5 properly.

Afterwards, the processes shown in FIGS. 2Q to 2W are performed to form the semiconductor structure 100-5, as shown in FIG. 8B in accordance with some embodiments.

Since the top surface of the gate structure 156-5 and the dielectric features 124a-5 and 124b-5 are not level, a metal layer 168-5 formed over them is not flat in accordance with some embodiments. In some embodiments, the metal layer 168-5 has a portion 168a-5 and a portion 168b-5, and the portion 168b-5 has a protruding portion. In some embodiments, the topmost portion of the portion 168b-5 is higher than the topmost portion of the portion 168a-5. The processes and materials for forming the gate structure 156-5, the dielectric features 124a-5 and 124b-5, and the metal layer 168-5 may be the same as those for forming the gate structure 156, the dielectric features 124a and 124b, and the metal layer 168 and therefore are not repeated herein.

Figure 9A:
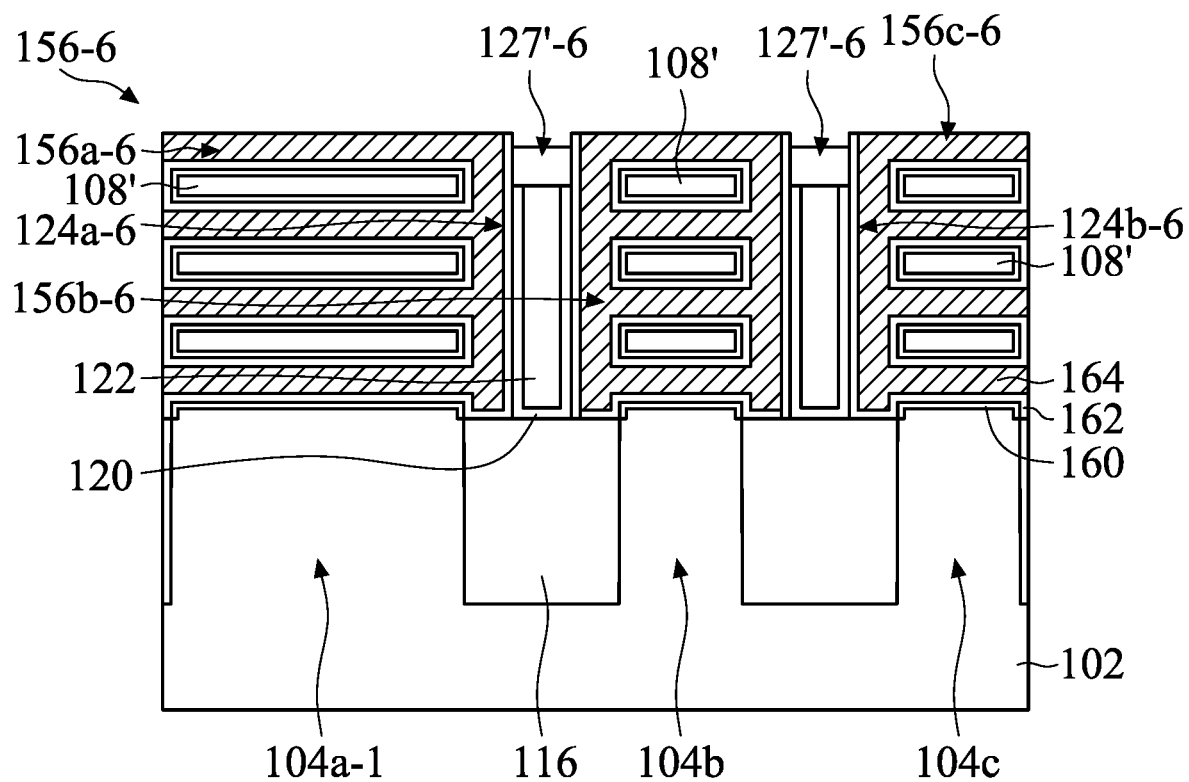
FIGS. 9A and 9B illustrate cross-sectional views of intermediate stages of manufacturing the semiconductor structure in accordance with some embodiments.
Figure 9B:
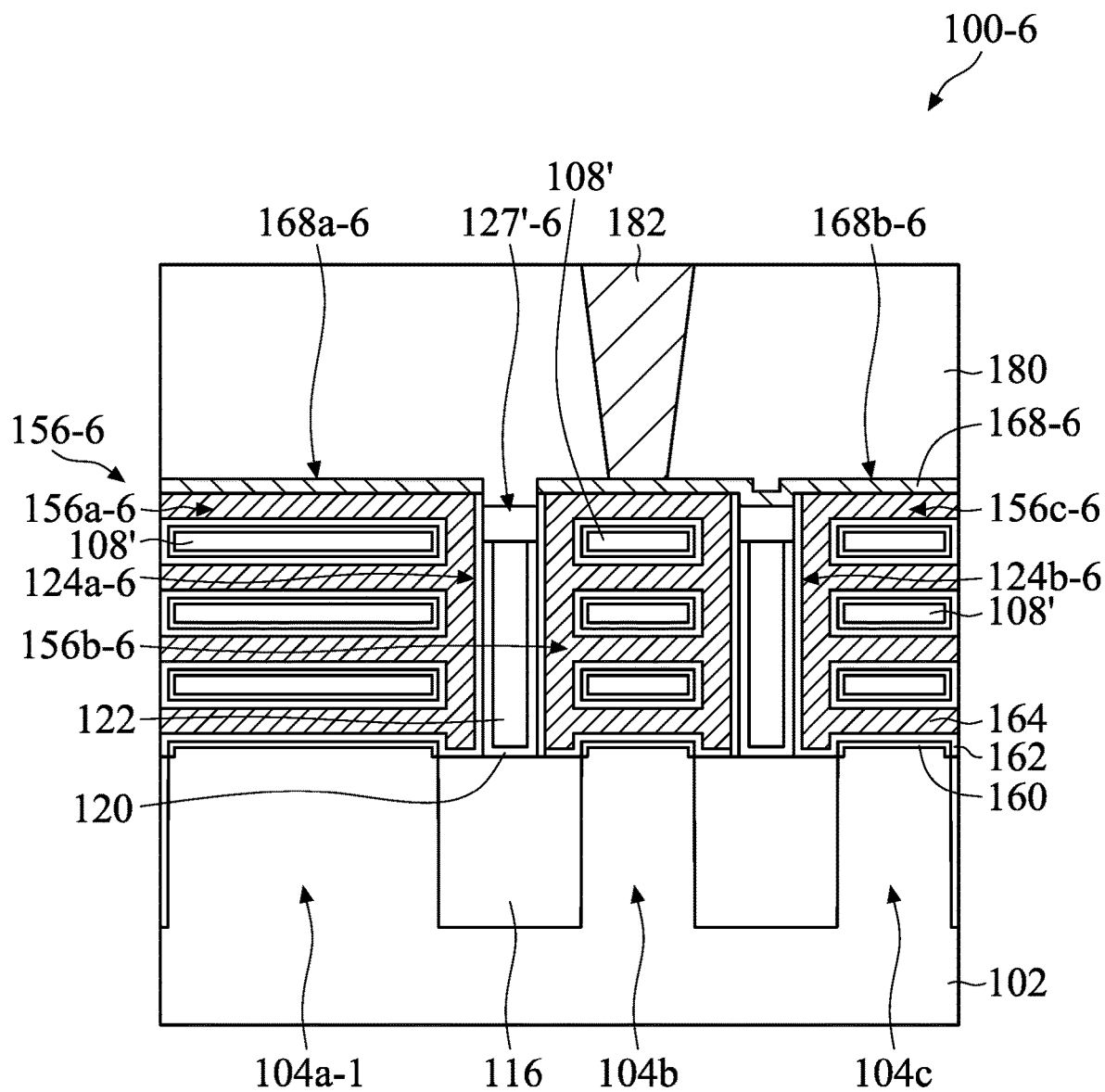

FIGS. 9A and 9B illustrate cross-sectional views of intermediate stages of manufacturing a semiconductor structure 100-6 in accordance with some embodiments. The semiconductor structure 100-6 may be similar to the semiconductor structures 100 and 100-1 shown in FIGS. 3 and 4B, except the dielectric features in the semiconductor structure 100-6 are lower than the gate structure in accordance with some embodiments. Materials and processes for manufacturing the semiconductor structure 100-6 may be similar to, or the same as, those for manufacturing the semiconductor structures 100 and 100-1 described above and are not repeated herein.

More specifically, the processes shown in FIGS. 2A to 2O are performed, and an etch back process is performed to remove the upper portions of a gate structure 156-6 and the upper portions of the dielectric features 124a-6 and 124b-6 at the channel region, as shown in FIG. 9A in accordance with some embodiments. In some embodiments, the etching rate of the gate structure 156-6 and the dielectric features 124a-6 and 124b-6 during the etching back process are different, and therefore the top surface of the gate structure 156-6 and the dielectric features 124a-6 and 124b-6 are not level. In some embodiments, the top surface of the gate structure 156-6 is higher than the top surfaces of the recessed portions 127'-6 of the dielectric features 124a-6 and 124b-6. In some embodiments, the height difference between the top surface of the gate structure 156-6 and the top surfaces of the recessed portions 127'-6 of the dielectric features 124a-6 and 124b-6 is smaller than 2 nm, so that the metal layer formed afterwards can still connect the portion 156b-6 and 156c-6 of the gate structure 156-6 properly.

Afterwards, the processes shown in FIGS. 2Q to 2W are performed to form the semiconductor structure 100-6, as shown in FIG. 9B in accordance with some embodiments. Since the top surface of the gate structure 156-6 and the dielectric features 124a-6 and 124b-6 are not level, a metal layer 168-6 formed over them is not flat in accordance with some embodiments. In some embodiments, the metal layer 168-6 has a portion 168a-6 and a portion 168b-6, and the portion 168b-6 has a recessed portion. In some embodiments, the bottommost portion of the portion 168b-6 is lower than the bottommost portion of the portion 168a-6. The processes and materials for forming the gate structure 156-6, the dielectric features 124a-6 and 124b-6, and the metal layer 168-6 may be the same as those for forming the gate structure 156, the dielectric features 124a and 124b, and the metal layer 168 and therefore are not repeated herein.

Figure 10A:
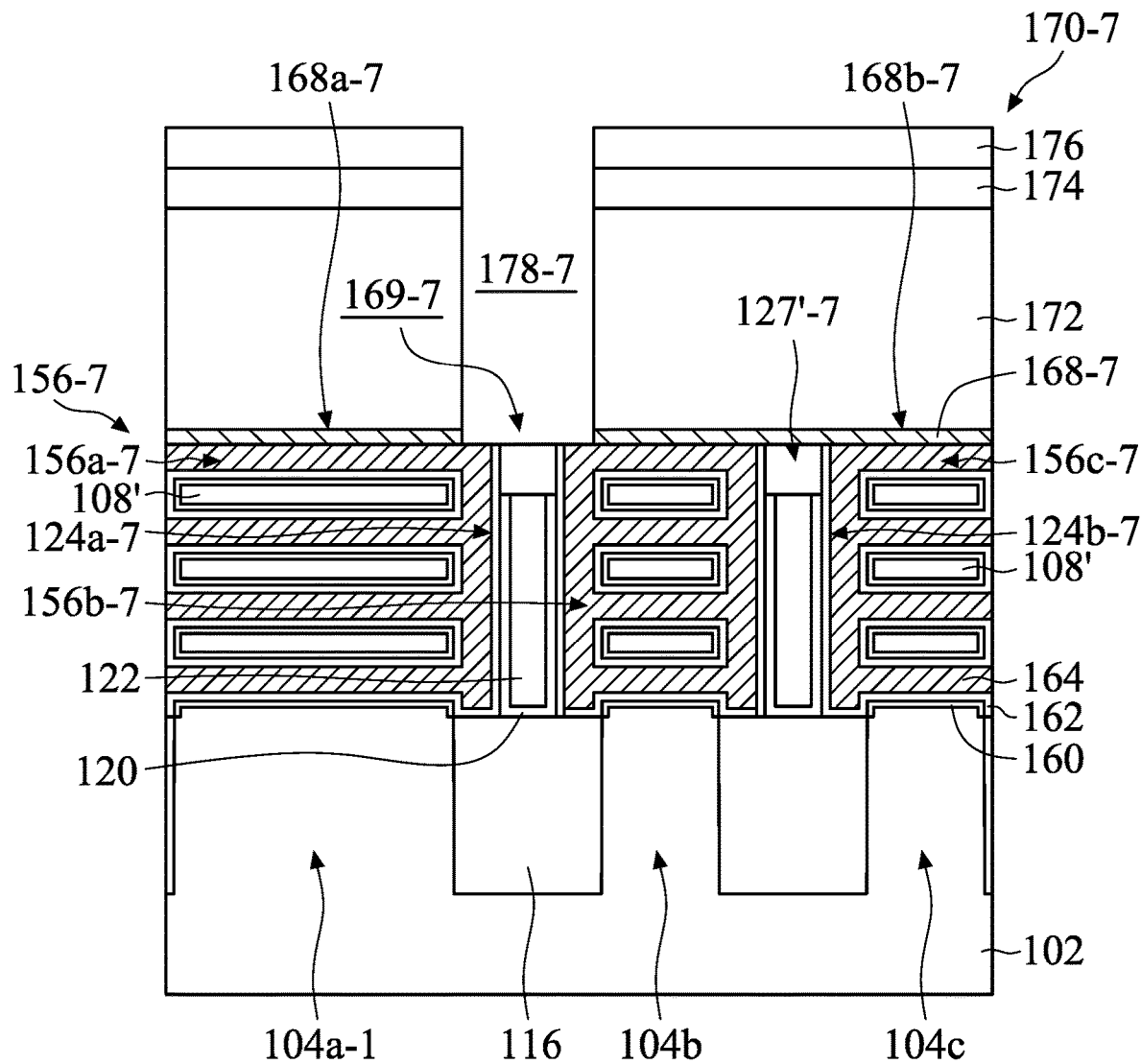
FIGS. 10A and 10B illustrate cross-sectional views of intermediate stages of manufacturing the semiconductor structure in accordance with some embodiments.
Figure 10B:
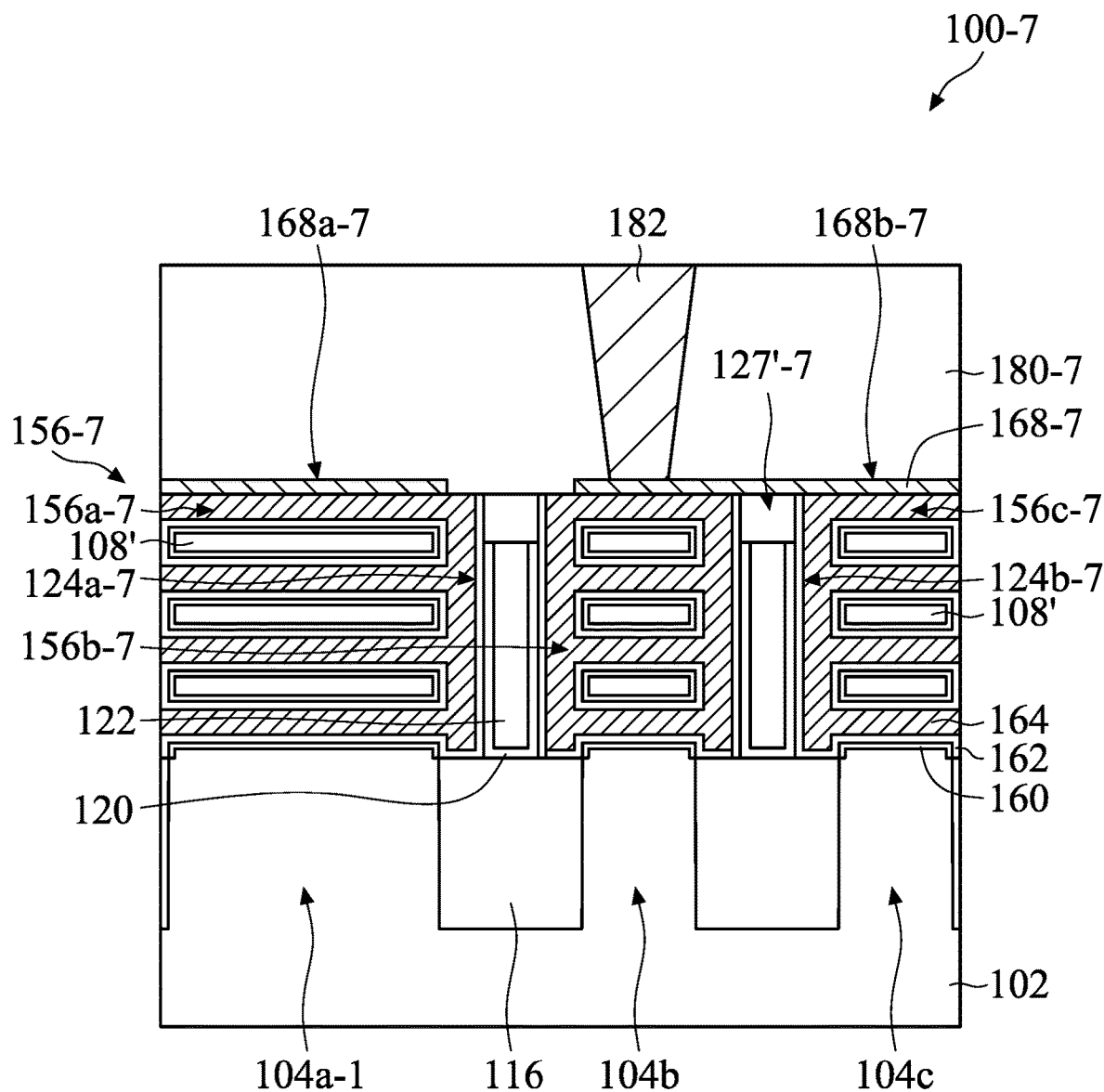

FIGS. 10A and 10B illustrate cross-sectional views of intermediate stages of manufacturing a semiconductor structure 100-7 in accordance with some embodiments. The semiconductor structure 100-7 may be similar to the semiconductor structures 100 and 100-1 shown in FIGS. 3 and 4B, except the opening in the metal layer is wider than the dielectric features in accordance with some embodiments. Materials and processes for manufacturing the semiconductor structure 100-7 may be similar to, or the same as, those for manufacturing the semiconductor structures 100 and 100-1 described above and are not repeated herein.

More specifically, the processes shown in FIGS. 2A to 2S are performed, and a metal layer 168-7 is patterned through the opening 178-7 of the photoresist structure 170-7, as shown in FIG. 10A in accordance with some embodiments. In some embodiments, the opening 178-7 of the photoresist structure 170-7 is wider than the dielectric feature 124a. Accordingly, the opening 169-7 of the metal layer 168-7 is also wider than the dielectric features 124a, such that the portions 156a-7 and 156b-7 of the gate structure 156-7 are also partially exposed by the opening 169-7 of the metal layer 168-7 in accordance with some embodiments. In some embodiments, the edge of the opening 169-7 of the metal layer 168-7 is misaligned with the edge of the dielectric feature 124a-7.

Afterwards, the processes shown in FIGS. 2U to 2W are performed to form the semiconductor structure 100-7, as shown in FIG. 10B in accordance with some embodiments. Since the portions 156a-7 and 156b-7 are exposed by the opening 169-7, a dielectric layer 180-7 formed afterwards is in direct contact with the portions 156a-7 and 156b-7 of the gate structure 156-7. Although some portions of the gate structure 156-7 are not covered by the metal layer 168-7, the nanostructures 108' are all vertically covered by (e.g. vertically overlapped) the metal layer 168-7 in accordance with some embodiments. The processes and materials for forming the gate structure 156-7, the metal layer 168-7, and the dielectric layer 180-7 may be the same as those for forming the gate structure 156, the metal layer 168, and the dielectric layer 180 and therefore are not repeated herein.

Figure 11A:
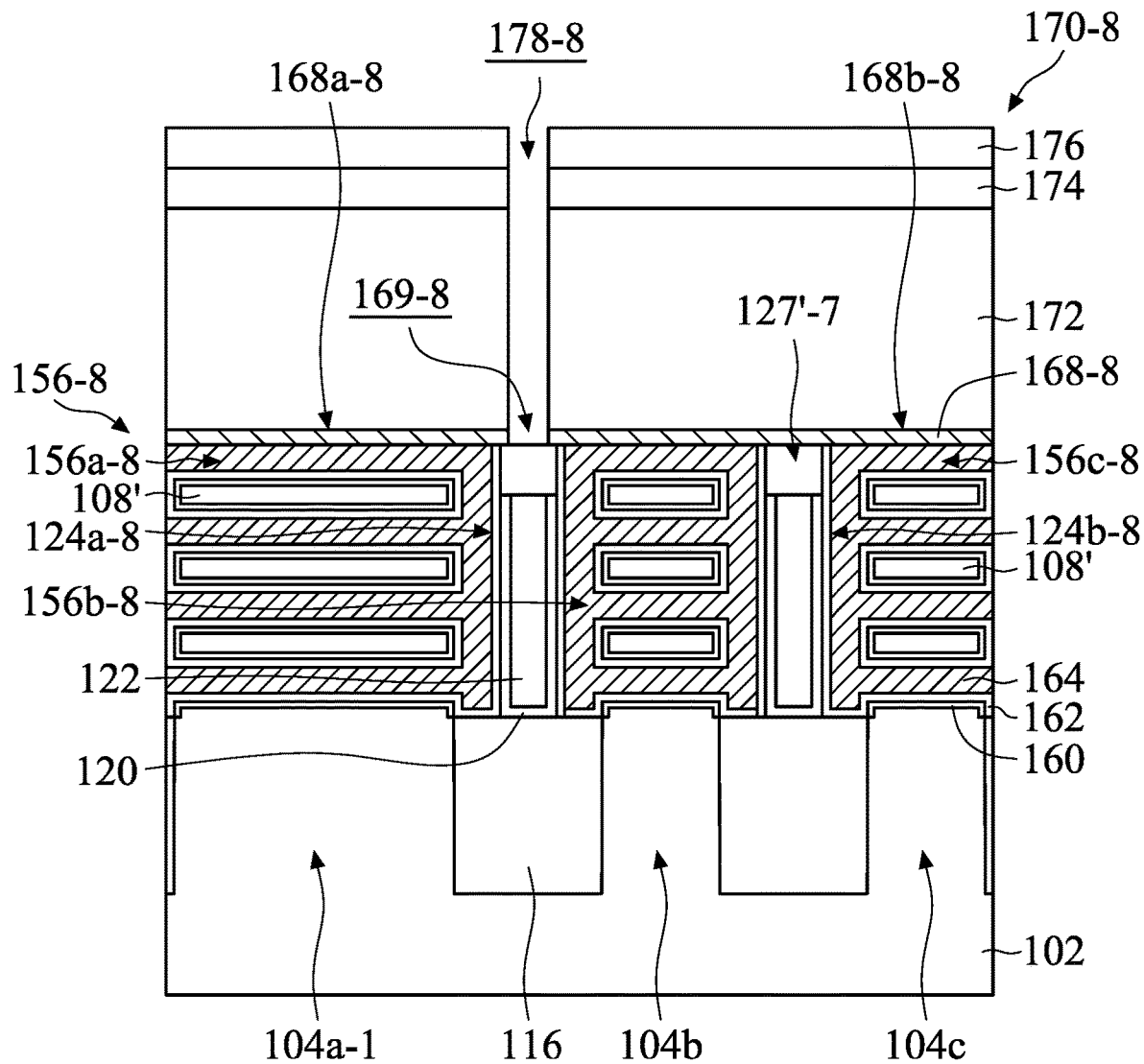
FIGS. 11A and 11B illustrate cross-sectional views of intermediate stages of manufacturing the semiconductor structure in accordance with some embodiments.
Figure 11B:
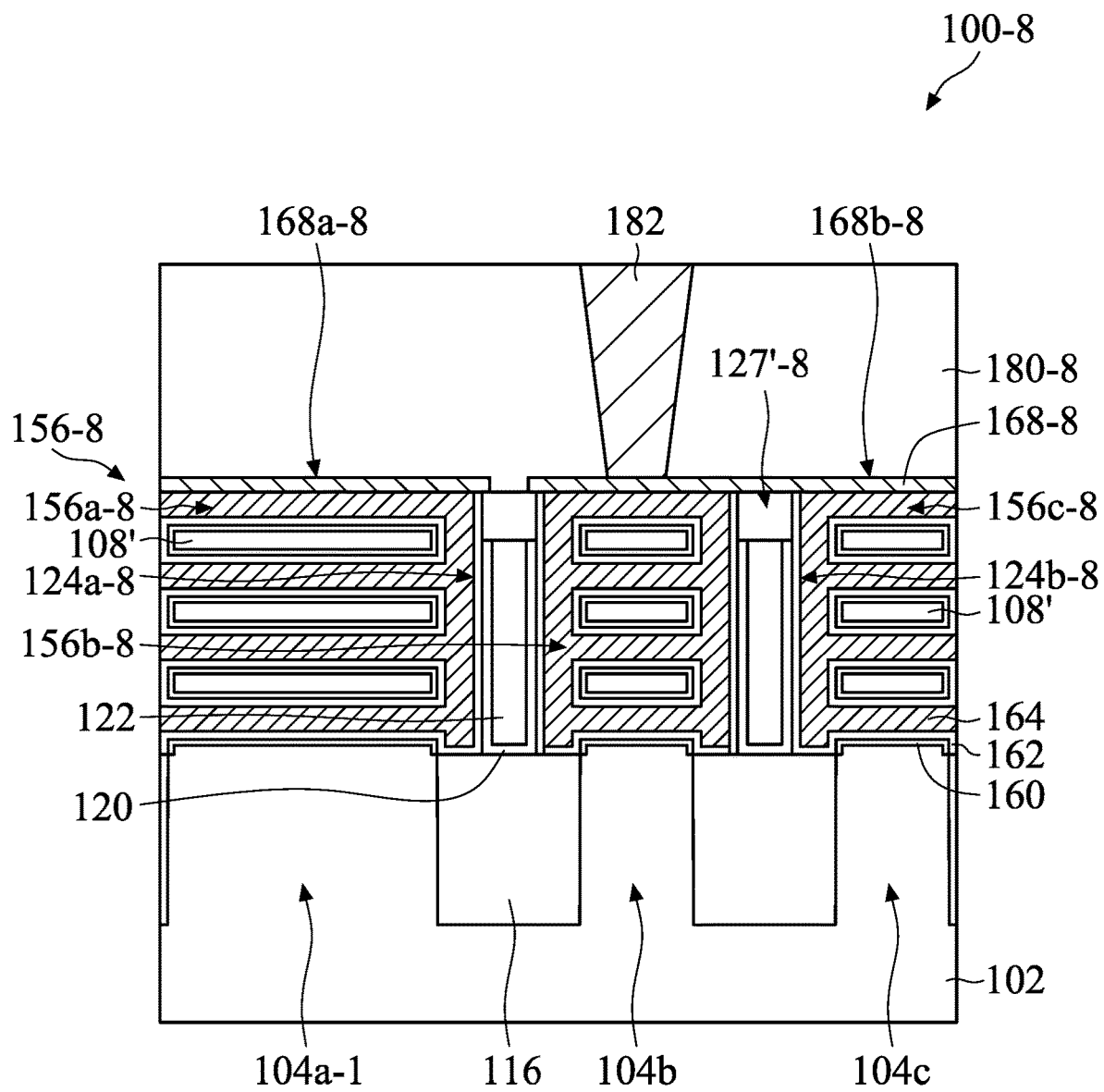

FIGS. 11A and 11B illustrate cross-sectional views of intermediate stages of manufacturing a semiconductor structure 100-8 in accordance with some embodiments. The semiconductor structure 100-8 may be similar to the semiconductor structures 100 and 100-1 shown in FIGS. 3 and 4B, except the opening in the metal layer is narrower than the dielectric features in accordance with some embodiments. Materials and processes for manufacturing the semiconductor structure 100-8 may be similar to, or the same as, those for manufacturing the semiconductor structures 100 and 100-1 described above and are not repeated herein.

More specifically, the processes shown in FIGS. 2A to 2S are performed, and a metal layer 168-8 is patterned through the opening 178-8 of the photoresist structure 170-8, as shown in FIG. 11A in accordance with some embodiments. In some embodiments, the opening 178-8 of the photoresist structure 170-8 is narrower than the dielectric features 124a-8. Accordingly, the opening 169-8 of the metal layer 168-8 is narrower than the dielectric feature 124a-8, such that the dielectric feature 124a-8 is partially exposed by the opening 169-8 and is partially covered by the metal layer 168-8 in accordance with some embodiments.

Afterwards, the processes shown in FIGS. 2U to 2W are performed to form the semiconductor structure 100-8, as shown in FIG. 11B in accordance with some embodiments. In some embodiments, the dielectric feature 124a-8 is partially covered by a dielectric layer 180-8 and is partially covered by the metal layer 168-8. The processes and materials for forming the dielectric feature 124a-8, the metal layer 168-8, and the dielectric layer 180-8 may be the same as those for forming the dielectric feature 124a, the metal layer 168, and the dielectric layer 180 and therefore are not repeated herein.

Figure 12A:
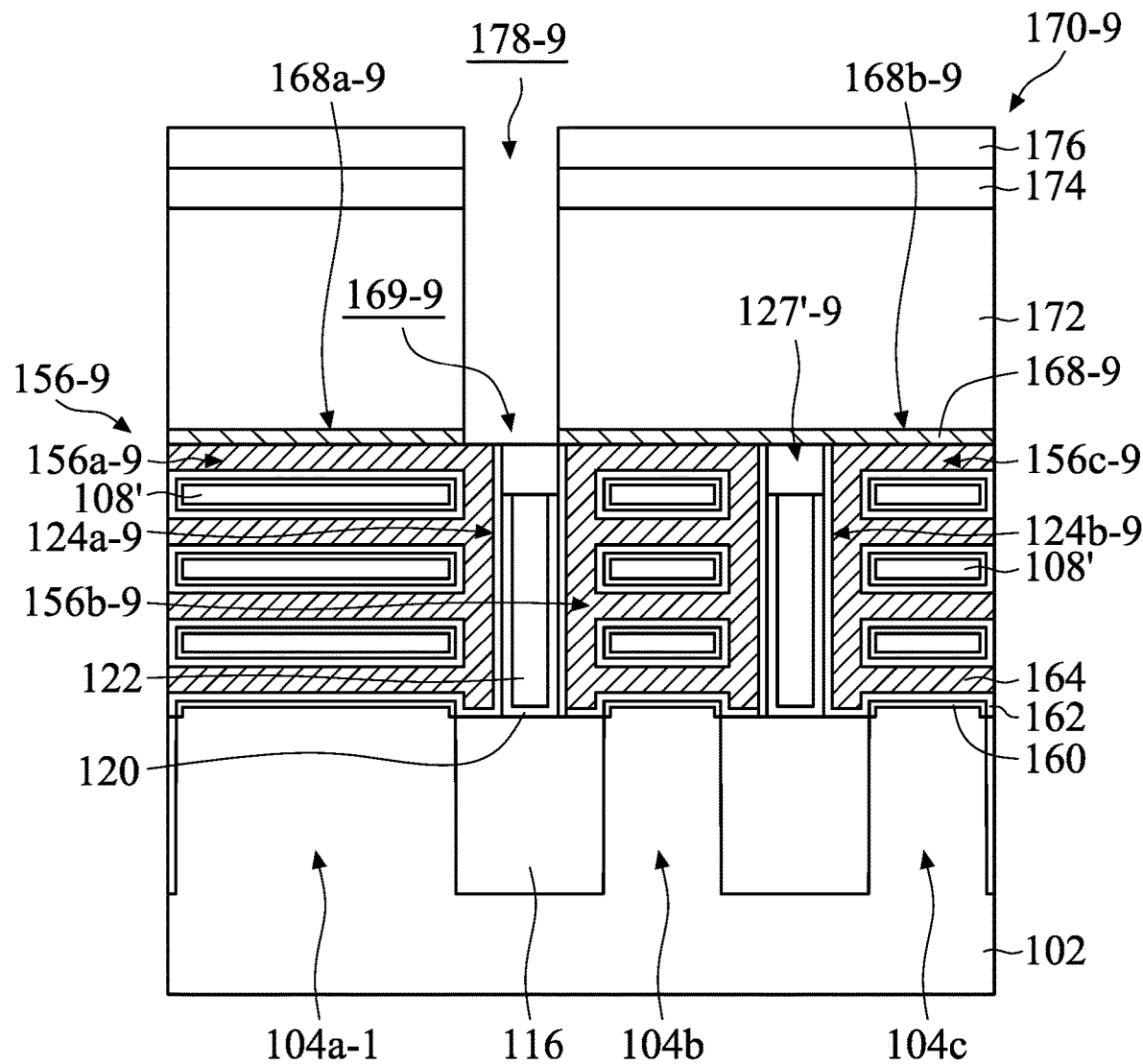
FIGS. 12A and 12B illustrate cross-sectional views of intermediate stages of manufacturing the semiconductor structure in accordance with some embodiments.
Figure 12B:
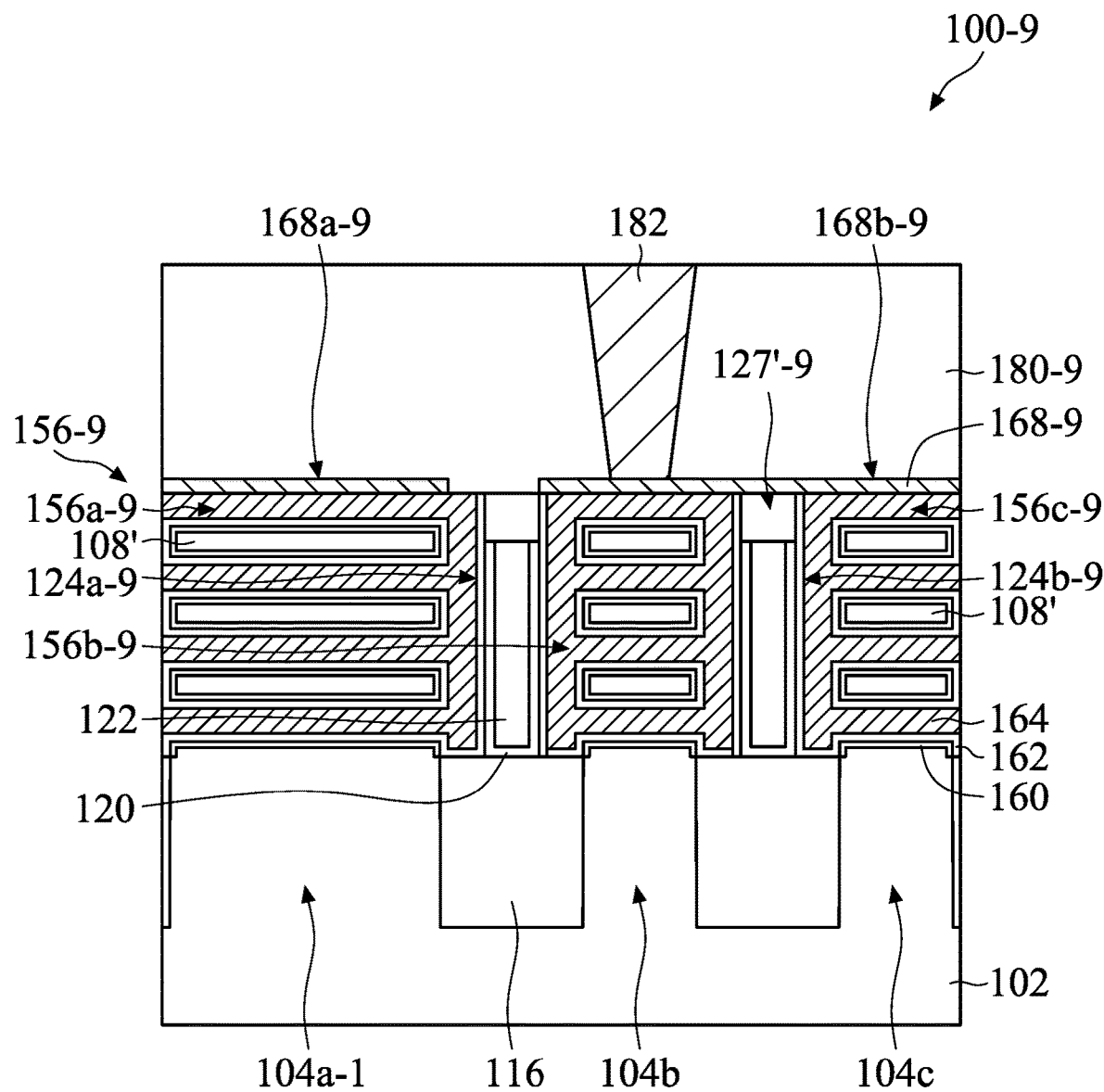

FIGS. 12A and 12B illustrate cross-sectional views of intermediate stages of manufacturing a semiconductor structure 100-9 in accordance with some embodiments. The semiconductor structure 100-9 may be similar to the semiconductor structures 100 and 100-1 shown in FIGS. 3 and 4B, except the opening in the metal layer is not aligned with the dielectric features in accordance with some embodiments. Materials and processes for manufacturing the semiconductor structure 100-9 may be similar to, or the same as, those for manufacturing the semiconductor structures 100 and 100-1 described above and are not repeated herein.

More specifically, the processes shown in FIGS. 2A to 2S are performed, and a metal layer 168-9 is patterned through the opening 178-9 of the photoresist structure 170-9, as shown in FIG. 12A in accordance with some embodiments. In some embodiments, the opening 178-9 of the photoresist structure 170-7 is not completely aligned with the dielectric feature 124a. Accordingly, the opening 169-9 of the metal layer 168-9 is not completely aligned with the dielectric features 124a, such that the portion 156a-9 of the gate structure 156-9 is also partially exposed by the opening 169-9 in accordance with some embodiments. In some embodiments, an edge of the portion 168b-9 of the metal layer 168-9 is substantially aligned with a first sidewall of the dielectric feature 124a, and an edge of the portion 168a-9 of the metal layer 168-9 is not aligned with a second sidewall, opposite to the first sidewall, of the dielectric feature 124a.

Afterwards, the processes shown in FIGS. 2U to 2W are performed to form the semiconductor structure 100-9, as shown in FIG. 12B in accordance with some embodiments. Since the portions 156a-9 is exposed by the opening 169-9, a dielectric layer 180-9 formed afterwards is in direct contact with the portions 156a-9 of the gate structure 156-9. Although some portions of the gate structure 156-9 are not covered by the metal layer 168-9, the nanostructures 108' are all vertically covered by (e.g. vertically overlapped) the metal layer 168-9 in so. The processes and materials for forming the gate structure 156-9 including the portions 156a-9, 156b-9, and 156c-9, the metal layer 168-9 including the portion 168a-9 and 168b-9, and the dielectric layer 180-9 may be the same as those for forming the gate structure 156 including the portions 156a, 156b, and 156c, the metal layer 168 including the portion 168a and 168b, and the dielectric layer 180 and therefore are not repeated herein.

Figure 13A:
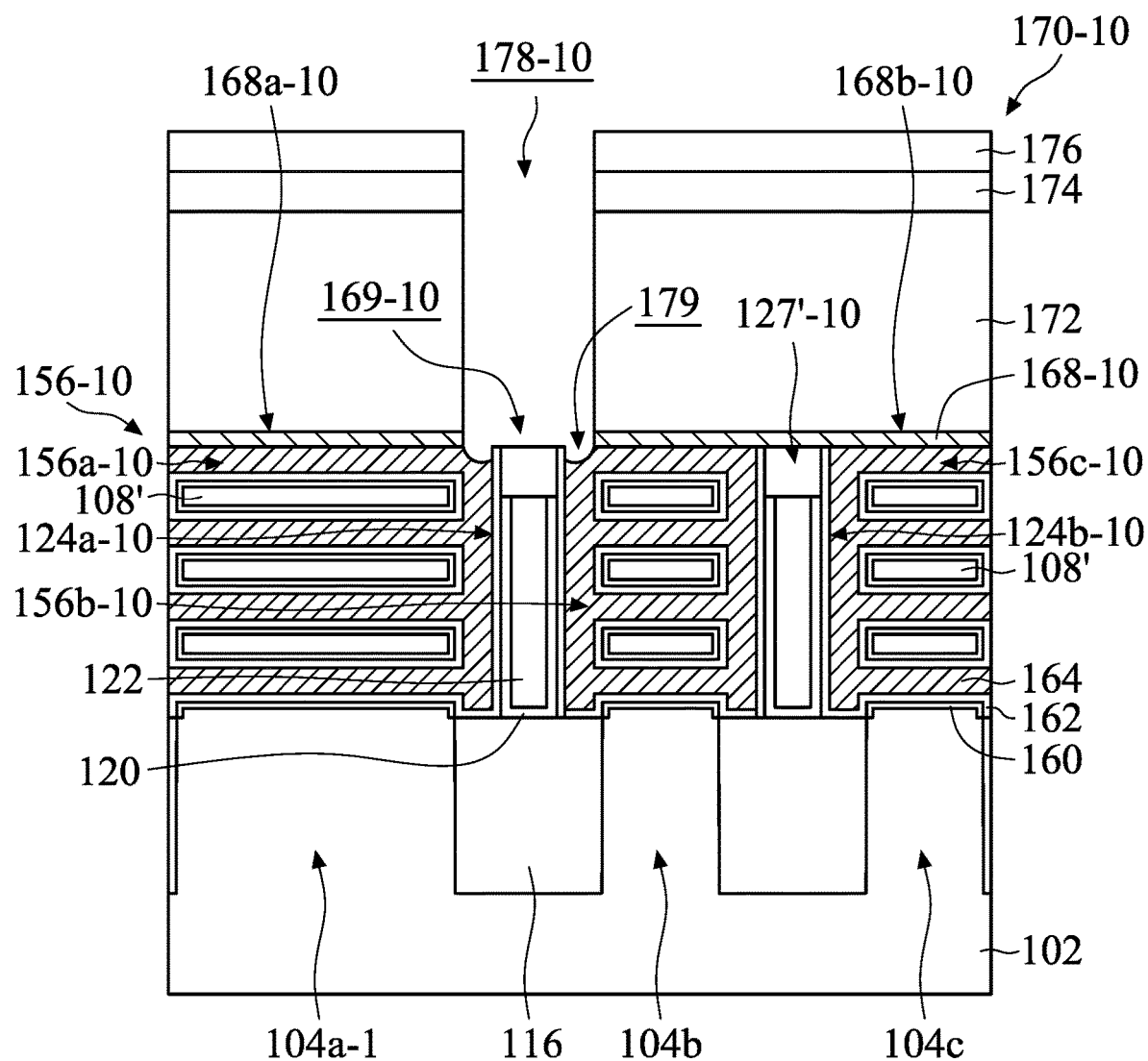
FIGS. 13A and 13B illustrate cross-sectional views of intermediate stages of manufacturing the semiconductor structure in accordance with some embodiments.
Figure 13B:
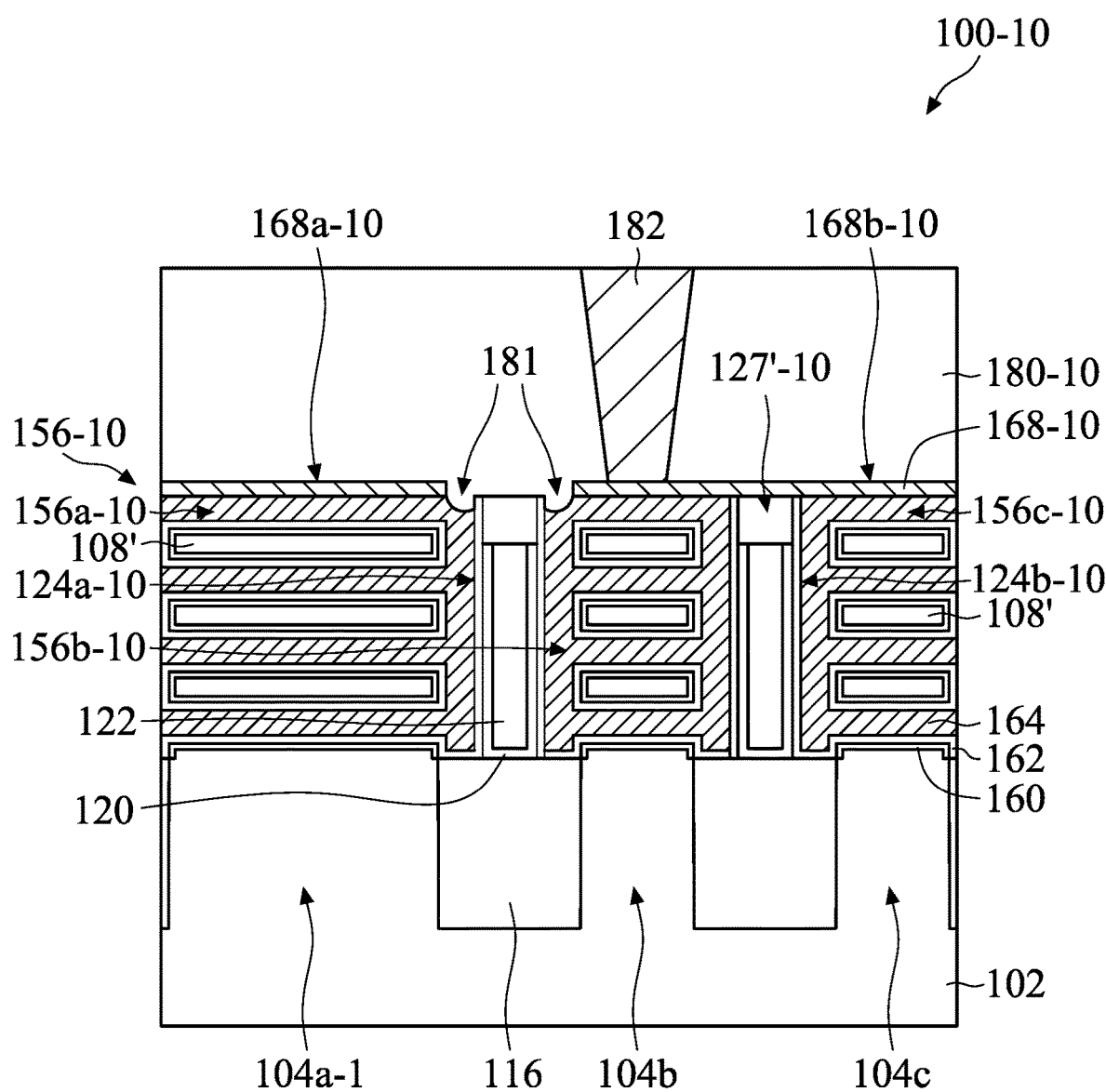

FIGS. 13A and 13B illustrate cross-sectional views of intermediate stages of manufacturing a semiconductor structure 100-10 in accordance with some embodiments. The semiconductor structure 100-10 may be similar to the semiconductor structures 100 and 100-1 shown in FIGS. 3 and 4B, except the opening in the metal layer is wider than the dielectric features and a dielectric layer extends into the gate structure in accordance with some embodiments. Materials and processes for manufacturing the semiconductor structure 100-10 may be similar to, or the same as, those for manufacturing the semiconductor structures 100 and 100-1 described above and are not repeated herein.

More specifically, the processes shown in FIGS. 2A to 2S are performed, and a metal layer 168-10 is patterned through the opening 178-10 of the photoresist structure 170-10, as shown in FIG. 13A in accordance with some embodiments. In some embodiments, the opening 178-10 of the photoresist structure 170-10 is wider than the recessed portion 127'-10 of the dielectric feature 124a-10. Accordingly, the opening 169-10 of the metal layer 168-10 is wider than the dielectric features 124a-10, such that the portions 156a-10 and 156b-10 of the gate structure 156-10 are partially exposed by the opening 169-10 in accordance with some embodiments. In addition, the portions 156a-10 and 156b-10 of the gate structure 156-10 are also partially etched when the metal layer 168-10 is patterned, so that the opening 178-10 has extending portions 179 extending into the portions 156a-10 and 156b-10 of the gate structure 156-10 in accordance with some embodiments. In some embodiments, the dielectric feature 124a-10 is also slightly etched and removed when patterning the metal layer 168-10.

In some embodiments, the upper portions of the sidewalls of the dielectric features 124a-10 are exposed by the extending portions 179 of the opening 178-10. In some embodiments, the depth of the extending portion 179 is smaller than about 2 nm, so that the nanostructures 108' will not be damaged by the etching process.

Afterwards, the processes shown in FIGS. 2U to 2W are performed to form the semiconductor structure 100-10, as shown in FIG. 13B in accordance with some embodiments. A dielectric layer 180-10 is formed over the metal layer 168-10 and is in direct contact with the portions 156a-10 and 156b-10 of the gate structure 156-10. In addition, the dielectric layer 180-10 has extending portions 181 formed in the extending portions 179 of the opening 178-10 in accordance with some embodiments.

In some embodiments, the extending portions 181 are sandwiched between the portion 156a-10 of the gate structure 156-10 and the dielectric feature 124a-10 and between the portion 156b-10 of the gate structure 156-10 and the dielectric feature 124a-10. In some embodiments, the extending portion 181 has a thickness smaller than about 2 nm. The extending portion should not be too thick, or the control of the gate structure 156-10 may be undermined. In some embodiments, the extending portions 181 have curved bottom surfaces.

In some embodiments, the bottommost portion of the extending portion 181 of the dielectric layer 180-10 is lower than the bottommost surface of the metal layer 168-10. Although some portions of the gate structure 156-10 are not covered by the metal layer 168-10, the nanostructures 108' are all vertically covered by (e.g. vertically overlapped) the metal layer 168-10 in accordance with some embodiments. The processes and materials for forming the gate structure 156-10, the metal layer 168-10, and the dielectric layer 180-10 may be the same as those for forming the gate structure 156, the metal layer 168, the dielectric feature 124a, and the dielectric layer 180 and therefore are not repeated herein.

Figure 14A:
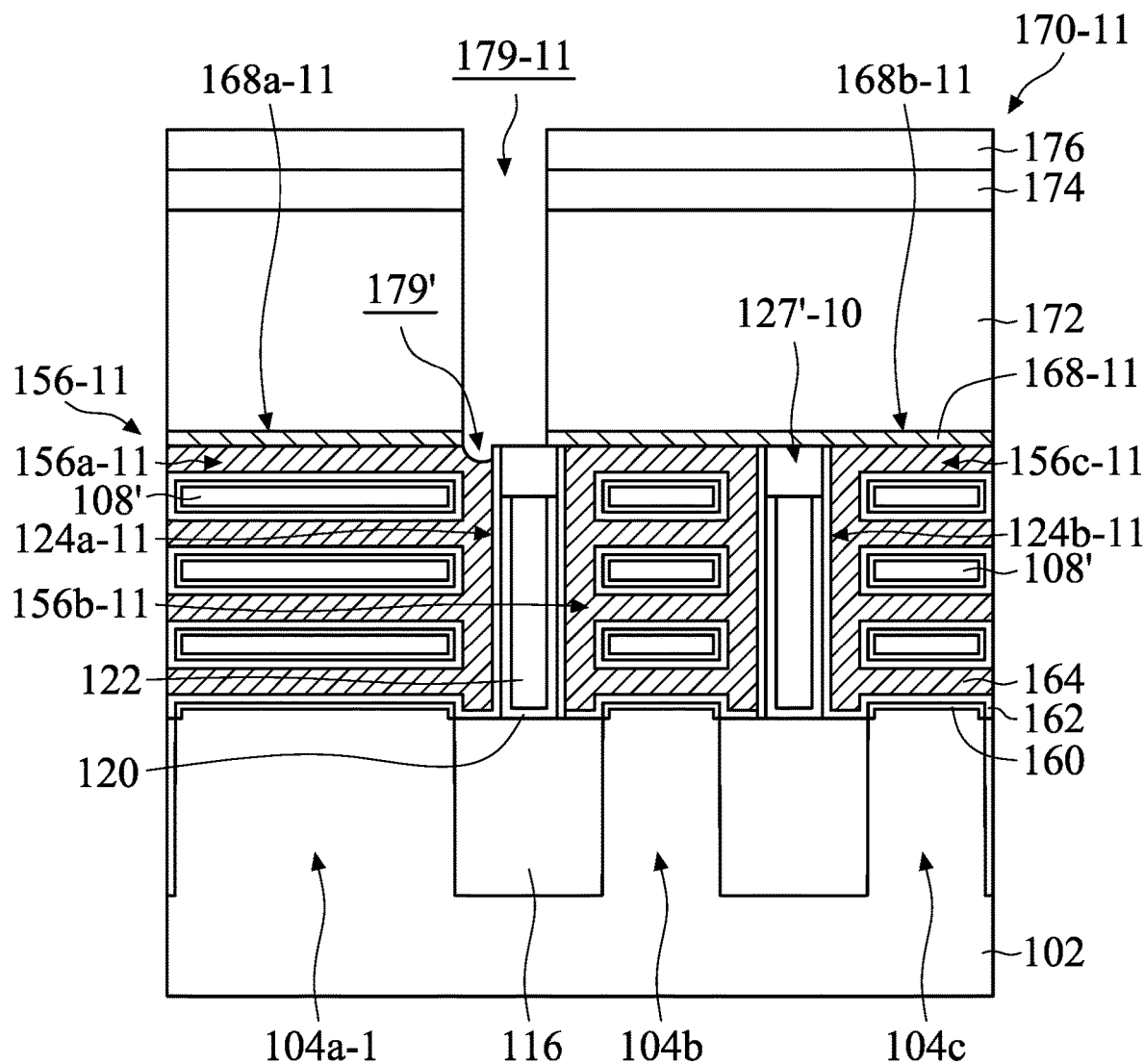
FIGS. 14A and 14B illustrate cross-sectional views of intermediate stages of manufacturing the semiconductor structure in accordance with some embodiments.
Figure 14B:
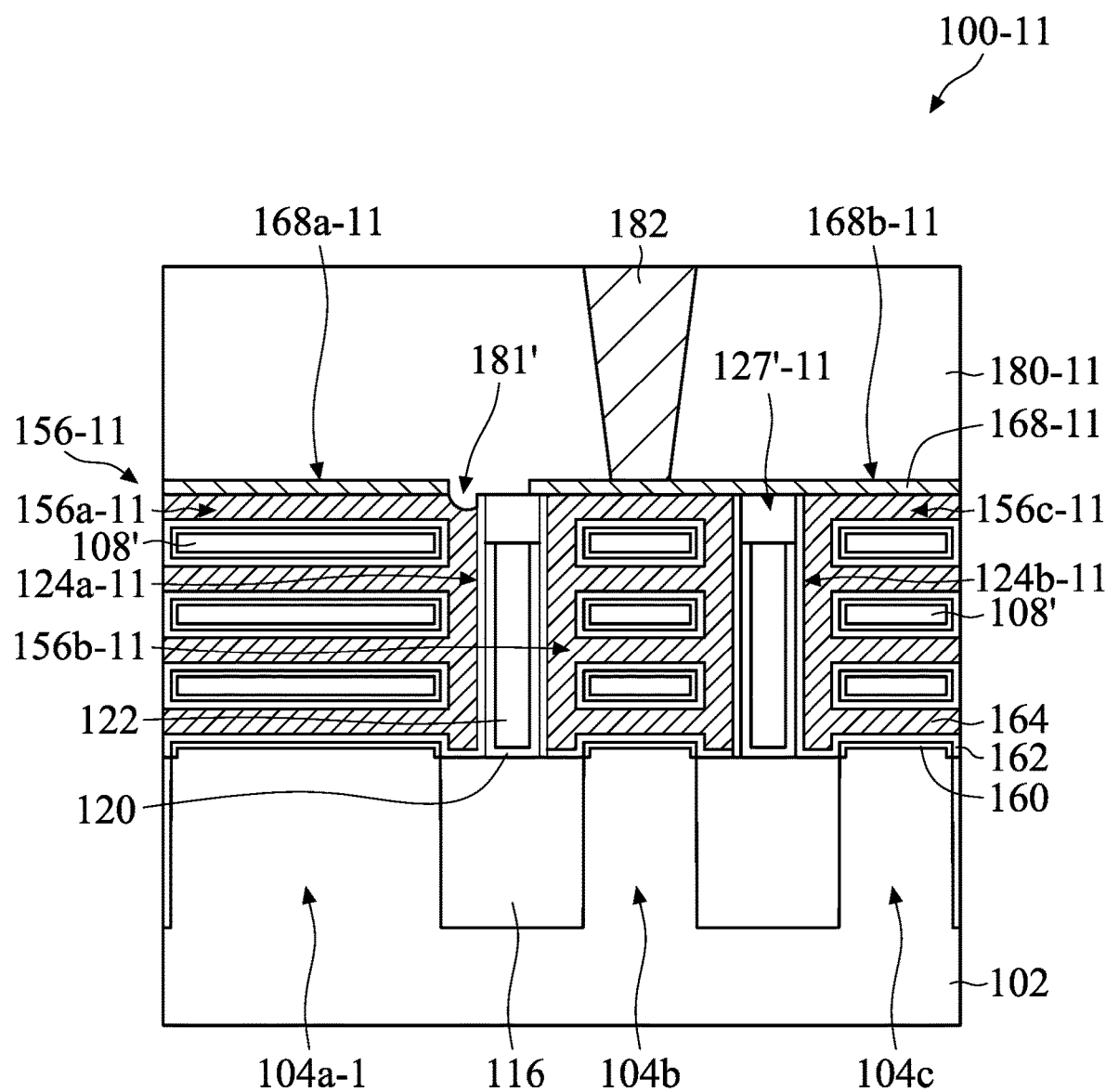

FIGS. 14A and 14B illustrate cross-sectional views of intermediate stages of manufacturing a semiconductor structure 100-11 in accordance with some embodiments. The semiconductor structure 100-11 may be similar to the semiconductor structures 100 and 100-1 shown in FIGS. 3 and 4B, except the opening in the metal layer is not aligned with the dielectric features and a dielectric layer extends into the gate structure in accordance with some embodiments. Materials and processes for manufacturing the semiconductor structure 100-11 may be similar to, or the same as, those for manufacturing the semiconductor structures 100 and 100-1 described above and are not repeated herein.

More specifically, the processes shown in FIGS. 2A to 2S are performed, and a metal layer 168-11 is patterned through the opening 178-11 of the photoresist structure 170-11, as shown in FIG. 14A in accordance with some embodiments. In some embodiments, the opening 178-11 of the photoresist structure 170-11 is not aligned with the dielectric feature 124a-11, and therefore the opening 169-11 of the metal layer 168-11 is not aligned with the dielectric feature 124a-11. In some embodiments, a portion 156a-11 of the gate structure 156-11 and a dielectric feature 124a-11 are both partially exposed by the opening 169-11 of the metal layer 168-11. Meanwhile, the dielectric feature 124a-11 is partially covered by a portion 168b-11 of the metal layer 168-11 in accordance with some embodiments.

In addition, the portion 156a-11 of the gate structure 156-11 is also partially etched when the metal layer 168-11 is patterned, so that the opening 178-11 has extending portions 179' extending into the portion 156a-11 of the gate structure 156-11 in accordance with some embodiments. In some embodiments, the upper portion of the sidewall of the dielectric features 124a-11 is exposed by the extending portion 179' of the opening 178-11. In some embodiments, the depth of the extending portion 179' is smaller than about 2 nm, so that the nanostructures 108' will not be damaged by the etching process.

Afterwards, the processes shown in FIGS. 2U to 2W are performed to form the semiconductor structure 100-11, as shown in FIG. 14B in accordance with some embodiments. A dielectric layer 180-11 is formed over the metal layer 168-11 and is in direct contact with the portion 156a-11 of the gate structure 156-11. In addition, the dielectric layer 180-11 has an extending portion 181' formed in the extending portion 179' of the opening 178-11 in accordance with some embodiments. In some embodiments, the extending portion 181' has curved bottom surfaces.

In some embodiments, the extending portion 181' is sandwiched between the portion 156a-11 of the gate structure 156-11 and the dielectric feature 124a-11. In some embodiments, the bottommost portion of the extending portion 181' of the dielectric layer 180-11 is lower than the bottommost surface of the metal layer 168-11. In some embodiments, the extending portion 181' has a thickness smaller than about 2 nm. The extending portion 181' should not be too thick, or the control of the gate structure 156-11 may be undermined.

Although some portions of the gate structure 156-11 are not covered by the metal layer 168-11, the nanostructures 108' are all vertically covered by (e.g. vertically overlapped) the metal layer 168-11 in accordance with some embodiments. The processes and materials for forming the gate structure 156-111, the metal layer 168-11, the dielectric feature 124a-11, and the dielectric layer 180-11 may be the same as those for forming the gate structure 156, the metal layer 168 b, the dielectric feature 124a, and the dielectric layer 180 and therefore are not repeated herein.

Figure 15A:
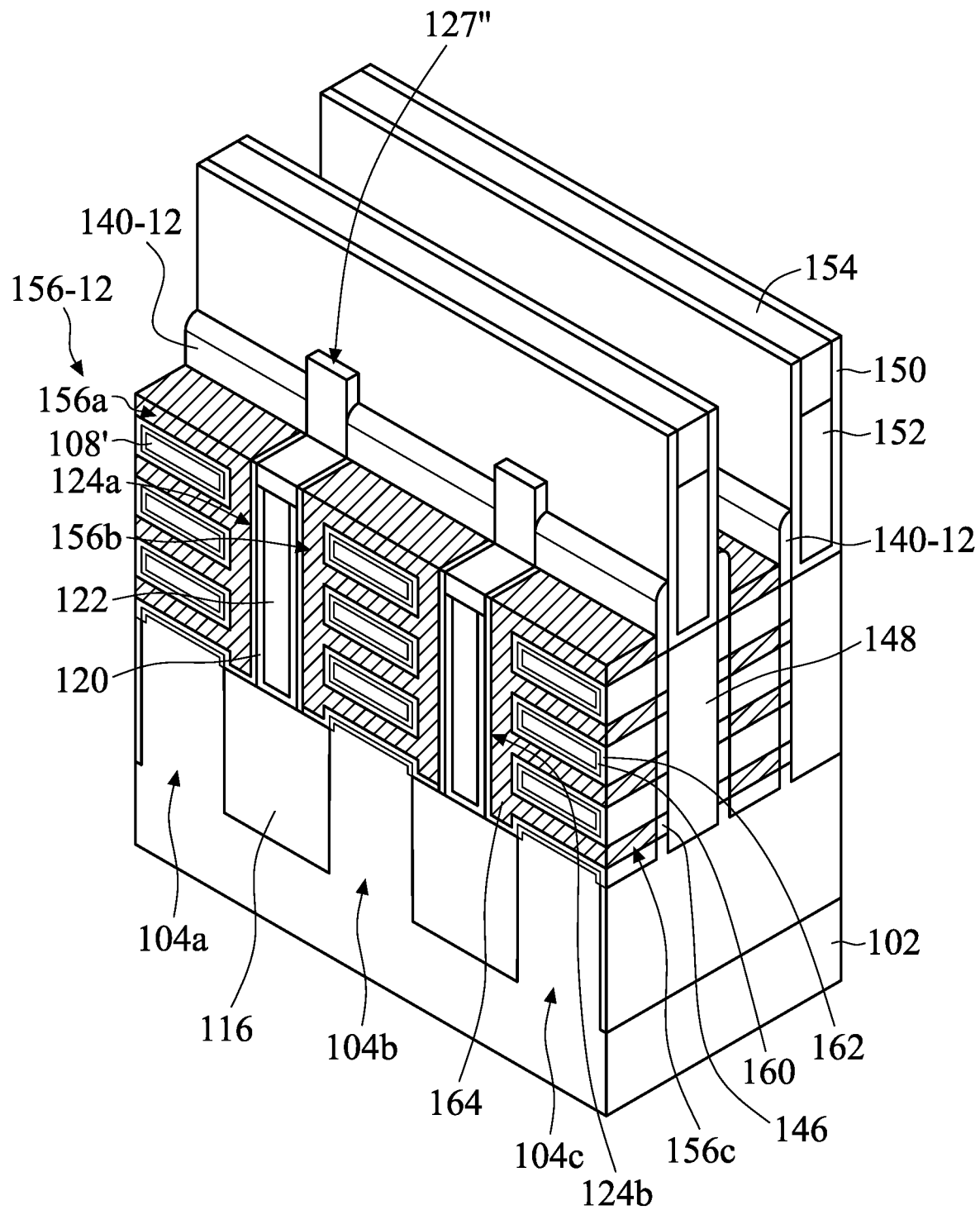
FIGS. 15A and 15B illustrate cross-sectional views of intermediate stages of manufacturing the semiconductor structure in accordance with some embodiments.
Figure 15B:
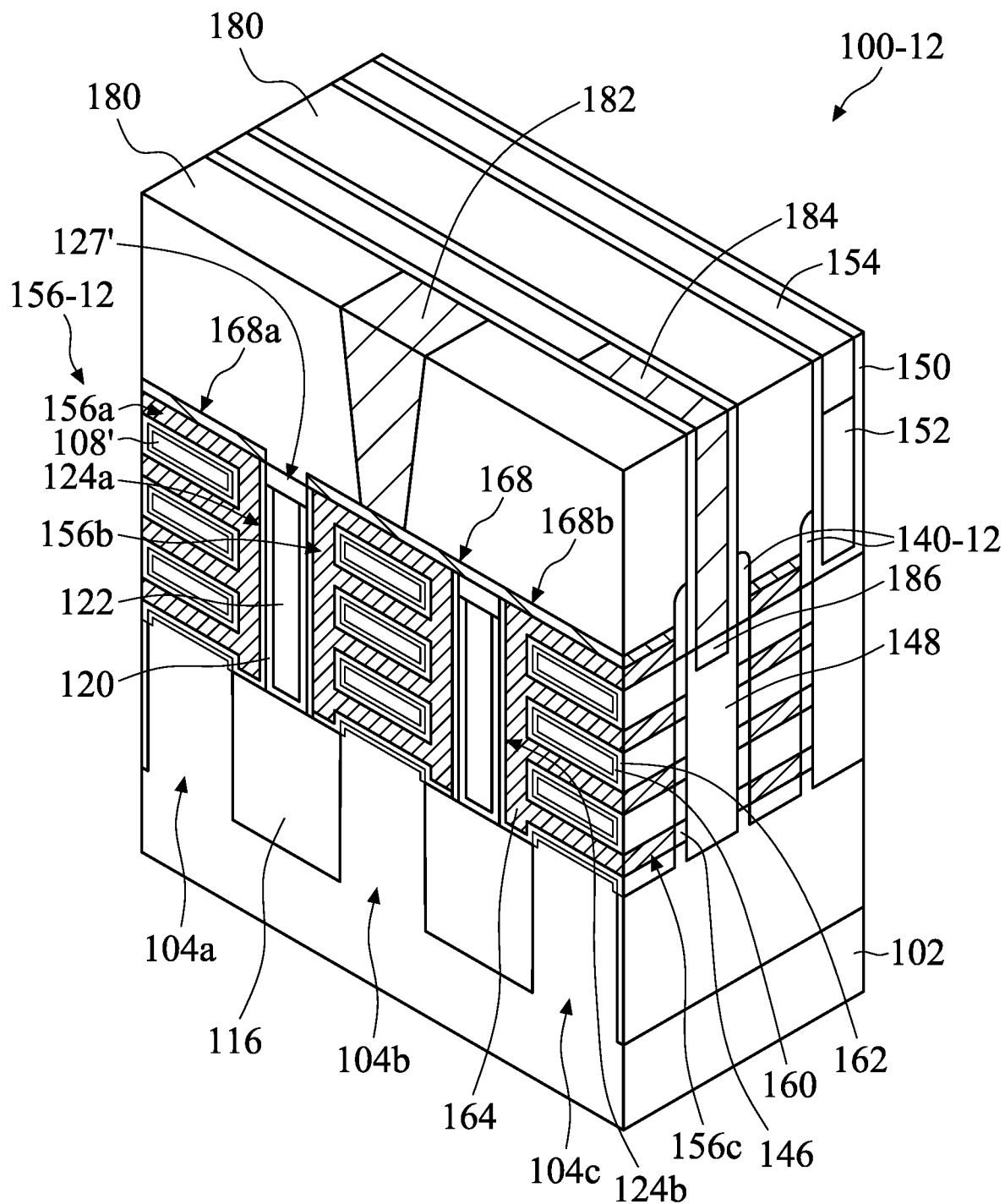

FIGS. 15A and 15B illustrate cross-sectional views of intermediate stages of manufacturing a semiconductor structure 100-12 in accordance with some embodiments. The semiconductor structure 100-12 may be similar to the semiconductor structures 100 and 100-1 shown in FIGS. 3 and 4B, except the gate spacer in the semiconductor structure 100-12 is relatively low in accordance with some embodiments. Materials and processes for manufacturing the semiconductor structure 100-12 may be similar to, or the same as, those for manufacturing the semiconductor structures 100 and 100-1 described above and are not repeated herein.

More specifically, the processes shown in FIGS. 2A to 2N are performed, and the dummy gate structures, the cladding layers, the first semiconductor material layers, and the upper portions of gate spacers 140-12 are removed to form gate trenches exposing the nanostructures 108' in accordance with some embodiments. Afterwards, gate structures 156-12 are formed and etched back to expose the gate spacers 140-12, as shown in FIG. 15A in accordance with some embodiments.

As shown in FIG. 15A, the topmost portions of the gate spacers 140-12 are lower than the top surfaces of the original portion 127" of the dielectric features 124a and 124b in accordance with some embodiments. In addition, the topmost portions of the gate spacers 140-12 is higher than the top surface of the gate structures 156-12 after the etch back process is performed in accordance with some embodiments. As described previously, by removing the upper portion of the gate spacers 140-12, the gate trenches may have a larger top portion, and the gate structures 156-12 may be easier to form in the gate trenches.

Afterwards, the processes shown in FIGS. 2Q to 2W are performed to form the semiconductor structure 100-12, as shown in FIG. 15B in accordance with some embodiments. The processes and materials for forming the gate spacer 140-12 and the gate structure 156-12 may be the same as those for forming the gate spacer 140 and the gate structure 156 and therefore are not repeated herein.

Generally, a gate structure may need to be divided into various portions in a semiconductor device and isolation structures may be formed between these portions to isolate different gate structure. However, as the size of the device continuously being shrunk down, the alignment for forming the isolation structures may become more and more challenging. Accordingly, in some embodiments of the present disclosure, dielectric features are formed between the gate structure to separate different portions of the gate structure.

As described previously, the dielectric features (e.g. the dielectric features 124a, 124b, and 124c) are formed to separate the gate structure (e.g. the gate structure 156) into different portions in accordance with some embodiments. In addition, since the dielectric features are self-aligned to the fin structures (e.g. the fin structures 104a, 104a-1, 104b, and 104c), complicated alignment processes are not required and the device size may be scale downed.

In addition, the metal layer (e.g. the metal layer 168) is patterned to connect some portions of the gate structure while some portions of the gate structure remain electrically isolated from other portions in accordance with some embodiments. Since the portions of the gate structure are first separated by the dielectric features and then those need to be electrically connected to each other are connected through the metal layer, the tolerance to the misalignment of the metal layer patterning are relative large. That is, the opening of the metal layer (e.g. the opening 169 of the metal layer 168) may be slightly misaligned with the dielectric features without affecting the performance of the resulting semiconductor structures. Accordingly, additional spacing between the devices for preventing misalignment may be reduced, and the device sizes may also be reduced without sacrificing the performance of the resulting devices.

It should be appreciated that the elements shown in the semiconductor structures 100, 100-1, 100-2, 100-3, 100-4, 100-5, 100-6, 100-7, 100-8, 100-9, 100-10, 100-11, and 100-12 may be combined and/or exchanged. For example, a semiconductor structure may include at least two kinds of the dielectric features shown in the semiconductor structures 100, 100-1, 100-2, 100-3, 100-4, 100-5, 100-6, 100-7, 100-8, 100-9, 100-10, 100-11, and 100-12.

In addition, it should be noted that same elements in FIGS. 1 to 15B may be designated by the same numerals and may include similar or the same materials and may be formed by similar or the same processes; therefore such redundant details are omitted in the interest of brevity. In addition, although FIGS. 1 to 15B are described in relation to the method, it will be appreciated that the structures disclosed in FIGS. 1 to 15B are not limited to the method but may stand alone as structures independent of the method. Similarly, although the methods shown in FIGS. 1 to 15B are not limited to the disclosed structures but may stand alone independent of the structures. Furthermore, the nanostructures described above may include nanowires, nanosheets, or other applicable nanostructures in accordance with some embodiments.

Also, while disclosed methods are illustrated and described below as a series of acts or events, it will be appreciated that the illustrated ordering of such acts or events may be altered in some other embodiments. For example, some acts may occur in different orders and/or concurrently with other acts or events apart from those illustrated and/or described above. In addition, not all illustrated acts may be required to implement one or more aspects or embodiments of the description above. Further, one or more of the acts depicted above may be carried out in one or more separate acts and/or phases.

Furthermore, the terms "approximately," "substantially," "substantial" and "about" describe above account for small variations and may be varied in different technologies and be in the deviation range understood by the skilled in the art. For example, when used in conjunction with an event or circumstance, the terms can refer to instances in which the event or circumstance occurs precisely as well as instances in which the event or circumstance occurs to a close approximation.

Embodiments for forming semiconductor structures may be provided. The semiconductor structure may include a gate structure wrapped around nanostructures. In addition, dielectric features may be formed to separate the gate structures in various portions. A metal layer may be formed over some portions of the gate structure while some other portion of the gate structure remain electrically disconnect. By forming the gate structure first separated by the dielectric features and then re-connecting some of them by the metal layer, the spacing between the device can be reduced and the performance may be improved.

In some embodiments, a semiconductor structure is provided. The semiconductor structure includes a substrate and nanostructures formed over the substrate. The semiconductor structure also includes a gate structure wrapping around the nanostructures and a first dielectric feature separating the gate structure into a first portion and a second portion. The semiconductor structure also includes a metal layer formed over the gate structure. In addition, top surfaces of the first portion and the second portion of the gate structure and a top surface of the first dielectric feature are covered by the metal layer.

In some embodiments, a semiconductor structure is provided. The semiconductor structure includes a substrate and a first fin base structure protruding from the substrate. The semiconductor structure also includes first nanostructures formed over the first fin base structure and a gate structure comprising a first portion, a second portion, and a third portion over the substrate. In addition, the first portion of the gate structure wraps around the first nanostructures. The semiconductor structure also includes a first dielectric feature sandwiched between the first portion and the second portion of the gate structure and a second dielectric feature sandwiched between the first portion and the third portion of the gate structure. The semiconductor structure also includes a metal layer formed over the gate structure and a dielectric layer formed over the metal layer and separating the metal layer into a first portion and a second portion. In addition, the first portion of the metal layer continuously extends from the first portion of the gate structure to the second portion of the gate structure.

In some embodiments, a method for manufacturing a semiconductor structure is provided. The method for manufacturing the semiconductor structure includes alternately stacking first semiconductor material layers and second semiconductor material layers to form a semiconductor stack over a substrate and patterning the semiconductor stack to form a fin structure. The method for manufacturing the semiconductor structure also includes forming a first dielectric feature at a first side of the fin structure and removing the first semiconductor material layers of the fin structure to form nanostructures. The method for manufacturing the semiconductor structure also includes forming a gate structure wrapping around the nanostructures and covering the first dielectric feature and removing a portion of the gate structure to expose the first dielectric feature. The method for manufacturing the semiconductor structure also includes forming a metal layer covering the gate structure and the first dielectric feature and forming an opening in the metal layer to expose a top surface of the first dielectric feature. The method for manufacturing the semiconductor structure further includes forming a dielectric layer over the metal layer and in the opening of the metal layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
    alternately stacking first semiconductor material layers and second semiconductor material layers to form a semiconductor stack over a substrate;
    patterning the semiconductor stack to form a fin structure;
    forming a first dielectric feature at a first side of the fin structure, wherein the first dielectric feature comprises a bottom portion and an upper portion;
    removing the first semiconductor material layers of the fin structure to form nanostructures;
    forming a gate structure wrapping around the nanostructures and covering the first dielectric feature;
    removing a portion of the gate structure to expose the first dielectric feature;
    forming a metal layer covering the gate structure and the first dielectric feature;
    forming an opening in the metal layer to expose a top surface of the first dielectric feature; and
    forming a dielectric layer over the metal layer and in the opening of the metal layer,
    wherein the upper portion of the first dielectric feature is partially removed before forming the metal layer.

2. The method for manufacturing the semiconductor structure as claimed in claim 1, wherein the opening of the metal layer is not aligned with the first dielectric feature.

3. The method for manufacturing the semiconductor structure as claimed in claim 1, wherein the opening of the metal layer further exposes a portion of the gate structure.

4. The method for manufacturing the semiconductor structure as claimed in claim 1, further comprising:
removing a portion of the gate structure through the opening of the metal layer.

5. The method for manufacturing the semiconductor structure as claimed in claim 1, further comprising:
forming a second dielectric feature at a second side of the fin structure,
wherein the second dielectric feature passes through the gate structure and is separated from the dielectric layer by the metal layer.

6. A method for manufacturing a semiconductor structure, comprising:
forming first nanostructures and second nanostructures over a substrate, wherein the first nanostructures are separated from the second nanostructures along a first direction;
forming a first dielectric feature longitudinally oriented along a second direction and separated from the first nanostructures and the second nanostructures along the first direction;
forming a gate structure wrapping around the first nanostructures and the second nanostructures;
forming a metal layer covering the gate structure and the first dielectric feature; and
forming a dielectric layer over the metal layer, wherein the dielectric layer has an extending portion extending through the metal layer and in contact with a top surface of the first dielectric feature, and a width of the extending portion of the dielectric layer in the first direction is greater than a width of the first dielectric feature in the first direction.

7. The method for manufacturing the semiconductor structure as claimed in claim 6, wherein the top surface of the first dielectric feature is no lower than a top surface of the gate structure.

8. The method for manufacturing the semiconductor structure as claimed in claim 6, wherein the gate structure comprises:
a first portion wrapping around the first nanostructures; and
a second portion wrapping around the second nanostructures,
wherein the first portion of the gate structure is electrically separated from the second portion of the gate structure by the first dielectric feature.

9. The method for manufacturing the semiconductor structure as claimed in claim 6, wherein a bottommost surface of the extending portion of the dielectric layer is lower than the top surface of the first dielectric feature.

10. The method for manufacturing the semiconductor structure as claimed in claim 6, further comprising:
forming third nanostructures over the substrate, wherein the third nanostructures and the first nanostructures are at opposite sides of the second nanostructures; and
forming a second dielectric feature longitudinally oriented along the second direction, wherein the first dielectric feature and the second dielectric feature are at opposite sides of the second nanostructures,
wherein the metal layer covers a top surface of the second dielectric feature.

11. The method for manufacturing the semiconductor structure as claimed in claim 6, wherein each of the first nanostructures has a first width, each of the second nanostructures has a second width, and the first width is greater than the second width.

12. A method for manufacturing a semiconductor structure, comprising:
alternately stacking first semiconductor material layers and second semiconductor material layers to form a semiconductor stack over a substrate;
patterning the semiconductor stack to form a first fin structure and a second fin structure, wherein the first fin structure and the second fin structure are both longitudinally oriented along a first direction and are separated from each other in a second direction;
forming an isolation structure around the first fin structure and the second fin structure;
forming a dielectric feature longitudinally oriented along the first direction over the isolation structure, wherein the dielectric feature comprises a bottom portion and an upper portion, and the bottom portion and the upper portion are made of different material;
removing the first semiconductor material layers of the first fin structure and the second fin structure to form first nanostructures and second nanostructures respectively;
forming a gate structure having a first portion wrapping around the first nanostructures and a second portion wrapping around the second nanostructures, wherein a top surface of the gate structure is higher than a bottom surface of the upper portion of the dielectric feature; and
forming a metal layer continuously extending from a top surface of the first portion of the gate structure to a top surface of the second portion of the gate structure.

13. The method for manufacturing the semiconductor structure as claimed in claim 12, further comprising
forming an opening in the metal layer to expose a top surface of the dielectric feature; and
forming a dielectric layer over the metal layer and in the opening of the metal layer.

14. The method for manufacturing the semiconductor structure as claimed in claim 13, further comprising:
partially removing the gate structure to form a recess in the first portion of the gate structure,
wherein the dielectric layer is formed in the recess.

15. The method for manufacturing the semiconductor structure as claimed in claim 12, further comprising:
forming a conductive structure on the metal layer and vertically overlapping the first nanostructures,
wherein the conductive structure is electrically connected to the second portion of the gate structure through the metal layer.

16. The method for manufacturing the semiconductor structure as claimed in claim 12, further comprising:
forming a first source/drain structure over the first fin structure; and
forming a second source/drain structure over the second fin structure,
wherein the dielectric feature is sandwiched between the first source/drain structure and the second source/drain structure in the second direction.

17. The method for manufacturing the semiconductor structure as claimed in claim 16, wherein a first sidewall of the dielectric feature is in direct contact with the first source/drain structure, and a second sidewall of the dielectric feature is in direct contact with the second source/drain structure.

18. The method for manufacturing the semiconductor structure as claimed in claim 12, further comprising:
forming a cladding layer covering sidewalls and a top surface of the first fin structure,
wherein the dielectric feature is in contact with the cladding layer.

19. The method for manufacturing the semiconductor structure as claimed in claim 12, wherein a bottom surface of the dielectric feature is level with a top surface of the isolation structure.

20. The method for manufacturing the semiconductor structure as claimed in claim 12, further comprising:
forming a dielectric material having a lateral portion extending in the second direction over a top surface of the metal layer and an extending portion extending in a third direction, wherein a thickness of the extending portion is thicker than or substantially equal to a thickness of the metal layer in the third direction.

* * * * *